US006833562B2

(12) United States Patent
Tanimoto et al.

(10) Patent No.: US 6,833,562 B2
(45) Date of Patent: Dec. 21, 2004

(54) SILICON CARBIDE SEMICONDUCTOR DEVICE AND ITS MANUFACTURING METHOD

(75) Inventors: Satoshi Tanimoto, Yokohama (JP); Hideyo Okushi, Ibaraki (JP)

(73) Assignees: Nissan Motor Co., Ltd., Kanagawa (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 10/307,363

(22) Filed: Dec. 2, 2002

(65) Prior Publication Data

US 2003/0107041 A1 Jun. 12, 2003

(30) Foreign Application Priority Data

Dec. 11, 2001 (JP) .......................................... 2001-377397
Apr. 24, 2002 (JP) .......................................... 2002-122215

(51) Int. Cl.[7] .......................................... H01L 31/0312
(52) U.S. Cl. ........................... 257/77; 257/76; 257/192; 257/288; 438/105; 438/285
(58) Field of Search ........................... 257/77, 76, 192, 257/288; 438/105, 285

(56) References Cited

U.S. PATENT DOCUMENTS

| | | | |
|---|---|---|---|
| 5,877,515 A | * 3/1999 | Ajit | ............................. 257/76 |
| 6,054,352 A | * 4/2000 | Ueno | .......................... 438/268 |
| 6,262,439 B1 | * 7/2001 | Takeuchi et al. | ............... 257/77 |
| 6,455,892 B1 | * 9/2002 | Okuno et al. | ................ 257/328 |
| 6,482,704 B1 | 11/2002 | Amano et al. | |
| 6,573,534 B1 | * 6/2003 | Kumar et al. | .................. 257/77 |

FOREIGN PATENT DOCUMENTS

| | | |
|---|---|---|
| JP | 10-308510 | 11/1998 |
| JP | 2001-210637 | 8/2001 |
| JP | 2000-200907 | 7/2002 |

OTHER PUBLICATIONS

"Titanium and Aluminum–Titanium Ohmic Contact to p–Type SiC", J. Crofton et al., Solid State Electronics, vol. 41, No. 11, pp. 1725–1729, 1997.
"The Physics of Ohmic Contacts to SiC", J. Crofton et al., phys. stat. sol. (b) 202, 581 (1997).
"Extended Abstracts of 18th Symposium on Future Electron Devices", A paper of FED–169, T. Takami et al., Oct. 20–12, Toshi Center Hotel, Tokyo, Japan.
Crofton, J. et al. "High–temperature ohmic contact to n–type 6H–SiC using nickel." *J. Appl. Phys.*77(3), pp. 1317–1319, Feb. 1, 1995.

* cited by examiner

*Primary Examiner*—Nathan J. Flynn
*Assistant Examiner*—Remmon R. Fordé
(74) *Attorney, Agent, or Firm*—McDermott Will & Emery LLP

(57) ABSTRACT

In silicon carbide semiconductor device and manufacturing method therefor, a metal electrode which is another than a gate electrode and which is contacted with a singlecrystalline silicon carbide substrate is treated with a predetermined heat process at a temperature which is lower than a thermal oxidization temperature by which a gate insulating film is formed and is sufficient to carry out a contact annealing between the singlecrystalline silicon carbide substrate and a metal after a whole surrounding of the gate insulating film is enclosed with the singlecrystalline silicon carbide substrate, a field insulating film, and the gate electrode. The present invention is applicable to a MOS capacitor, an n channel planar power MOSFET, and an n channel planar power IGBT.

11 Claims, 47 Drawing Sheets

2 (EPITAXIAL LAYER)
1 (SiC SUBSTRATE)

3 (FIELD INSULATING FILM)
5 (UPPER INSULATING FILM)
4 (LOWER INSULATING FILM)
101 (FIRST TRANSITORY THERMAL OXIDE FILM)

6 (WINDOW)

7 (GATE INSULATING FILM)
102 (SECOND TRANSITORY THERMAL OXIDE FILM)

9 (INTERLAYER INSULATING FILM)
8 (GATE ELECTRODE)
102

10 (REAR SURFACE ELECTRODE)

11 (GATE ELECTRODE CONTACT HOLE)
9 (INTERLAYER INSULATING FILM)

12 (METAL INTERCONNECTION)

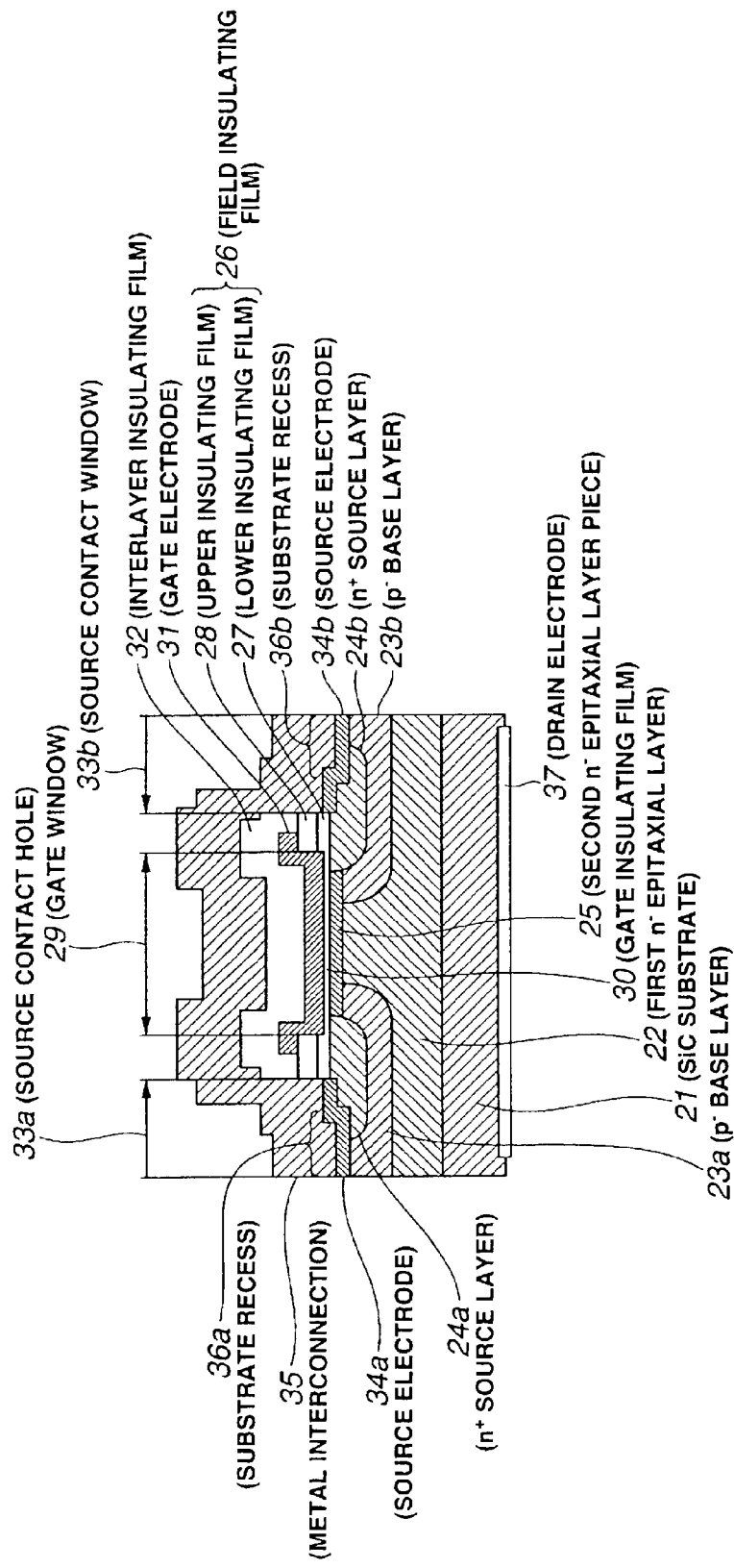

208 (REAR SURFACE ELECTRODE)

207 (INTERLAYER INSULATING FILM)
209 (GATE ELECTRODE CONTACT HOLE)

210 (METAL INTERCONNECTION)

208 (REAR SURFACE ELECTRODE)

207 (INTERLAYER INSULATING FILM)

209 (GATE ELECTRODE CONTACT HOLE)

210 (METAL INTERCONNECTION)

FIG.30A1
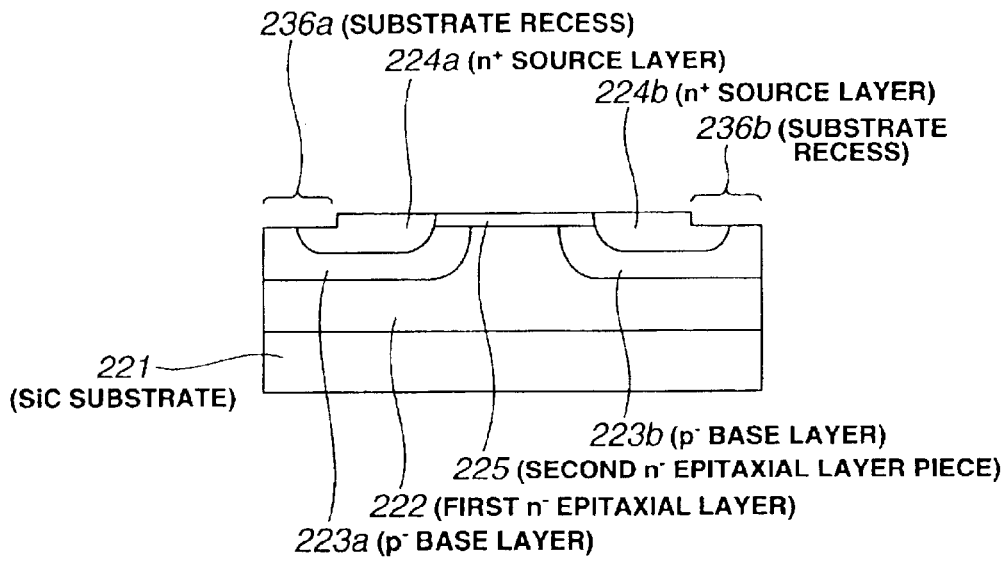
FIG.30A2
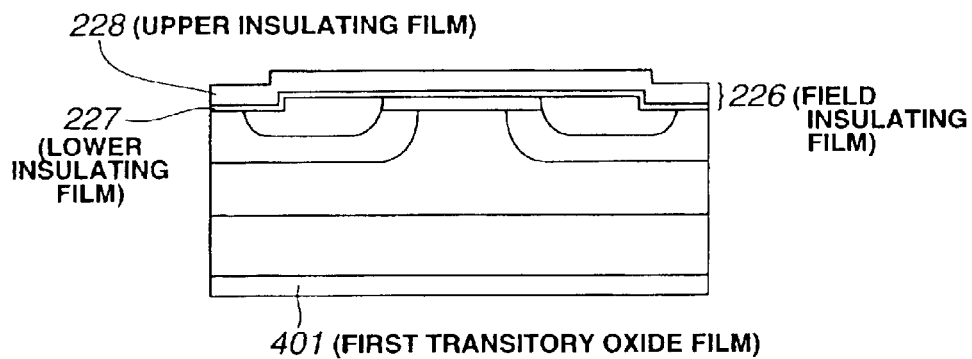
FIG.30A3
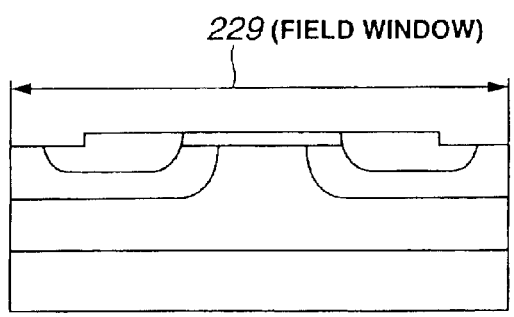

FIG.31A4
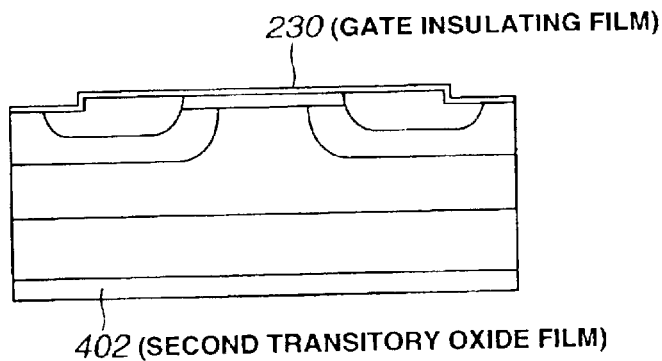
230 (GATE INSULATING FILM)
402 (SECOND TRANSITORY OXIDE FILM)
FIG.31A5
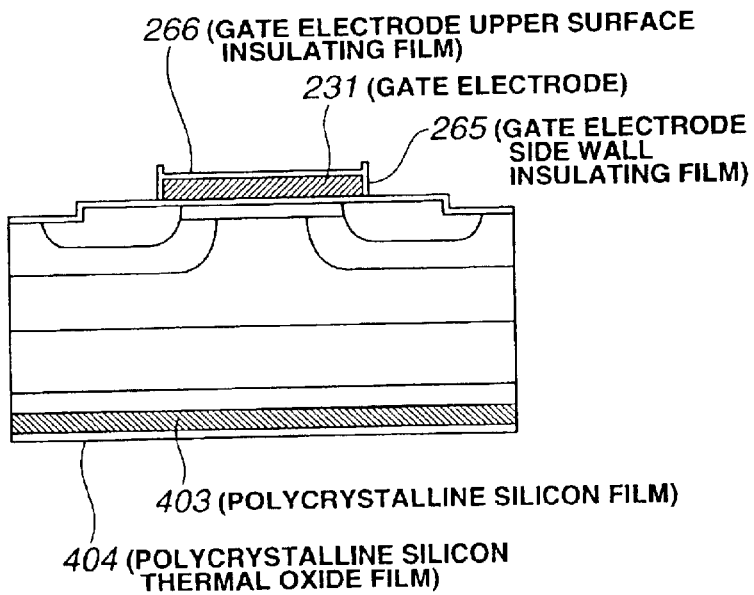
266 (GATE ELECTRODE UPPER SURFACE INSULATING FILM)
231 (GATE ELECTRODE)
265 (GATE ELECTRODE SIDE WALL INSULATING FILM)
403 (POLYCRYSTALLINE SILICON FILM)
404 (POLYCRYSTALLINE SILICON THERMAL OXIDE FILM)
FIG.31A6
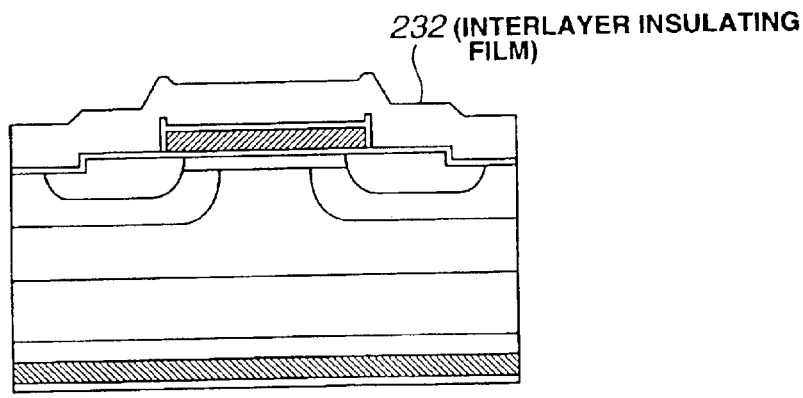
232 (INTERLAYER INSULATING FILM)

FIG.32A7
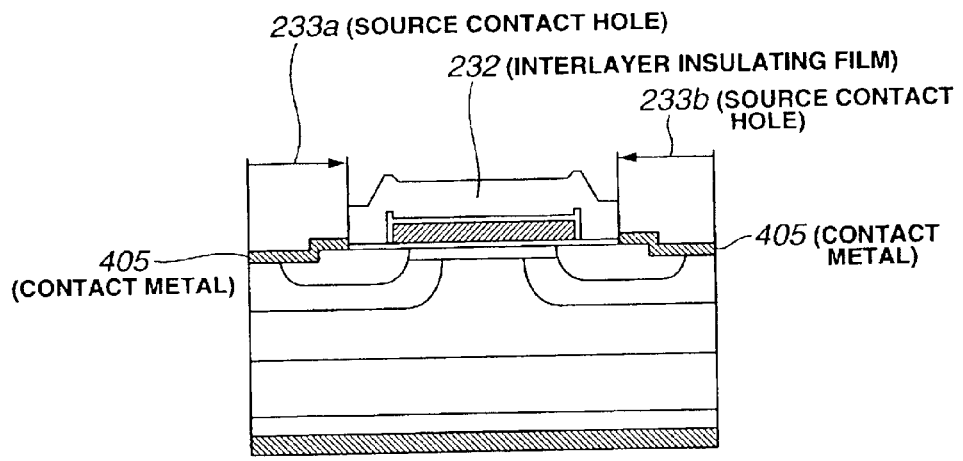
FIG.32A8
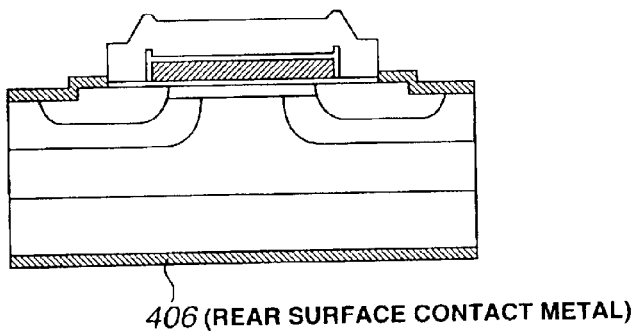

FIG.33A9
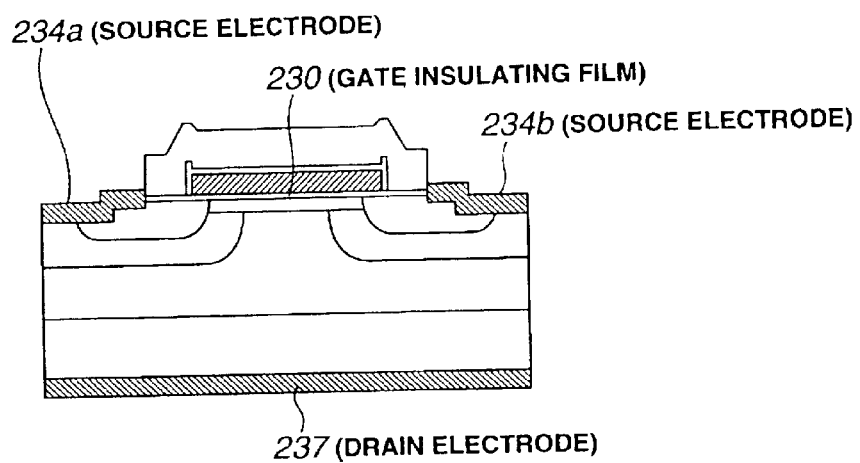
234a (SOURCE ELECTRODE)
230 (GATE INSULATING FILM)
234b (SOURCE ELECTRODE)
237 (DRAIN ELECTRODE)
FIG.33A10
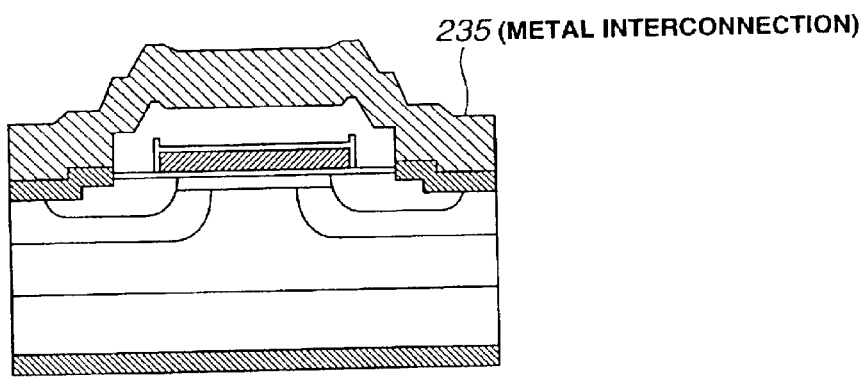
235 (METAL INTERCONNECTION)

FIG.34B1
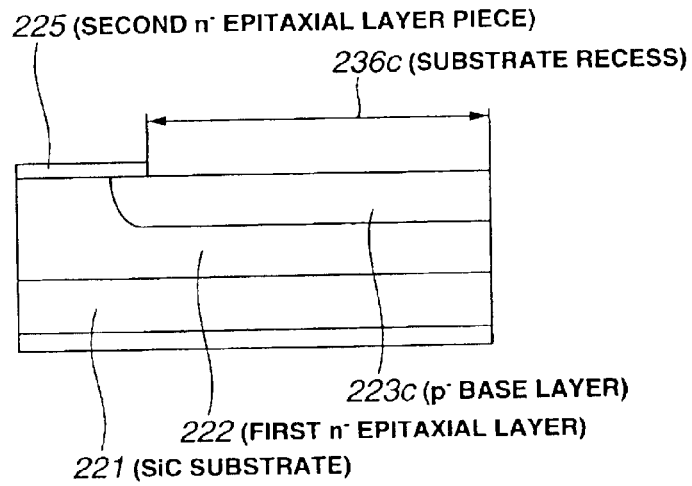
FIG.34B2
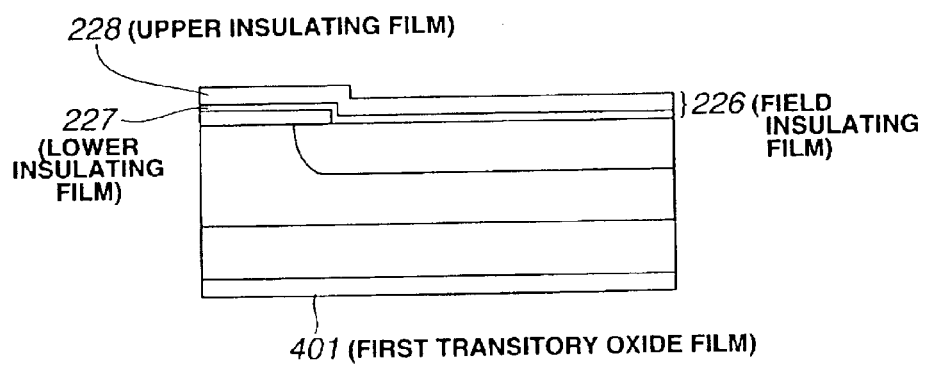
FIG.34B3
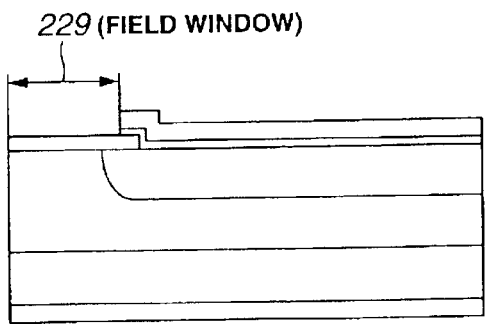

FIG.35B4
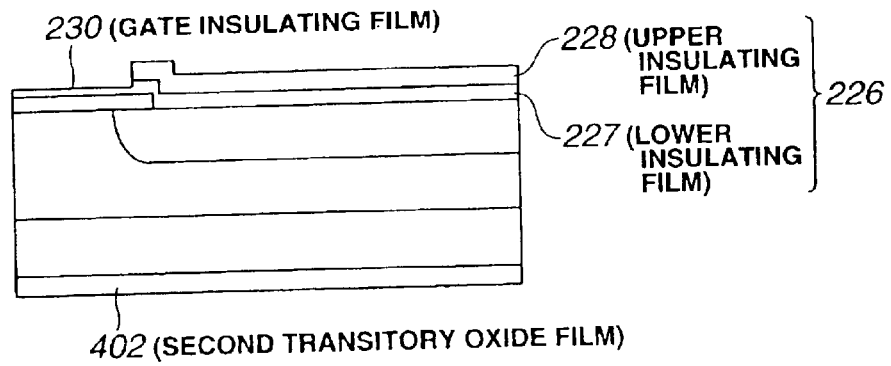
FIG.35B5
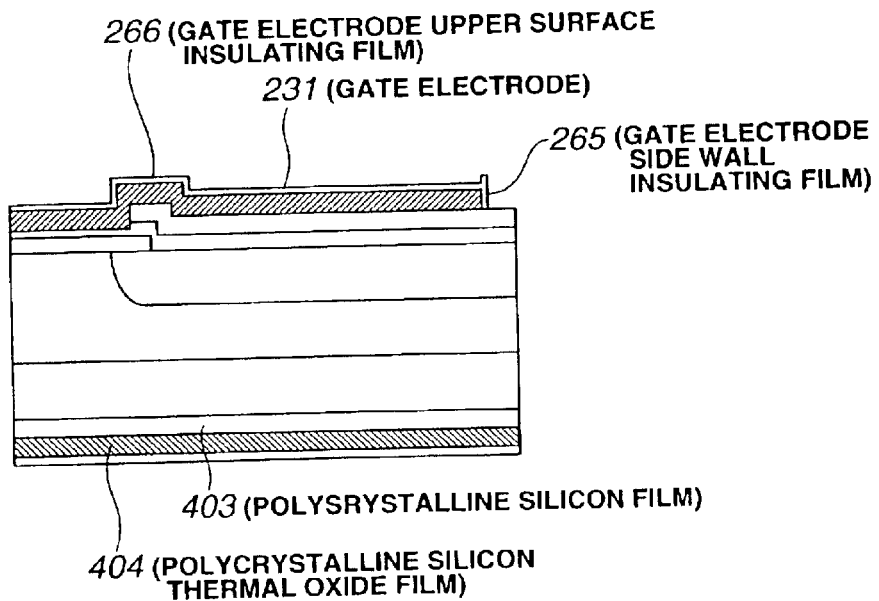
FIG.35B6
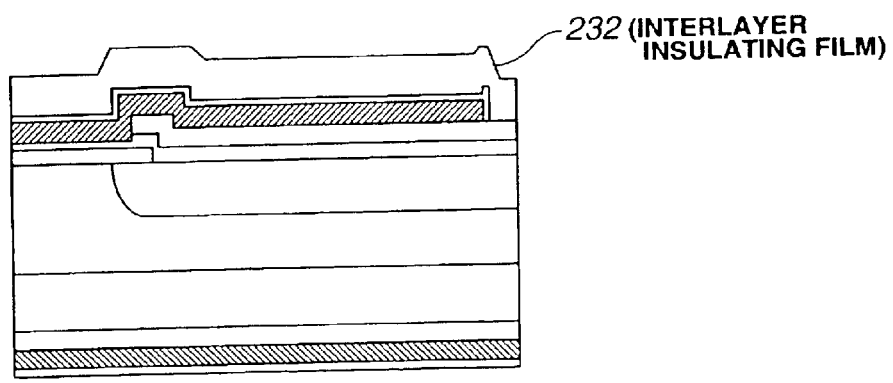

FIG.36B7
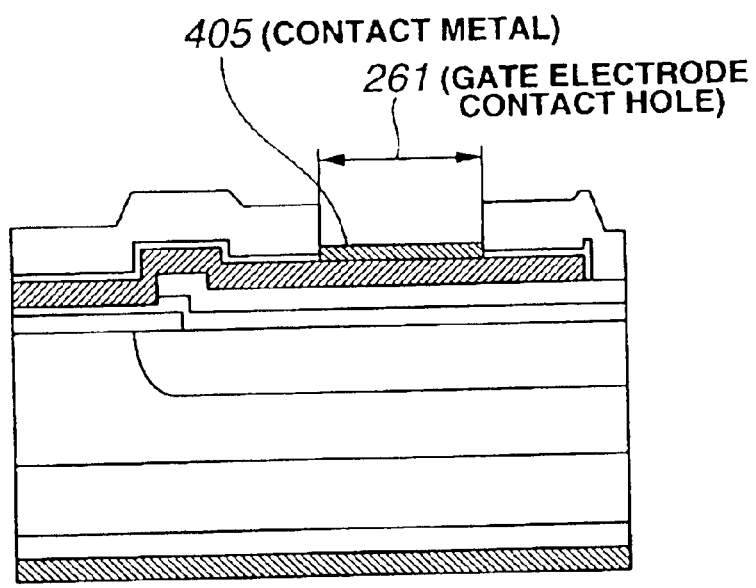
FIG.36B8
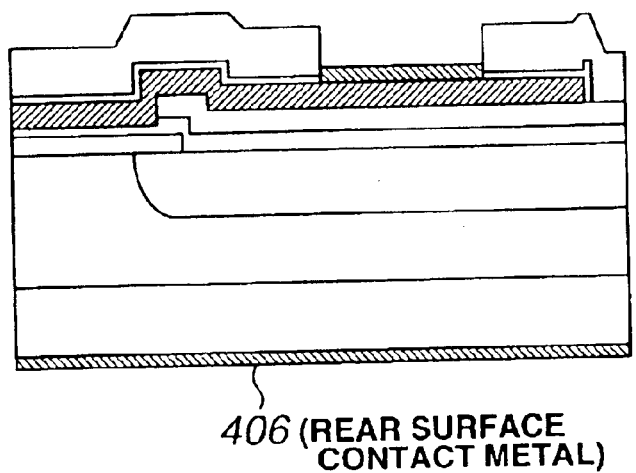

FIG.37B9
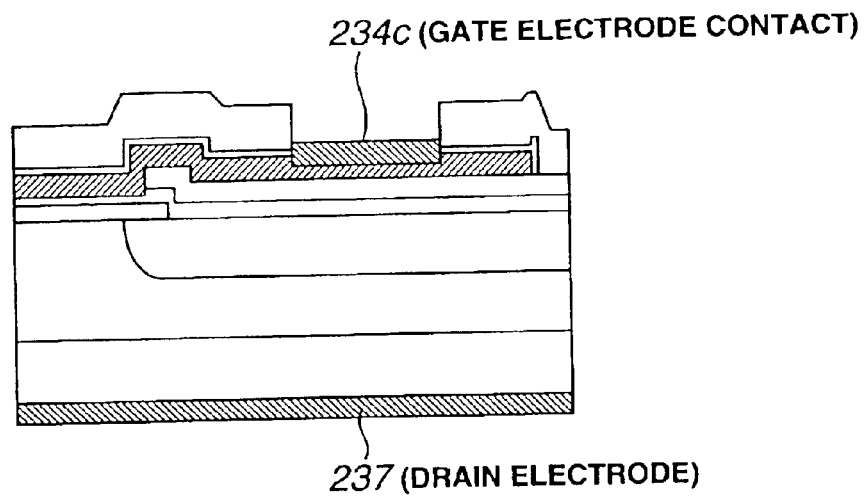
FIG.37B10
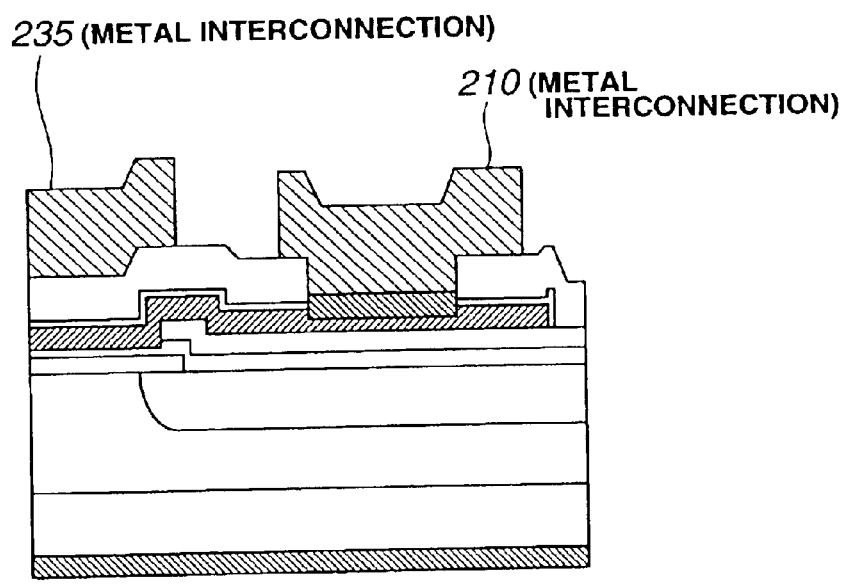

FIG.39A1
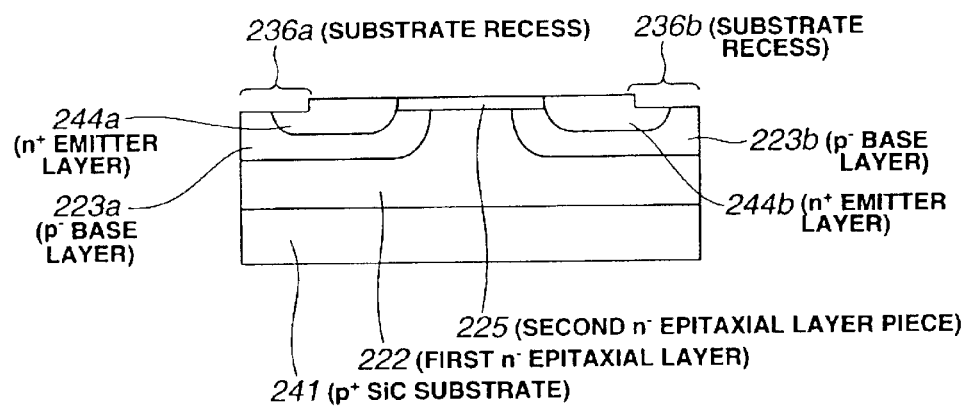
FIG.39A7
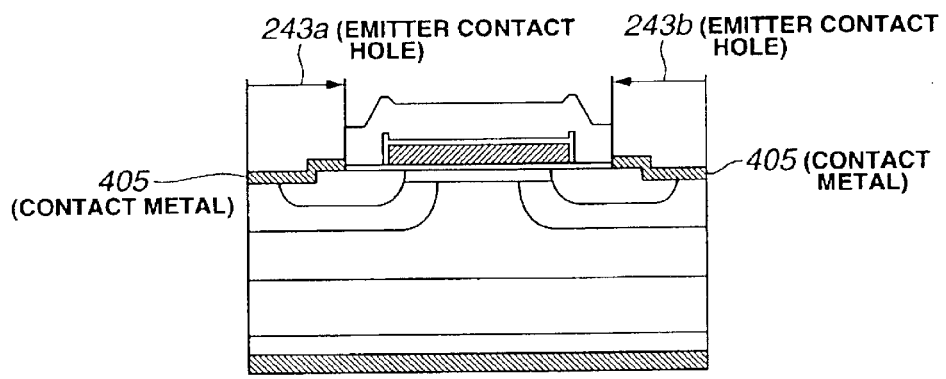
FIG.39A8
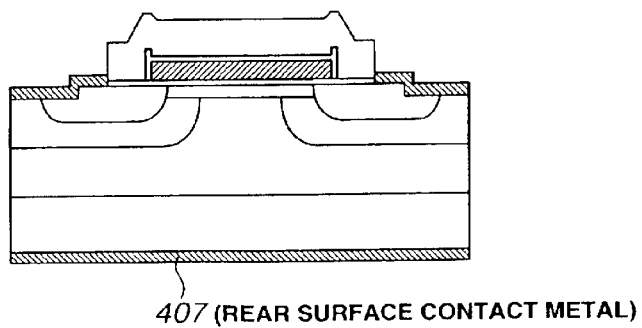

FIG.40A9
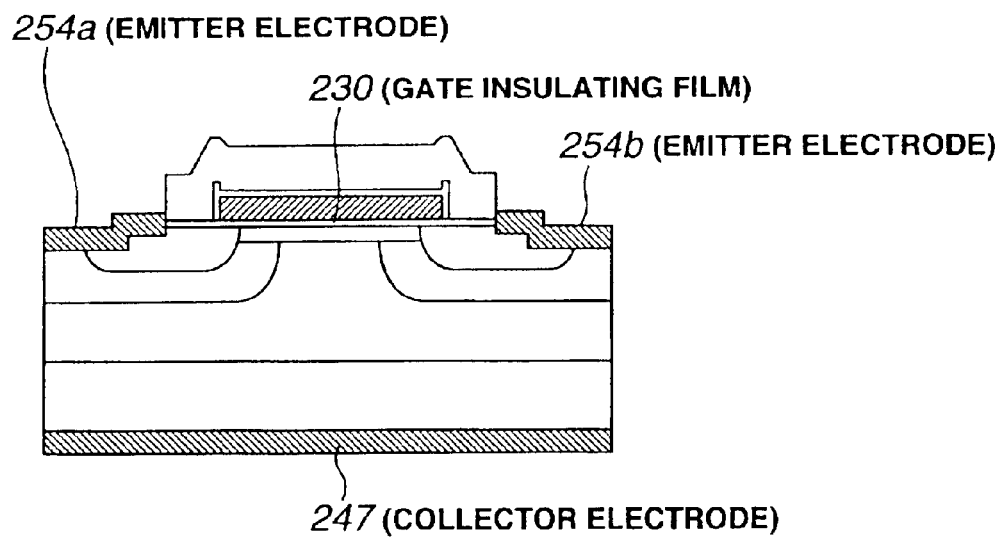
254a (EMITTER ELECTRODE)
230 (GATE INSULATING FILM)
254b (EMITTER ELECTRODE)
247 (COLLECTOR ELECTRODE)
FIG.40A10
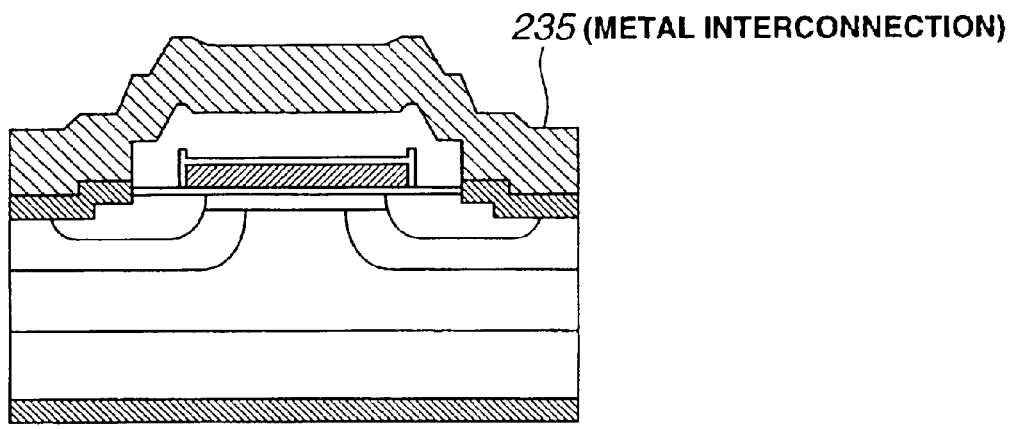
235 (METAL INTERCONNECTION)

FIG.41B1
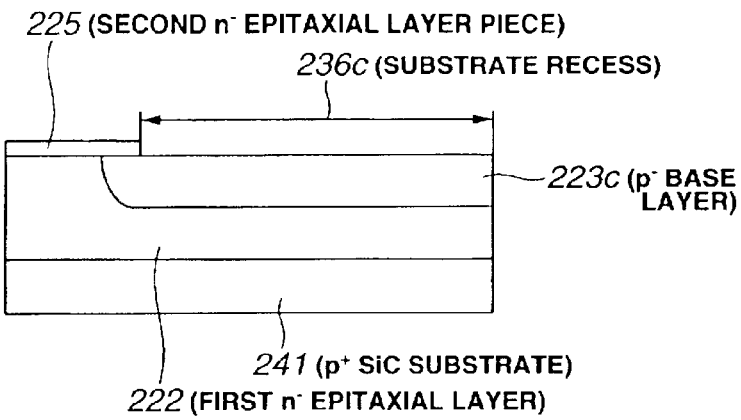
- 225 (SECOND n⁻ EPITAXIAL LAYER PIECE)
- 236c (SUBSTRATE RECESS)
- 223c (p⁻ BASE LAYER)
- 241 (p⁺ SiC SUBSTRATE)
- 222 (FIRST n⁻ EPITAXIAL LAYER)
FIG.41B7
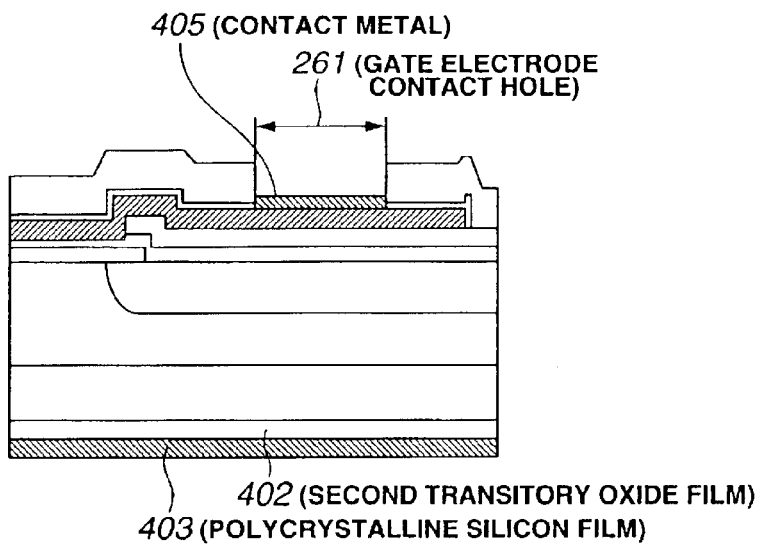
- 405 (CONTACT METAL)
- 261 (GATE ELECTRODE CONTACT HOLE)
- 402 (SECOND TRANSITORY OXIDE FILM)
- 403 (POLYCRYSTALLINE SILICON FILM)
FIG.41B8
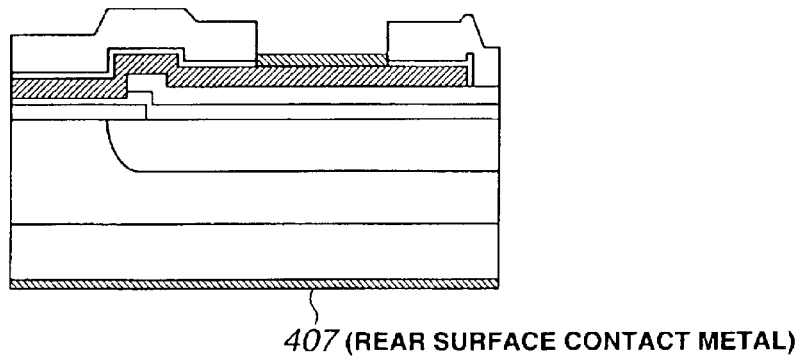
407 (REAR SURFACE CONTACT METAL)

FIG.42B9
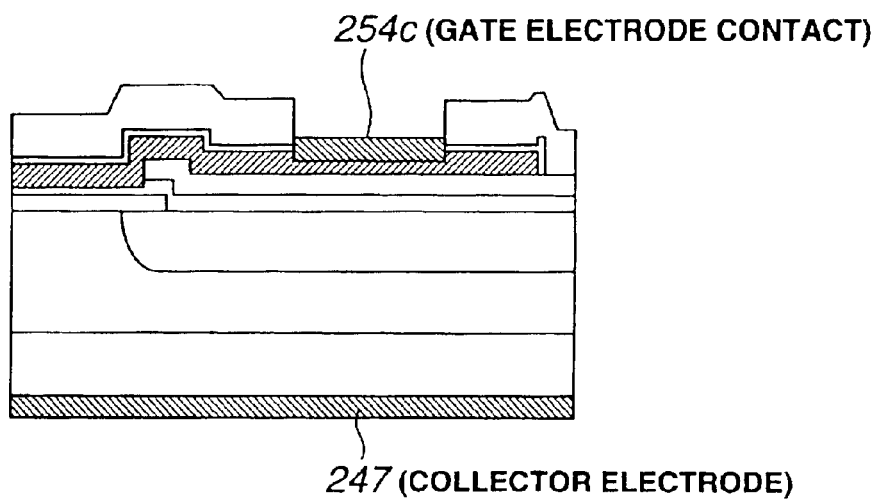
FIG.42B10
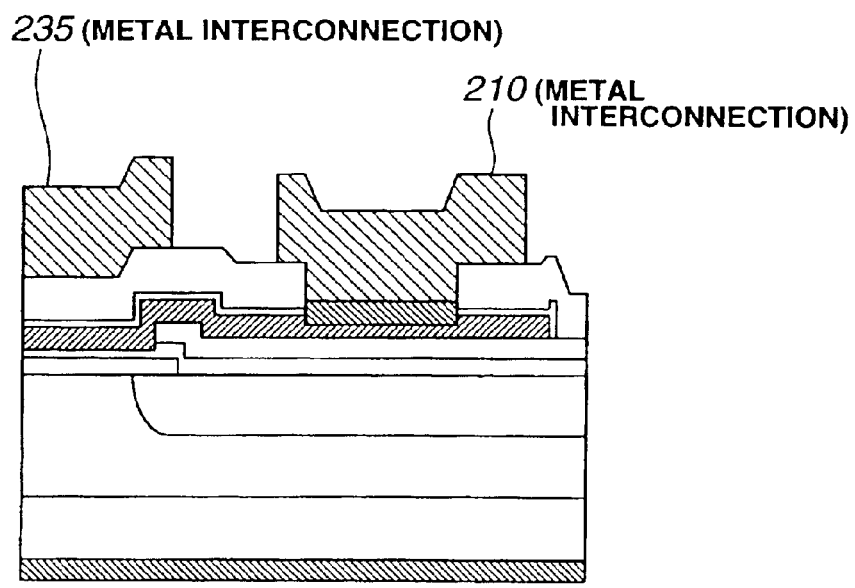

FIG.43D
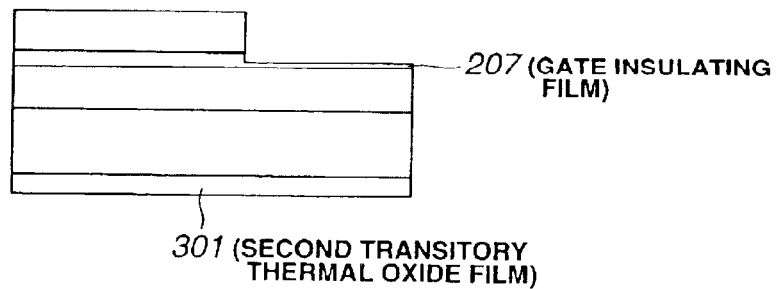
FIG.43E1
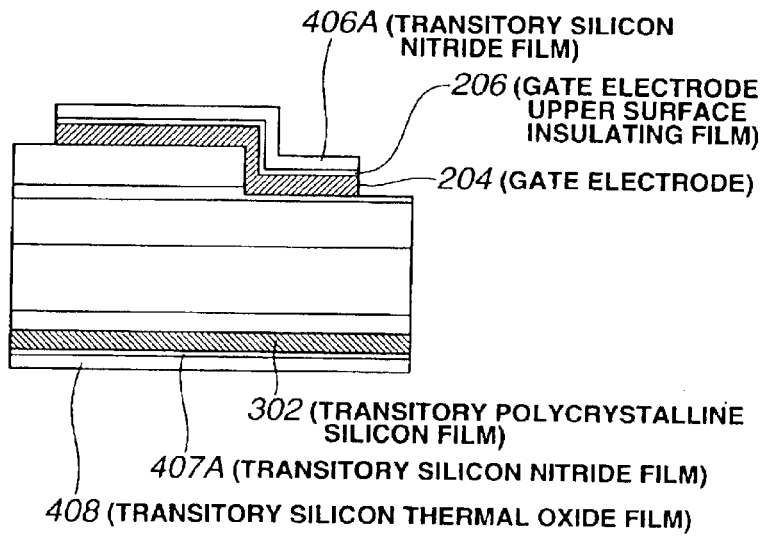
FIG.43E2
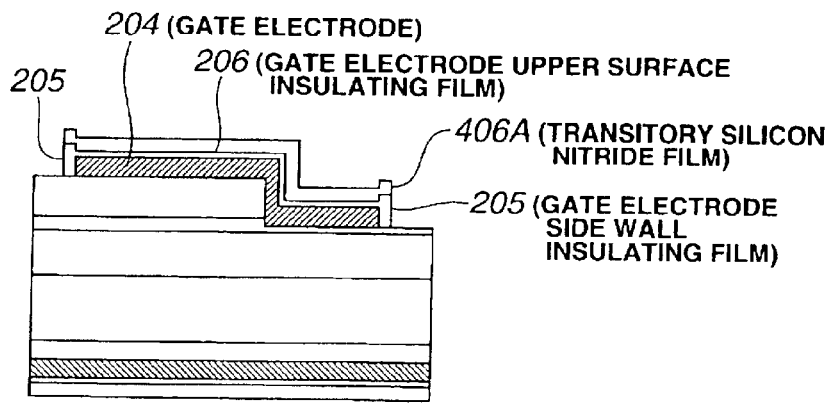

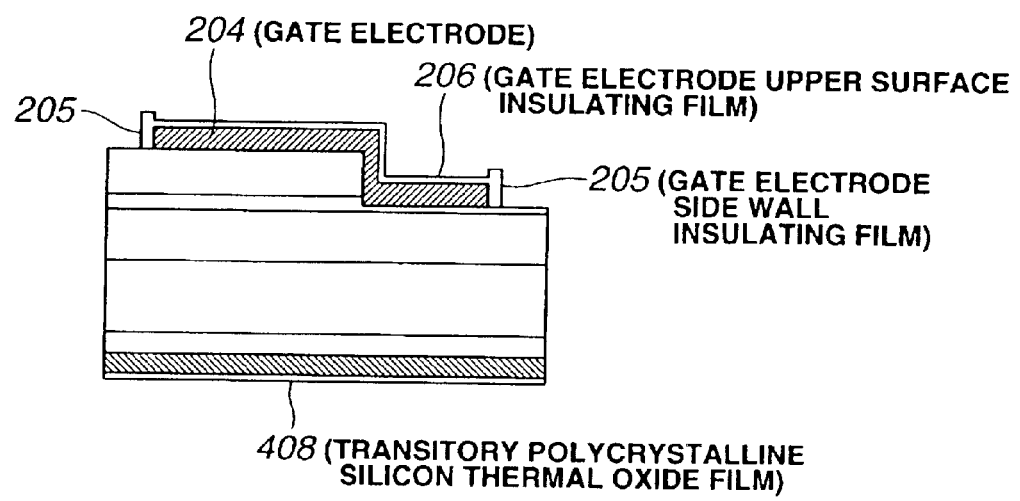
FIG.44E3

SILICON CARBIDE SEMICONDUCTOR DEVICE AND ITS MANUFACTURING METHOD

BACKGROUND OF THE INVENTION

1. Field of the Invention

The present invention relates to a semiconductor device utilizing a silicon carbide (SiC) substrate and its manufacturing method.

2. Description of the Related Art

A silicon carbide semiconductor (hereinafter, abbreviated as SiC) is capable of forming a pn junction and a forbidden band width thereof is wide as compared with other semiconductor such as a Silicon (Si) or a Gallium Arsenide (GaAs). It is reported that the forbidden band width of 3C-(C denotes a cubic system as will be described later) SiC is 2.23 eV (electron Volt), that of 6H-(H denotes a hexagonal system as will be described later) SiC is 2.93 eV, and that of 4H-SiC is 3.26 eV. As is well known, there are trade-off relationships in principle prescribed by the forbidden band width between an on resistance of a power device and a reverse direction withstanding voltage thereof and between the on resistance thereof and a switching frequency (switching speed) thereof. Hence, it is difficult to obtain a high performance exceeding a limit determined by the forbidden band of Si from currently available Si power devices. However, since, if the power device is constituted by SiC with the wide forbidden band width, the above-described trade-off relationships are largely relieved, such a power device that the on resistance, the reverse direction blocking voltage, and the switching speed have remarkably or simultaneously been improved can be realized. Furthermore, since SiC is thermally, chemically, and mechanically stable and is superior in a radiation ray withstanding characteristic, it is expected that SiC can be realized not only as a high frequency device and the power device but also as an environment withstanding characteristic semiconductor device which operates under a strict condition such as a high ambient temperature, an erosion, and radiation ray irradiation.

In a MOS (Metal Oxide Semiconductor) capacitor, SiC power MOSFET (Metal Oxide Semiconductor Field Effect Transistor) to control a large current, and an IGBT (Insulated Gate Bipolar Transistor) to control the large current especially from among SiC devices, it is an important problem to be solved for SiC devices to be put into practice that a contact resistance on a source and a drain (n type polarity) which provides causes of a thermal loss increase and of an operating speed reduction is reduced to a negligible level and highly reliable and high performance gate insulating film and MOS interface characteristic are realized.

A technology to obtain a low contact resistance in SiC singlecrystalline has been proposed. That is to say, the following method has been proposed. After a contact metallic film is formed on SiC through a vacuum deposition, a rapid thermal annealing (RTA) is carried out for several minutes at a high temperature heat process (so-called, a contact annealing) is carried out for several minutes at a high temperature equal to or higher than 950° C. under a vacuum or inactive gas atmosphere to form a reaction layer between SiC and the contact metal which provides a contact electrode. According to a Journal of Applied Physics, 77, page 1317 (1995) authored by J. Crofton et al., n type region of SiC substrate using an Ni (Nickel) film indicates the contact resistance of an extremely low practical level in an order of $10^{-7}$ $\Omega cm^2$. According to a book authored by J. Crofton called Solid-State Electronics, 41, page 1725 (1997), p type region of SiC substrate using an Al(Aluminum)-Ti (Titanium) alloy film indicates the contact resistance of the extremely low practical level in an order of $10^{-6}\Omega cm^2$. In addition, in recent times, the low contact resistance in an order of $10^{-7}\Omega cm^2$ is also obtained in each of n type region and p type region of 4H—SiC substrate using a thin Ni and a Ti—Al laminated layer.

SUMMARY OF THE INVENTION

However, it has been determined that the well known RTA process described above (contact annealing) gives a harmful effect on the reliability of the gate insulating film and MOS interface characteristic if the RTA process is applied simply to the actual device. For example, a paper announced at 1999 of T. Takami at al. Extended Abstract of Symposium on Future Electron Devices 2000 (Tokyo), FED-169, page 127, (1999) has described a manufacturing method of the MOS capacitor in which, after the RTA process for one minute was carried out at 1000° C. under the vacuum atmosphere on a thermal oxide film of about 48 nm thickness formed on an n type 4H-SiC substrate having n type epitaxial growth layer, an Al (Aluminum) electrode was formed. Then, the paper has evaluated a current-voltage characteristic (I-V characteristic) of the manufactured MOS capacitor (refer to FIGS. 1A and 1B) and a high-frequency capacitance-DC bias voltage characteristic (C-V characteristic) thereof (refer to FIG. 2). At this time, the following results were indicated as compared with a specimen to which no RTA process (without RTA) was applied. That is to say, the paper has indicated such specific data as described below and pointed out a seriousness of problem: (1) A withstanding voltage (a breakdown voltage) of the gate insulating film originally having about 40 volts was rapidly dropped to 40×⅛, viz., 5 volts or lower (refer to FIG. 1A); (2) A leakage current of the gate insulating film was remarkably increased (refer to FIG. 1A)); and (3) A flat-band voltage is shifted from an ordinary in proximity to 0 volts into a positive direction by 15 volts or higher (refer to FIG. 2). There are many reports that have pointed out in the same way. It is of course that this problem places the same importance on the power MOSFET and IGBT having the same structure as the MOS capacitor.

As a solution of the problem described above, it can easily be conceived that the temperature of the RTA process (contact annealing) is reduced to, for example, 850° C. or lower. However, this method introduces another harmful effect such a special dislike effect on the power device as to increase the contact resistance on a source and a drain rapidly. Consequently, this method cannot be said any more a fundamental countermeasure of the above-described problem.

It is, therefore, an object of the present invention to provide a silicon carbide semiconductor device and its manufacturing method which can solve the problems of deteriorations of the gate insulating film and MOS interface characteristic caused by the RTA process during the formation of the contact on the SiC substrates without introduction of the increase in a contact resistance in an ohmic contact.

The above-described object can be achieved by providing a silicon carbide semiconductor device, comprising: a gate insulating film: an electrode member that is inactive to the gate insulating film; an insulating film that is inactive to the gate insulating film; and a singlecrystalline silicon carbide substrate, the gate insulating film being treated with a predetermined heat process after being enclosed with the electrode member, the insulating film, and the singlecrystalline silicon carbide substrate.

The above-described object can also be achieved by providing a silicon carbide semiconductor device, comprising: a gate insulating film: an electrode member that is inactive to the gate insulating film; a field insulating film that is inactive to the gate insulating film; and a singlecrystalline silicon carbide substrate, the gate insulating film being treated with a predetermined heat process after being enclosed with the electrode member, the field insulating film, and the singlecrystalline silicon carbide substrate.

The above-described object can also be achieved by providing a silicon carbide semiconductor device, comprising: comprising: a singlecrystalline silicon carbide substrate; a field insulating film formed on a surface of the substrate; a gate window opened in the field insulating film; a gate insulating film formed by a method including a thermal oxidization over the whole surface of the singlecrystalline silicon carbide substrate at the gate opening, the gate insulating film being thinner than the field insulating film; a gate electrode formed on the gate insulating film so as to cover the whole gate window; and a metal electrode that is another than the gate electrode, is contacted with the singlecrystalline silicon carbide substrate, and is treated with a predetermined heat process at a temperature which is lower than a thermal oxidization temperature by which the gate insulating film is formed and is sufficient to carry out a contact annealing between the singlecrystalline silicon carbide substrate and a metal after a whole surrounding of the gate insulating film is enclosed with the singlecrystalline silicon carbide substrate, the field insulating film, and the gate electrode.

The above-described object can also be achieved by providing a manufacturing method for a silicon carbide semiconductor device, comprising: forming a field insulating film on a surface of a singlecrystalline silicon carbide substrate; forming a gate window in the field insulating film; forming a gate insulating film thinner than the field insulating film over the whole surface of the singlecrystalline silicon carbide substrate at the gate opening by a method including a thermal oxidization of at least singlecrystalline silicon carbide substrate; forming a gate electrode over the gate insulating film so as to cover the whole gate window; forming a metal electrode that is another than the gate electrode and is contacted with the singlecrystalline silicon carbide substrate; and carrying out a heating process at a temperature lower than that of the thermal oxidization by which the gate insulating film is formed and sufficient to carry out a contact annealing between the singlecrystalline silicon carbide and a metal after whole steps before this heating process have been completed.

The above-described object can also be achieved by providing a manufacturing method for a silicon carbide semiconductor devices comprising: washing a surface of the singlecrystalline silicon carbide substrate having a homoepitaxial layer; once thermally oxidizing the surface of the washed singlecrystalline silicon carbide substrate in a dry $O_2$ ambient and, immediately thereafter, removing a sacrificial oxidization film by a hydrofluoric acid series etchant; forming a field insulating film on a washed and low-defect surface formed by the sacrificial oxidization followed by the removable of the thermal oxid; forming a predetermined gate window in the field insulating film employing a photolithography and hydrofluoric acid series etchant; cleaning the substrate surface polluted with a solution of a photoresist used in the previous step of forming the predetermined gate window with the acid treatment; forming the gate insulating film in the gate window through thermal oxidization; forming a polycrystalline silicon film to which a conductive impurity is added onto the whole surface of the substrate on which the gate insulating film is also formed; forming a gate electrode by etching the polycrystalline silicon film into a predetermined pattern by the photolithography; washing the substrate surface after removing an etching mask used in the previous step of forming the gate electrode; forming an interlayer insulating film over the whole surface of the washed substrate; evaporating an electrode material onto a rear surface of the singlecrystalline silicon carbide substrate to which a clean surface is exposed through the acid treatment and an ultra-deionized water washing; performing a contact annealing of the rear surface electrode by performing a thermal process at a temperature which is lower than that of the thermal oxidization by which the gate insulating film is formed and is sufficient to perform the contact annealing between the singlecrystalline silicon carbide and a metal; opening a gate electrode contact hole penetrated to the gate electrode at a predetermined position of the interlayer insulating film; and forming a metal interconnection on an upper part of the interlayer insulating film to which the gate electrode contact hole is opened to be connected to the gate electrode via the gate electrode contact hole, the contact annealing of the rear surface electrode being carried out after the field insulating film, the gate insulating film, and the gate electrode are formed but before the metal interconnection is formed.

The above-described object can also be achieved by providing a silicon carbide semiconductor device, comprising: a gate insulating film; a gate electrode that is inactive to the gate insulating film; an insulating film formed by thermally oxidizing a part of a member of the gate electrode; a singlecrystalline silicon carbide substrate; and another insulating film formed by thermally oxidizing the singlecrystalline silicon carbide substrate, a thermal process being carried out after the gate insulating film is enclosed with the gate electrode, the insulating film, the singlecrystalline silicon carbide substrate, and the other insulating film.

The above-described object can also be achieved by providing a silicon carbide semiconductor device comprising: a singlecrystalline silicon carbide substrate; an insulating film formed on a surface of the singlecrystalline silicon carbide by a method including a thermal oxidization; a gate electrode formed on a part of the insulating film that provides a gate insulating film; a gate electrode side wall insulating film formed by thermally oxidizing a part of a member of the gate electrode; and a metal electrode that is another than the gate electrode, is contacted with the singlecrystalline silicon carbide substrate, and is treated with a predetermined thermal process at a temperature which is lower than that of the thermal oxidization by which the gate insulating film is formed and is sufficient to carry out a contact annealing between the singlecrystalline silicon carbide substrate and a metal after a whole surrounding of the gate insulating film is enclosed with the singlecrystalline silicon carbide substrate, the field insulating film, and the gate electrode.

The above-described object can also be achieved by providing a manufacturing method for a silicon carbide semiconductor device, comprising: forming an insulating film by thermally oxidizing a surface of a singlecrystalline silicon carbide substrate at a predetermined temperature; forming a gate electrode on a region of the insulating film that provides a gate insulating film; thermally oxidizing a member of the gate electrode to form a gate electrode sidewall insulating film on a sidewall of the gate electrode member; forming an interlayer insulating film on each upper surface of the gate electrode and the insulating film; evaporating a metal electrode material on a rear surface of the singlecrystalline silicon carbide substrate; and forming a rear surface electrode by carrying out a thermal process at a temperature lower than the predetermined temperature at which the surface of the singlecrystalline silicon carbide substrate is thermally oxidized and which is sufficient to perform a contact anneal between the singlecrystalline silicon carbide and a metal after a whole surrounding of the gate insulating film is enclosed by the singlecrystalline silicon carbide substrate, the insulating film formed over the singlecrystalline silicon carbide substrate, and the gate electrode side wall insulating film.

The above-described object can also be achieved by providing a manufacturing method for a silicon carbide semiconductor device, comprising: forming an insulating film by thermally oxidizing a surface of a singlecrystalline silicon carbide substrate at a predetermined temperature; forming a gate electrode on a region of the insulating film that provides a gate insulating film; forming a transitory silicon nitride film on an upper surface of the gate electrode; thermally oxidizing a member of the gate electrode to form a gate electrode side wall insulating film on a side wall of the gate electrode member; eliminating the transitory silicon nitride film; forming an interlayer insulating film on upper surfaces of the gate electrode and the insulating film; evaporating a metal electrode material on a rear surface of the singlecrystalline silicon carbide substrate; and forming a rear surface electrode by carrying out a thermal process at a temperature lower than the predetermined temperature at which the surface of the singlecrystalline silicon carbide substrate is oxidized and which is sufficient to perform a contact annealing between the singlecrystalline silicon carbide and a metal after a whole surrounding of the gate insulating film is enclosed by the singlecrystalline silicon carbide substrate, the insulating film formed over the singlecrystalline silicon carbide substrate, and the gate electrode side wall insulating film.

The above-described object can be achieved by providing a silicon carbide semiconductor device comprising: a singlecrystalline silicon carbide substrate; a field insulating film formed by a method including a thermal oxidization on a surface of the singlecrystalline silicon carbide substrate; an insulating film formed on the surface of the singlecrystalline silicon carbide substrate of an window opened in the field insulating film and thermally processed during its formation or after its formation; a gate electrode formed on a part of the insulating film which provides a gate insulating film; a gate electrode side wall insulating film formed by thermally oxidizing a part of a member of the gate electrode; and a metal electrode that is another than the gate electrode, is contacted with the singlecrystalline silicon carbide substrate, and is treated with a predetermined thermal process at a temperature which is lower than a temperature of the thermal oxidization of the insulating film and is sufficient to carry out a contact annealing between the singlecrystalline silicon carbide and a metal after a whole surrounding of the gate insulating film is enclosed with the singlecrystalline silicon carbide substrate, the field insulating film, the thermally processed insulating film, the gate electrode, and the gate electrode side wall insulating film.

The above-described object can also be achieved by providing a manufacturing method for a silicon carbide semiconductor device, comprising: forming a lower insulating film by thermally oxidizing a surface of a singlecrystalline silicon carbide substrate; forming an upper insulating film on an upper part of the lower insulating film; forming a window on a predetermined region of a field insulating film constituted by the lower insulating film and the upper insulating film, the window reaching to the surface of the singlecrystalline silicon carbide substrate; thermally oxidizing the surface of the singlecrystalline silicon carbide substrate in the window at a predetermined temperature to form the insulating film; forming a gate electrode above a part of the insulating film that provides a gate insulating film; thermally oxidizing a member of the gate electrode to form a gate electrode side wall insulating film on a side wall of the gate electrode member; forming an interlayer insulating film on a part of the insulating film except a lower part thereof below the gate electrode and at upper parts of the gate electrode and the upper insulating film; evaporating a metal electrode material onto a rear surface of the singlecrystalline silicon carbide substrate; and forming a rear surface electrode by performing a thermal process at a temperature which is lower than a predetermined temperature at which the insulating film is formed and is sufficient to perform a contact annealing between the singlecrystalline silicon carbide and a metal after a whole surrounding of the gate insulating film is enclosed by the singlecrystalline silicon carbide substrate, the field insulating film, the gate electrode, the gate electrode side wall insulating film, and a part of the insulating film that is other than the gate insulating film.

The above-described object can also be achieved by providing a manufacturing method for a silicon carbide semiconductor device, comprising: forming a lower insulating film by thermally oxidizing a surface of a singlecrystalline silicon carbide substrate; forming an upper insulating film on an upper part of the lower insulating film; opening a window at a predetermined region of a field insulating film constituted by the lower thermal insulating film and the upper insulating film, the window reaching to the surface of the singlecrystalline silicon carbide substrate; thermally oxidizing the surface of the singlecrystalline silicon carbide substrate at the window at a predetermined temperature to form the insulating film; forming a gate electrode above a part of the insulating film that provides a gate insulating film; forming a transitory silicon nitride film on an upper part of the gate electrode; thermally oxidizing a member of the gate electrode to form a gate electrode side wall film on a side wall of the gate electrode member; eliminating the transitory silicon nitride film; forming an interlayer insulating film on a part of the insulating film except a lower part thereof below the gate electrode and at upper parts of the gate electrode and the upper insulating film; evaporating a metal electrode material onto a rear surface of the singlecrystalline silicon carbide substrate; and forming a rear surface electrode by performing a thermal process at a temperature which is lower than a predetermined temperature at which the insulating film is formed and is sufficient to perform a contact annealing between the singlecrystalline silicon carbide and a metal after a whole surrounding of the gate insulating film is enclosed by the singlecrystalline silicon carbide substrate, the field insulating film, the gate electrode, the gate electrode side wall insulating film, and a part of the insulating film that is other than the gate insulating film.

This summary of the invention does not necessarily describe all necessary features so that the invention may also be a sub-combination of these described features.

BRIEF DESCRIPTION OF THE DRAWINGS

FIG. 9 is a cross sectional view of an essential part of a MOSEFT (Metal Oxide Semiconductor Field Effect Transistor) of the silicon carbide semiconductor device in a second preferred embodiment according to the present invention.

FIGS. 30A1, 30A2, 30A3 are cross sectional views representing parts of the manufacturing process of the power MOSFET in the sixth embodiment shown in FIGS. 29A and 29B.

FIGS. 31A4, 31A5, and 31A6 are cross sectional views representing other parts of the manufacturing process of the power MOSFET in the sixth embodiment according to the present invention.

FIGS. 32A7 and 32A8 are cross sectional views representing still other parts of the manufacturing process of the power MOSFET in the sixth embodiment according to the present invention.

FIGS. 33A9 and 33A10 are cross sectional views of further other parts of the manufacturing process of the power MOSFET in the sixth embodiment according to the present invention.

FIGS. 34B1, 34B2, 34B3 are cross sectional views of further other parts of the manufacturing process of the power MOSFET in the sixth embodiment according to the present invention.

FIGS. 35B4, 35B5, 35B6 are cross sectional views of further other parts of the manufacturing process of the power MOSFET in the sixth embodiment according to the present invention.

FIGS. 36B7 and 36B8 are cross sectional views of further other parts of the manufacturing process of the power MOSFET in the sixth embodiment according to the present invention.

FIGS. 37B9 and 37B10 are cross sectional views of further other parts of the manufacturing process of the power MOSFET in the sixth embodiment according to the present invention.

FIGS. 39A1, 39A7, and 39A8 are cross sectional views representing parts of the manufacturing process of the planer power IGBT in the seventh embodiment shown in FIGS. 38A and 38B.

FIGS. 40A9 and 40A10 are cross sectional views representing other parts of the manufacturing process of the planer power IGBT in the seventh embodiment shown in FIGS. 38A and 38B.

FIGS. 41B1, 41B7, and 41B8 are cross sectional views representing still other parts of the manufacturing process of the planer power IGBT in the seventh embodiment shown in FIGS. 38A and 38B.

FIGS. 42B9 and 42B10 are cross sectional views representing further other parts of the manufacturing process of the planer power IGBT in the seventh embodiment shown in FIGS. 38A and 38B.

FIGS. 43D, 43E1, and 43E2 are cross sectional views representing parts of a MOS capacitor of the silicon carbide semiconductor device in an eighth preferred embodiment shown in FIGS. 38A and 38B.

FIG. 44E3 is a cross sectional view representing another part of the MOS capacitor in the eighth preferred embodiment.

DETAILED DESCRIPTION OF THE PREFERRED EMBODIMENTS

Reference will hereinafter be made to the drawings in order to facilitate a better understanding of the present invention.

(First Embodiment)

Now, a first preferred embodiment of a silicon carbide semiconductor device and its manufacturing method according to the present invention will be described by mentioning as an example a case where the present invention is applicable to a MOS capacitor being the simplest MOS element. The MOS capacitor is used as a variable capacitance element or the like in an SiC integrated circuit.

Figure 4:
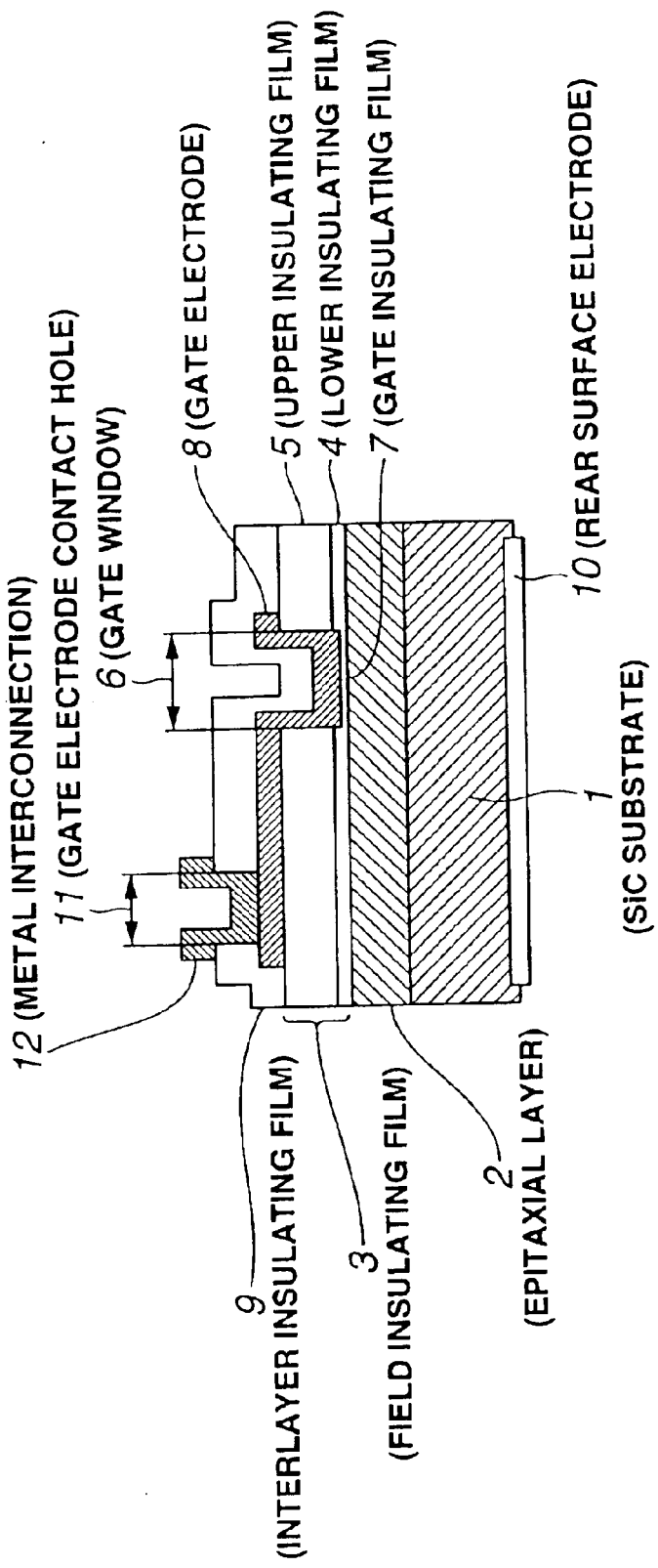
FIG. 4 is a cross sectional view of an essential portion of a MOS capacitor of a silicon carbide semiconductor device in a first preferred embodiment according to the present invention.

FIG. 4 is a cross sectional view of essential portions of the MOS capacitor in which the present invention is applicable to a metal-oxide-singlecrystalline silicon carbide (MOSiC) structure. Referring to FIG. 4, numeral 1 designates a singlecrystalline silicon carbide substrate (hereinbelow, abbreviated to "SiC substrate") of $n^+$-type at a high impurity concentration (Nitrogen>$1\times10^{19}$/cm$^3$), and an $n^-$ epitaxial layer 2 having a thickness of 10 $\mu$m and doped with nitrogen at $4\times10^{15}$/cm$^3$ is homo-epitaxially grown on a front surface of SiC substrate 1. A substrate of any of all crystal systems such as 4H, 6H, 3C and 15R (letter H signifies a hexagonal system, letter C a cubic system, and letter R a rhombohedral system) can be employed as SiC substrate 1. Hereinafter, signs $n^-$ and $n^+$ shall be used to signify dopings with an n-type impurity at a low concentration and a high concentration, respectively. In case of dopings with a p-type impurity, signs $p^-$ and $p^+$ shall be similarly used.

Homo-eptixially grown epitaxial layer 2 is overlaid with a field insulating film 3 whose thickness is several hundred nm or more. Field insulating film 3 has such a structure that a thick upper insulating film 5 which is formed by any expedient (for example, reduced-pressure CVD) other than the thermal oxidization of SiC is stacked on a thin lower insulating film 4 which is formed by the thermal oxidization of, at least, SiC substrate 1 (exactly, the epitaxial layer 2). Numeral 6 designates a gate window which is provided in field insulating film 3, and numeral 7 a gate insulating film which is formed at the bottom of gate window 6. Gate insulating film 7 needs to be a film which is annealed in such a way that it is directly exposed to a gas containing oxygen atoms, during or after the formation thereof. Gate insulating film 7 is overlaid with a gate electrode 8 of polycrystalline silicon which is arranged so as to completely cover gate window 6 and to partly stretch on field insulating film 3. An interlayer insulating film 9 is formed on gate electrode 8 and field insulating film 3. Incidentally, apart from the polycrystalline silicon electrode, a silicide electrode in which a metal (such as Ni, Ti or Co) is silicified with the polycrystalline silicon can be employed as gate electrode 8.

Shown at numeral 10 is a rear surface electrode, which is arranged on substantially the whole area of the rear surface of SiC substrate 1 except the peripheral edge thereof and which is ohmically connected with SiC substrate 1. Rear surface electrode 10 is formed in such a way that, after a contact metal such as Ni is evaporated onto the rear surface of SiC substrate 1, it is alloyed with SiC substrate 1 by rapid thermal annealing (RTA) at a temperature which is lower than one for forming gate insulating film 5. By the way, in a case where the contact metal is not apprehended to adhere onto the side walls of SiC substrate 1, it may well be disposed on the whole rear surface of the substrate.

Numeral 11 designates a gate electrode connection opening which is provided in interlayer insulating film 9, and numeral 12 a metal interconnection which serves to connect gate electrode 8 to another circuit element on the identical substrate or to an external circuit. Gate electrode connection opening 11 may well be provided so as to overlap gate electrode 8 on gate window 6. Metal interconnection 12 is connected with gate electrode 8 in gate electrode connection opening 11 formed by removing interlayer insulating film 9.

Next, a method of manufacturing the MOS capacitor shown in FIG. 4 will be described. FIGS. 5A, 5B, 5C, and 5D and FIGS. 6E, 6F, 6G, and 6H are cross sectional views showing the method of manufacturing the MOS capacitor shown in FIG. 4.

Figure 5A:
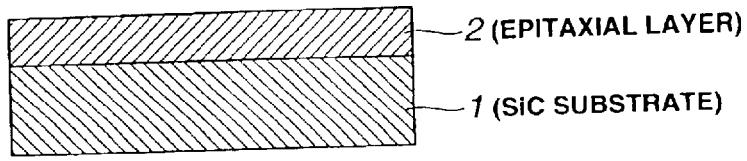
FIGS. 5A, 5B, 5C, and 5D are cross sectional views representing parts of a manufacturing process of the MOS capacitor of the silicon carbide semiconductor device in the first embodiment shown in FIG. 4.

First, referring to FIG. 5A, on the front surface (here, Si-terminated surface) of a (0001)-face 8° OFF high-concentration n-type 4H—SiC substrate 1 which is doped with nitrogen forming donor atoms, at or above $1\times10^{19}$/cm$^3$, a high-quality homo-epitaxial layer 2 in an order of $10^{15}$/cm$^3$ is grown to a predetermined thickness (here, 10 $\mu$m by way of example) by CVD (chemical vapor deposition) which employs silane and propane as raw materials. After the growth, a homo-epitaxial film of poor quality having adhered to the rear surface (herein, C termination surface) of SiC substrate 1 is removed by mechanical polishing. In the polishing, it is important to protect the front surface of epitaxial layer 2 with, e. g., a CVD-SiO$_2$ film being thick (having a thickness of at least 1 $\mu$m), lest scraches forming a factor for the deterioration of a gate insulating film should appear in epitaxial layer 2. After the polishing of the rear surface, the front protective film is removed with a removing solution suited to its material, such as a buffer solution of hydrofluoric acid. By the way, in the ensuing description, the "substrate" shall signify SiC substrate 1 formed with epitaxial layer 2 or any other film or an electrode unless otherwise specified.

Next, the substrate is sufficiently washed by RCA cleaning (a traditional cleaning method for a semiconductor substrate, which is implemented by combining H$_2$O$_2$+NH$_4$OH mixed solution SC-1 and H$_2$O$_2$+HCl mixed solution SC-2) or the like. Thereafter, the substrate is thermally oxidized in a dry oxygen atmosphere to grow thermal oxide films on the front surface of epitaxial layer 2 and the rear surface of substrate 1, and it is immediately immersed in a hydrofluoric acid buffer solution so as to remove the thermal oxide films. On this occasion, oxidization conditions are set so that the thin oxide film may be grown on the front surface of epitaxial layer 2. The thickness of the thermal oxide film should desirably be less than 50 nm, preferably be 5 to 20 nm. In a case where the thermal oxide film is thinner than 5 nm, there is the problem that an advantage of eliminating the contamination (pollution) layer or damage layer of the front surface of the substrate is slight, and in a case where it is thicker than 50 nm, there is the problem that the front surface of the substrate is gradually roughened by excessive oxidization. It is accordingly unfavorable that the film is too thick or too thin.

As described above, the contamination layer and crystalline defective layer of the front layer of the singlecrystalline silicon carbide substrate are eliminated at a stage before the formation of the gate insulating film, whereby the probability lowers at which latent defects will be embodied into the gate insulating film to be formed by thermal oxidization later. It is, therefore, possible to remarkably relieve the deterioration of the gate insulating film as is induced by a mechanism in which the latent defects are activated by thermal processing, that is, problems which occur in an actual device manufacturing process including contact annealing; (1) that the breakdown voltage of the gate insulating film lowers, and (2) that the leakage current thereof increases.

Figure 5B:
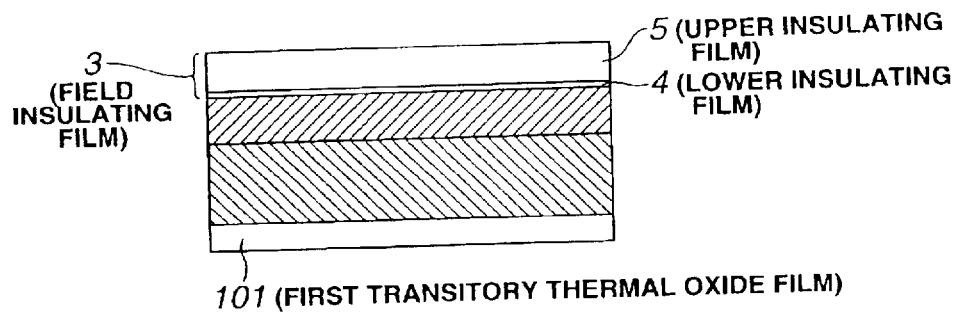

Next, referring to FIG. 5B, the substrate subjected to the above sacrifice oxidization is sufficiently washed again by the RCA cleaning or the like. Thereafter, a field insulating film 3 which consists of a thin lower insulating film 4 and a thick upper insulating film 5 is formed on the front surface of epitaxial layer 2. It is possible to use as lower insulating film 4 a thermal oxide film of about 10 nm which is formed by thermally oxidizing the front surface of epitaxial layer 2 in a dry oxygen atmosphere, and as upper insulating film 5 an insulating film of desired thickness which is formed by a method other than thermal oxidization, for example, an $SiO_2$ film of 400 nm thick as is formed by atmospheric-pressure CVD employing oxygen and silane. The thermal oxidization of lower insulating film 4 is not restricted to the dry oxygen oxidization, but it may well be wet oxidization or one employing any other oxidative gas. For the same reasons as in the above sacrificial oxidization, the thickness of lower insulating film 4 should desirably be less than 50 nm, preferably be 5–20 nm. Incidentally, upper insulating film 5 may be formed after lower insulating film 4 being the thermal oxide film has been grown on the front surface of epitaxial layer 2. Contrariwise, lower insulating film 4 (thermal oxide film) may well be formed between epitaxial layer 2 and upper insulating film 5 by forming upper insulating film 5 and then thermally oxidizing it. The latter processing sequence, however, can be taken only in a case where upper insulating film 5 is an oxygen transmitting film.

Besides, numeral 101 in FIG. 5B designates a first transitory thermal oxide film which is automatically formed on the rear surface of SiC substrate 1 during the formation of lower insulating film 4. This thermal oxide film 101 is not insignificant, but it has the function of effectively eliminating any considerably deep polishing damage layer at the rear surface of the substrate as has appeared at the step of FIG. 5A. Literature has reported that oxidization proceeds at the C termination surface (rear surface) of a 6H-SiC substrate at a rate which is about 10 times higher than at the Si termination surface thereof.

Incidentally, when the front surface of the substrate is excessively oxidized, concretely, when it is oxidized so as to be continuous several tens nm or more, the front substrate surface roughens, and the gate insulating film formed on the rough surface deteriorates. In an extreme case, the breakdown voltage and the leakage current characteristic become even worse than in a case where the sacrifice oxidization is not performed. In contrast, when field insulating film 3 is composed of thin lower oxide film 4 formed by the thermal oxidization and thick upper oxide film 5 formed by any other method, as stated above, a crystal surface which is very flat without rough parts and which has little contamination or few defects is formed in the gate window of field insulating film 3. It is therefore possible to solve the problems (1) that the breakdown voltage of the gate insulating film lowers, and (2) that the leakage current increases.

Figure 5C:
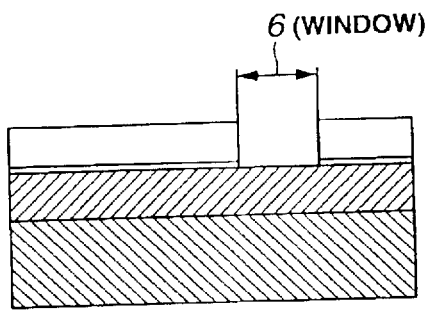

Next, referring to FIG. 5C, the front surface of the substrate is coated with a photoresist, exposed to light and developed, and the resultant substrate is immersed in a buffered hydrofluoric acid solution ($NH_4F+HF$ mixed solution) for wet etching, whereby gate window 6 is formed at the predetermined position of field insulating film 3. In forming minute opening 6, it is possible to use dry etching such as reactive ion etching which employs $CF_4$-gas plasma or the like. In this case, however, it is necessary to first perform the dry etching, and to switch it to the wet etching employing the buffered hydrofluoric acid solution, without fail when field insulating film 3 has remained several hundred nm. More specifically, when gate window 6 is penetratingly formed by the dry etching to the last, the front SiC surface roughens due to plasma damages, or hydrocarbon produced by dry etching reaction adheres to the bottom of gate window 6. This forms a factor for the deterioration of the characteristics of the gate insulating film which is formed at the next step.

When the etching for the opening of a gate region has been performed as stated above, the photoresist is stripped off. A first transitory thermal oxide film 101 which has embodied the damage layer of the rear substrate surface at the step of FIG. 5B, disappears here.

Next, referring to FIG. 52D, the substrate contaminated with resist residue is sufficiently washed again by the RCA cleaning which does not include a hydrofluoric acid treatment midway. At the final stage of the washing, the substrate is immersed in a buffered hydrofluoric acid solution for five seconds to ten seconds in order to remove a chemical oxide film produced on the surface of the gate window by the RCA cleaning, and the buffered hydrofluoric acid solution is completely washed away by ultra-deionized water, whereupon the substrate is dried. Since the chemical oxide film is very inferior in quality and is also inhomogeneous, it exerts evil influence on the homogeneous growth of the subsequent thermal oxide film. Therefore, the removal of the chemical oxide film is indispensable.

Next, the dried substrate is immediately subjected to thermal oxidization, whereby gate insulating film 7 of desired thickness (here, 40 nm by way of example) is grown on the front surface of epitaxial layer 2 corresponding to gate window 6. Regarding the conditions of the gate oxidization, dry oxidization at a temperature of 1100° C., for example, is recommended though not restrictive. Here, an important point to be noted for realizing gate insulating film 7 which satisfactorily endures rapid thermal annealing such as contact annealing is that the temperature of the thermal oxidization is set higher than any annealing temperature at all the subsequent steps. In this embodiment, the oxidization temperature of 1100° C. has been selected because rapid thermal annealing at 1000° C. is performed later in order to realize the low-resistivity ohmic contact of a rear surface electrode. In some elements, it is desired to form a gate insulating film of or above 50 nm whose surface roughens conspicuously. In such a case, the desired thickness is attained by overlaying a thermal oxide film of SiC with an insulating film formed by another expedient for film formation (for example, CVD-SiO$_2$ film).

Figure 5D:
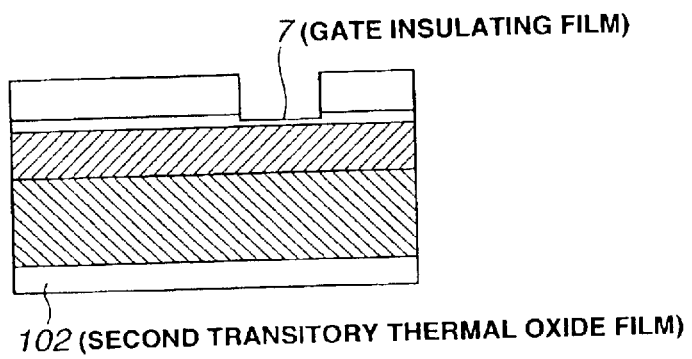

By the way, in FIG. 5D, numeral 102 designates a second transitory thermal oxide film being comparatively thick, which is automatically formed on the rear substrate surface when the gate insulating film is formed by the thermal oxidization. Second transitory thermal oxide film 102 has the effect of eliminating a polishing damage layer similarly to first transitory thermal oxide film 101 stated before, and also has the important function of protecting the rear substrate surface from damages ascribable to dry etching for the removal of polycrystalline silicon on the rear surface as will be explained at the subsequent step in FIG. 6E. Without the protection by the oxide film, there occurs the problem that the crystallinity of the rear substrate surface is disordered to degrade the ohmic characteristics of rear surface electrode 10 which is formed at a later step in FIG. 6F.

Figure 6E:
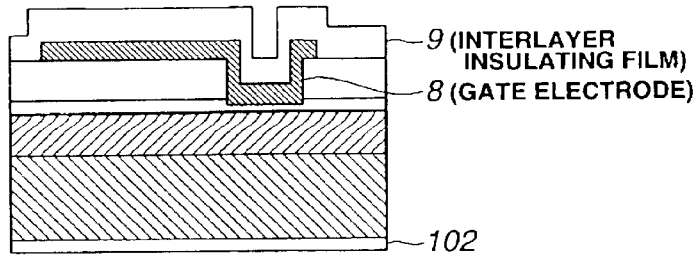
FIGS. 6E, 6F, 6G, and 6H are cross sectional views of other parts of the manufacturing process of the MOS capacitor of the silicon carbide semiconductor device in the first preferred embodiment shown in FIG. 4.

Next, referring to FIG. 6E, immediately after the step of FIG. 3D, a polycrystalline silicon film being 300–400 nm thick is formed on the whole substrate surface by reduced-pressure CVD (deposition temperature: 600° C.–700° C.) employing a raw material of silane. Thereafter, the polycrystalline silicon film is doped with P by well-known thermal diffusion (treatment temperature: 900° C.–950° C.) employing phosphorus chlorate (POCl$_3$) and oxygen, so as to afford a conductivity type.

Next, the front substrate surface is coated with a photoresist, and the unnecessary part of the polycrystalline silicon film on the front substrate side is removed by employing photolithography, and reactive ion etching (RIE) whose etchants are C$_2$F$_6$ and oxygen. Thus, a gate electrode 8 of polycrystalline silicon is formed.

Next, the resist used for the RIE is completely removed. Thereafter, the whole front surface of the substrate is coated again with a resist material (which may well be a photoresist) having a thickness of at least 1 μm, so as to protect the front surface, whereupon dry etching whose etchants are CF$_4$ and O$_2$ is carried out to completely eliminate the polycrystalline silicon deposited on the rear substrate side. In the dry etching, the substrate is situated in an environment where accelerated ions fly about, so that damages and charging ascribable to ion bombardment are liable to occur. In this regard, it is an important point to be noted that the surface protection by the resist material is indispensable for preventing the deterioration of gate insulating film 7 attributed to the damages and the charging.

The resist material for the surface protection is stripped off, and the substrate is subjected to the RCA cleaning again. When the substrate has been cleaned, an interlayer insulating film 9 is deposited on polycrystalline silicon gate electrode 8 on the front substrate surface, and field insulating film 3. Suitable as the material of interlayer insulating film 9 is an SiO$_2$ film being about 1 μm thick, which is formed by atmospheric-pressure CVD employing silane and oxygen as raw materials, phosphosilicate glass (PSG) film which is further doped with phosphorus, or the like. However, the material is not restrictive, but another material such as SiN may well be employed as long as it can endure various succeeding annealing steps. Thereafter, the substrate is put in an ordinary diffusion furnace and is subjected to moderate annealing in an N$_2$ atmosphere for several tens minutes, so as to densify interlayer insulating film 9. An annealing temperature on this occasion is appropriately selected within a range of, for example, 900° C.–1000° C. so as to be lower than the gate oxidization temperature of 1100° C.

Figure 6F:
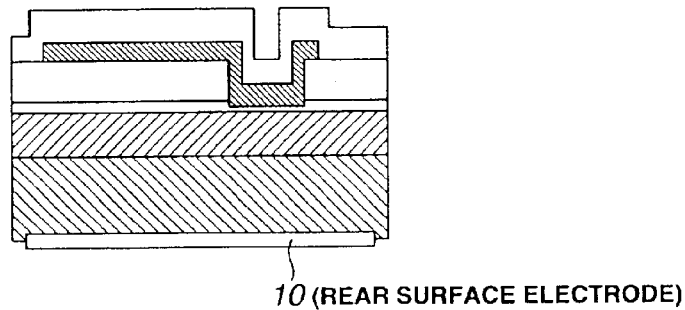
Figure 6G:
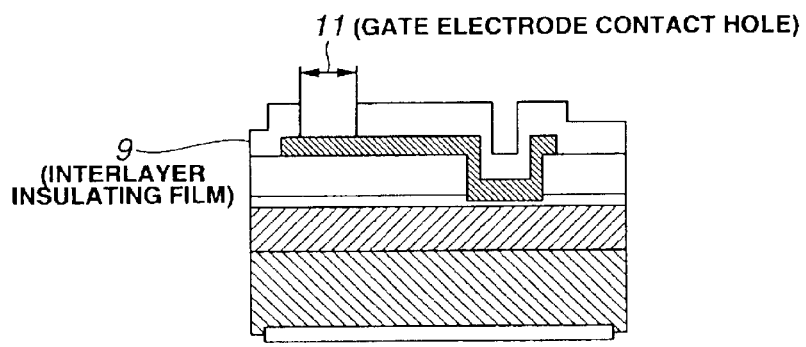

Next, referring to FIG. 6F, the front substrate surface is coated with a photoresist again in order to protect gate electrode 8 and field insulating film 3 on the front side, and the substrate is sufficiently post-baked so as to completely vaporize the volatile components of the resist. Thereafter, the substrate is immersed in a buffered hydrofluoric acid solution so as to completely remove second transitory thermal oxide film 102 remaining on the rear surface, and the buffered hydrofluoric acid solution is washed away by ultra-deionized water. That C terminated surface of the rear surface of SiC substrate 1 which has been denuded in this way, is a clean surface of few damages and little contamination.

As soon as the substrate wet with the ultra-deionized water has been dried, the dried substrate is set in a short time into an evaporation apparatus whose interior is kept at a high degree of vacuum, and a desired rear surface electrode material is evaporated onto the rear substrate surface. The rear surface electrode material is, for example, an Ni film being 50 nm thick. By the way, in a case where the electrode material is apprehended to adhere onto the side walls of substrate, the evaporation is performed in a state where the outer peripheral edge of the substrate is hidden using a shadow mask. FIG. 6F shows an example in which rear surface electrode 10 has been evaporated using a shadow mask.

Next, the resist used for the surface protection is completely stripped off with the dedicated stripper solution of the resist, and the substrate is sufficiently washed and then dried. The dried substrate is immediately set into a rapid thermal annealing apparatus, and is subjected to rear contact annealing at 1000° C. in an atmosphere of 100% high-purity Ar for 2 minutes. Owing to the annealing, the Ni film is alloyed with SiC substrate 1 of low resistance, and rear surface electrode 10 in the ohmic contact of very low resistance exhibiting a contact resistance in the order of, at least, 10$^{-6}$ Ωcm$^2$ can be formed. Incidentally, the temperature of the rear contact annealing is set at a temperature (at least 900° C.) which is lower than that of the thermal oxidization having formed gate insulating film 7 and which is sufficient for the contact annealing between the singlecrystalline silicon carbide and a metal (for example, Ni).

In the rapid thermal annealing stated above, the whole substrate, namely, the whole MOS structure of the "gate electrode—gate insulating film—SiC" having the structure in which gate insulating film 7 is entirely covered with polycrystalline-silicon gate electrode 8 is heated at the same time.

Next, referring to 6G, after the formation of rear surface electrode 10, the front substrate surface is coated with a photoresist and is exposed and developed by an exposure apparatus, thereby to form a resist mask for providing an opening in interlayer insulating film 9 by etching. Further, the rear substrate surface is coated with the photoresist, which is then sufficiently dried. Thereafter, a gate electrode connection hole 11 is provided in interlayer insulating film 9 by etching the front surface with a buffered hydrofluoric acid solution. The resist on the rear surface fulfills the function that rear surface electrode 10 is prevented from dissolving in the buffered hydrofluoric acid solution and from disappearing or changing in quality, or that the electrode material having dissolved or exfoliated from the rear surface is prevented from adhering onto the front surface.

Figure 6H:
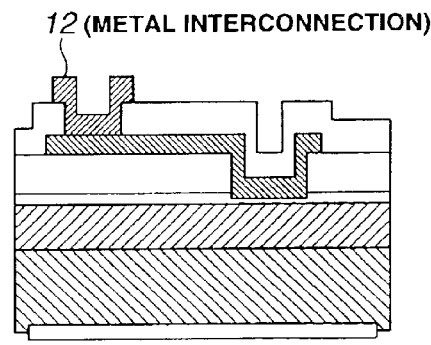

Next, referring to FIG. 6H, when the etching for the opening has ended, the resist used for the resist mask and the rear surface electrode protection is completely stripped off with the dedicated stripper solution of the resist, and the substrate is sufficiently washed and then dried. The dried substrate is immediately set into a magnetron sputtering apparatus whose interior is kept at a high degree of vacuum, and a desired metal interconnection material, for example, an Al film being 1 μm thick, is evaporated onto the whole upper surface of the substrate formed with interlayer insulating film 9.

Thereafter, the front surface of the substrate covered with the Al film is coated with a photoresist and is exposed and developed, so as to form a resist mask for etching. Further, the rear substrate surface is coated again with the photoresist for rear surface electrode protection, and the resist is sufficiently dried. Next, the Al film on the front surface is patterned with an etching solution of phosphoric acid type, thereby to form a metal interconnection 12.

Incidentally, the resist on the rear surface is formed in order to prevent rear surface electrode 10 from dissolving in the phosphoric acid type etching solution and from disappearing or changing in quality. This resist, however, can be dispensed with in a case where the rear surface electrode 10 is not apprehended to dissolve or where the Al film is etched by RIE (dry).

Besides, as stated above, metal interconnection 12 of Al or the like is formed after a thermal annealing of the contact annealing. This makes it possible to avoid the problems ascribable to heat and thermal impact during the thermal annealing; (1) that the metal interconnection is peeled off the interlayer insulating film, (2) that metal interconnection 12 deteriorates interlayer insulating film 9 and gate insulating film 7 underlying it (due to reduction, the diffusion of metal elements, and the appearance of stress), and (3) that metal interconnection 12 melts and spills over to short-circuit circuits within the chip.

At a final stage, the resist used for the resist mask and the rear surface electrode protection is completely removed by the dedicated stripper solution thereof, and the substrate is sufficiently washed and then dried. Thus, the MOS capacitor which has the "gate electrode—gate insulating film—semiconductor SiC (MOS) structure" according to the present invention as shown in FIG. 4 is finished up.

As described above, in this embodiment, as a metal electrode (rear surface electrode 10) which is brought into contact with a singlecrystalline silicon carbide substrate, except a gate electrode, there is employed a metal electrode which is subjected to thermal annealing at a temperature (at least 900° C.) that is lower than the temperature of thermal oxidization having formed a gate insulating film 7 and that is sufficient for the contact annealing between singlecrystalline silicon carbide and a metal (Ni), after gate insulating film 7 has been entirely enclosed with the singlecrystalline silicon carbide substrate (an epitaxial layer 2), a field insulating film 3 and the gate electrode 8. Owing to such a construction, during the thermal annealing, the gate insulating film is surrounded completely in vertical and horizontal directions with the gate electrode (polycrystalline silicon), $SiO_2$ and SiC which are thermally stable (which neither react nor diffuse). It is, therefore, possible to very effectively prevent the drawback that any metal substance which has come flying from the inner wall of a rapid thermal annealing apparatus or the contact of the SiC substrate itself and has adhered to gate insulating film 7 enters into gate insulating film 7 due to the high-temperature treatment, and the drawback that, in a case where rapid thermal annealing is carried out in a high degree of vacuum at or above 800° C., the $SiO_2$ gate insulating film is inhomogeneously decomposed to change in quality. Moreover, since the temperature in the case of forming the gate insulating film by the thermal oxidization is set higher than the temperature of the contact annealing, thermal stress attendant upon contraction to be developed in the gate insulating film by the rapid thermal annealing can be released beforehand by the moderate annealing condition. As will be detailed with reference to FIGS. 7 and 8, therefore, the advantage is brought forth that the deterioration of the gate insulating film caused by the thermal stress ascribable to the rapid thermal annealing can be solved.

Besides, since the annealing is carried out at the temperature sufficient for the contact annealing between the single-crystalline silicon carbide and the metal, that ohmic contact of very low resistance whose contact resistance exhibits the order of $10^{-6}$ $\Omega cm^2$ is attained as the contact between the singlecrystalline silicon carbide and the metal electrode.

Figure 7:
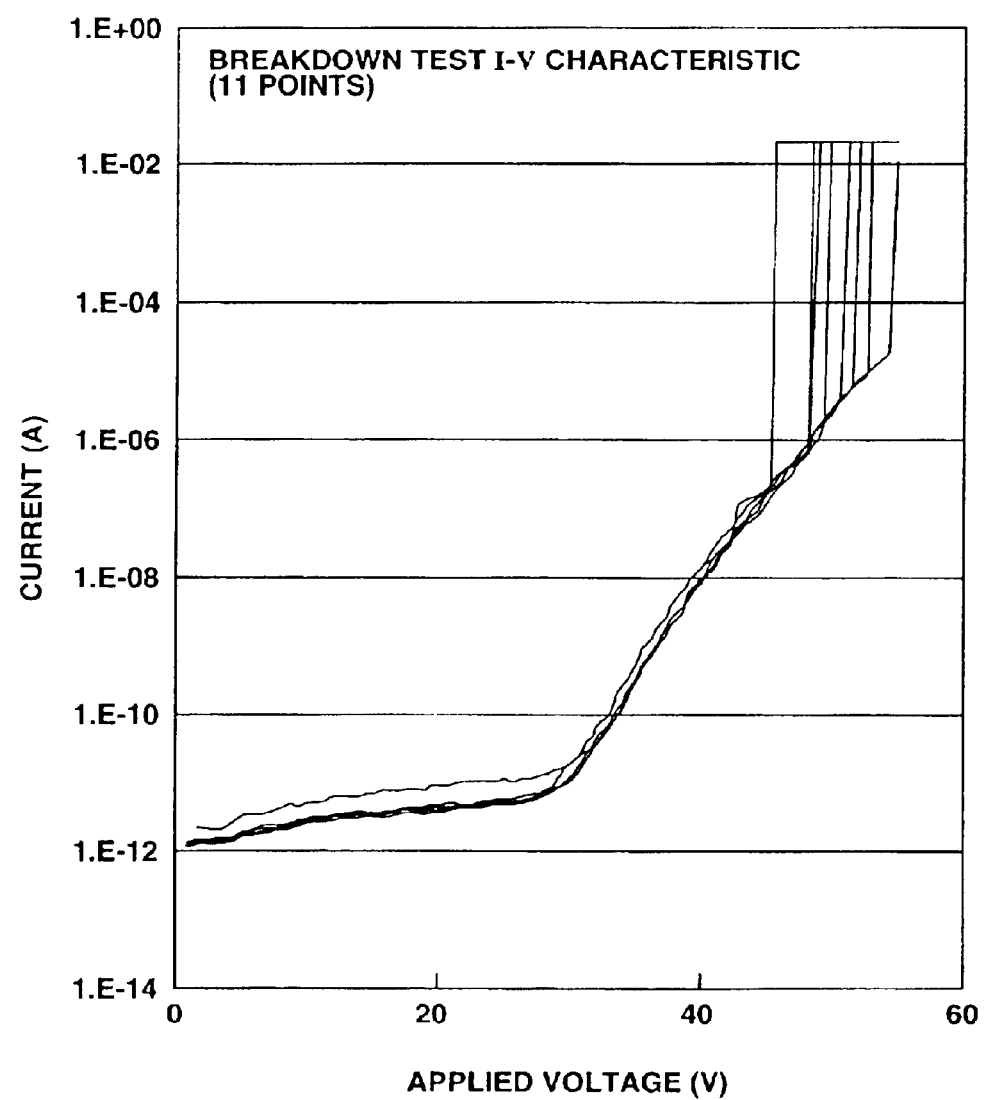
FIG. 7 is a current-voltage characteristic of the MOS capacitor of the silicon carbide semiconductor device in the first embodiment shown in FIG. 4.

FIG. 7 is a diagram of current-voltage characteristics measured as to arbitrary 11 samples among MOS capacitors thus fabricated. Incidentally, each of the sample MOS capacitors was such that the area (window) of the gate electrode was $3.14 \times 10^{-4}$ $cm^2$, and that the thickness of the gate insulating film was 45 nm.

As understood from FIG. 7, all the tested MOS capacitors exhibit substantially the same current-voltage characteristics. The current-voltage characteristic is a characteristic intrinsic to a thin oxide film as is known as "Fowler-Nordheim conduction", and leakage current suggestive of deterioration is not observed. Besides, an excellent value of or above 45 V (10 MV/cm in terms of an electric field) is given as a breakdown voltage in any of the samples.

Figure 1A:
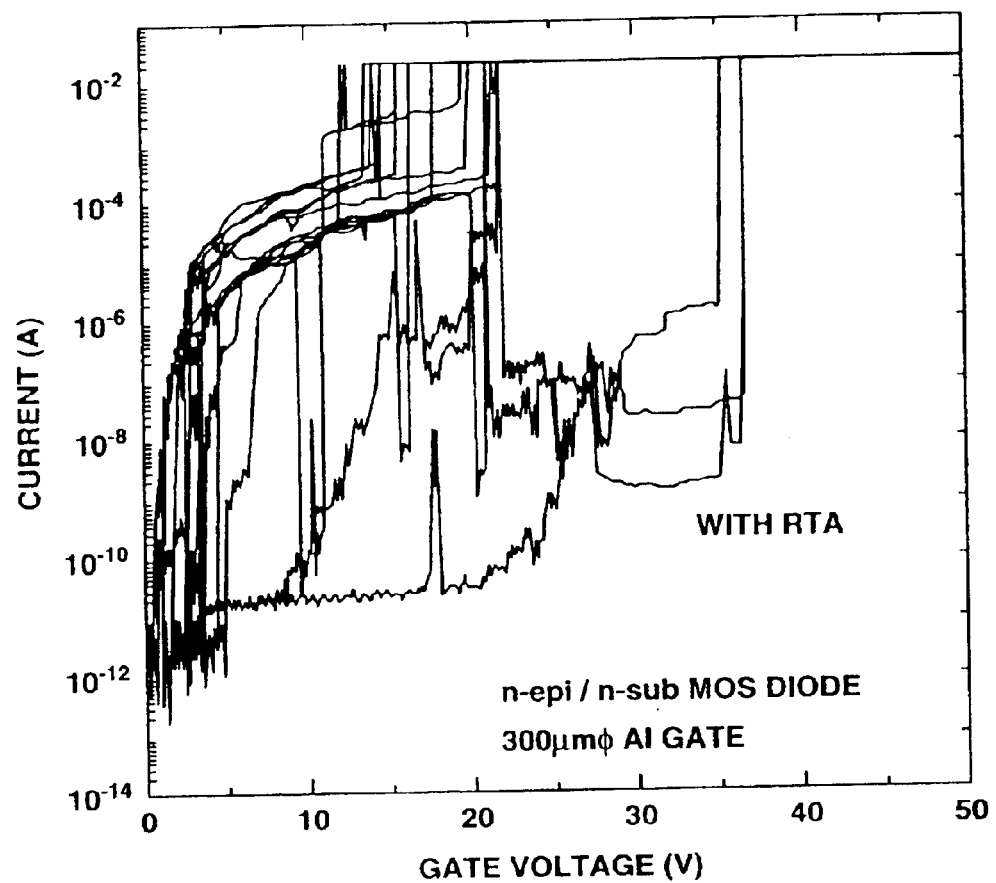
FIG. 1A is a current-voltage characteristic graph of a conventional MOS capacitor treated with RTA (Rapid Thermal Annealing).
Figure 1B:
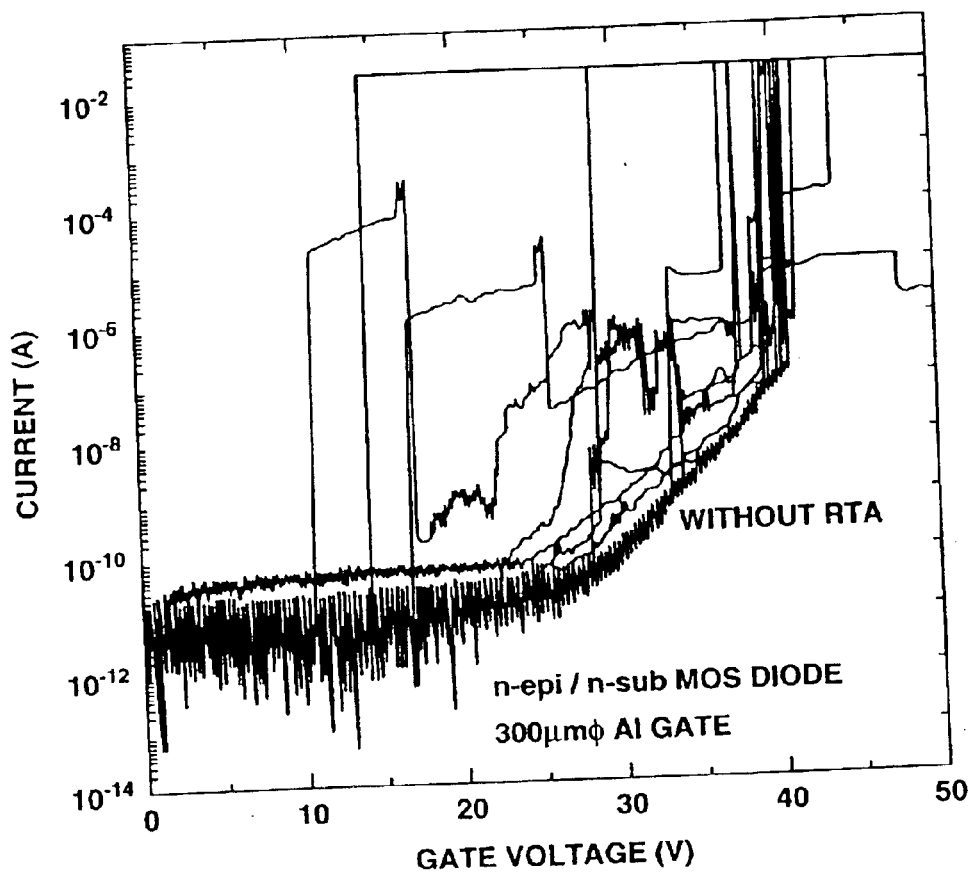
FIG. 1B is the current-voltage characteristic graph of the conventional MOS capacitor treated without RTA (Rapid Thermal Annealing).

As understood by comparing the characteristics in FIG. 7 and FIGS. 1A and 1B, the leakage current and breakdown voltage of the gate insulating film of the MOS capacitor based on the present invention are remarkably improved over those of the gate insulating film (with RTA) subjected to the conventional rapid thermal annealing as shown in FIG. 1A.

Figure 8:
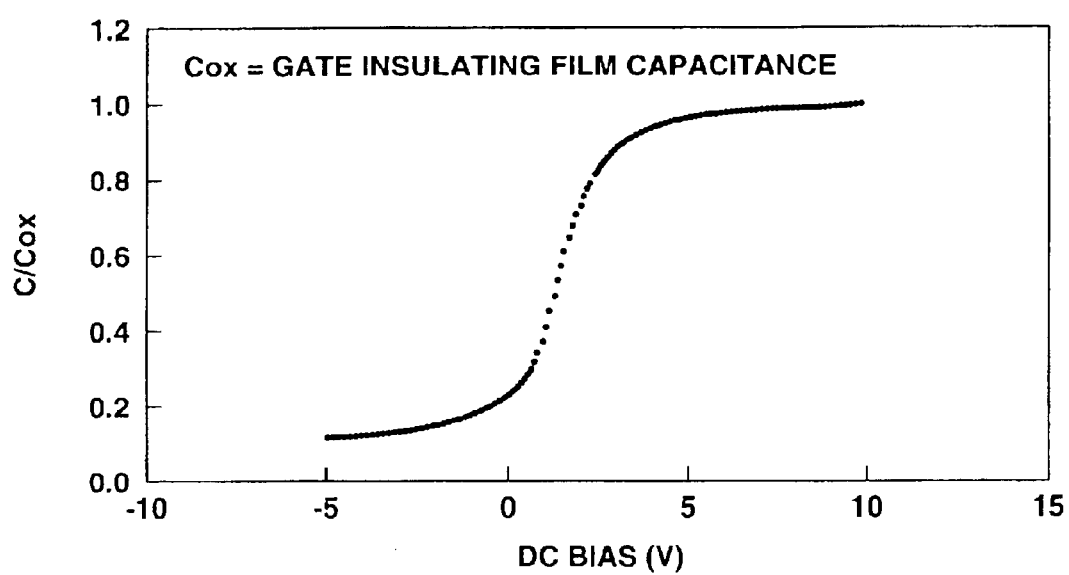
FIG. 8 is a high frequency capacitance-DC bias voltage characteristic graph of the MOS capacitor of the silicon carbide semiconductor device in the first embodiment shown in FIG. 4.

Besides, FIG. 8 is a high-frequency C-V characteristic diagram of the MOS capacitor according to the present invention. Regarding the prior art shown in FIG. 2, it is pointed out that, as the result of the rapid thermal annealing, a flat-band voltage shifts greatly in a positive direction and becomes at least 15V. In contrast, it is seen that, in the MOS capacitor subjected to the similar rapid thermal annealing, a flat-band voltage has a value of 2 V odd, which is also decreased much. The lowering (improvement) of the flat-band voltage is a remarkable improvement which corresponds to the decrease of one order in terms of the effective charge density $Q_{eff}$ ($C/cm^2$) of an oxide film interface.

As apparent from the above description, when the rapid thermal annealing such as contact annealing (for example, at 1000° C. for one minute) is carried out in the prior art, there have been the problems; (1) that a withstanding voltage (=breakdown voltage) of the gate insulating film as ought to be about 40 V drops abruptly to at most 5 V being ⅛ (graph in FIG. 1A), (2) that the leakage current of the gate insulating film increases conspicuously (the graph of FIG. 1A), and (3) that the flat-band voltage shifts in the positive direction 15 V or more from the vicinity of an ordinary value of zero V (refer to FIG. 2), whereas all the problems have been solved in the "gate electrode—gate insulating film—semiconductor SiC (MOS) structure" and the manufacturing method therefor according to the present invention.

Besides, in this embodiment, the contact annealing at 1000° C. in the Ar atmosphere for 2 minutes is added. These thermal annealing conditions and the method of forming the contact afford the optimum manufacturing method for realizing low-resistance ohmic contact with $n^+$ SiC. In this embodiment, accordingly, the ohmic contact of very low resistance is attained at the rear surface of the SiC substrate. In other words, the present invention has solved the above problems (1), (2), and (3) without incurring increase in the contact resistance.

In addition, an important point to be noted is that this embodiment has solved problems (1), (2), and (3), not only for the contact annealing, but also for all the other foregoing thermal steps which the gate insulating film often undergoes in an actual device, for example, the formation of the polycrystalline silicon film, drive-in for doping the polycrystalline silicon film with the phosphorus impurity, the deposition of the interlayer insulating film, and the densifying thermal annealing of the interlayer insulating film.

Furthermore, in view of I-V characteristics shown in FIG. 1B, it is understood that, with the prior art, the gate insulating films which are not subjected to the rapid thermal annealing have breakdown voltages on the order of, at most, 40 V, and that defective units which break down at low voltages or which exhibit high leakage currents are included in a considerable number. In contrast, the breakdown voltages of the gate insulating films in this embodiment are all as high as 40 V or above, and the best gate insulating film obtained exceeds even 54 V. Besides, all leakage currents are small and are intrinsic currents. In this manner, the silicon carbide semiconductor device (gate electrode—gate insulating film—semiconductor SiC structure) and the manufacturing method thereof according to the present invention have the excellent advantages that characteristics which are favorable as compared with those of the gate insulating film in the prior art are exhibited, and that the favorable characteristics can be maintained to the last even when device manufacturing steps which include annealing and dry etching after the formation of the gate insulating film have been undergone.

(Second Embodiment)

A second embodiment of the silicon carbide semiconductor device and its manufacturing method according to the present invention is an example to which the invention is applicable in order to realize favorable gate insulating film characteristics and MOS interface characteristics in a planar power MOSFET of n-channel type as disclosed in, for example, Japanese Patent Application First Publication No. Heisei 10-308510.

FIG. 9 is a sectional view of essential portion of a power MOSFET.

Referring to FIG. 9, numeral 21 designates an n$^+$-type SiC at a high impurity concentration (nitrogen>$1\times10^{19}$/cm$^3$), and a first n$^-$ epitaxial layer 22 having a thickness of 10 μm and doped with nitrogen at $4\times10^{15}$/cm$^3$ is homo-epitaxially grown on the front surface (upper principal (main) surface in the figure) of SiC substrate 21. A substrate of any of all crystal systems such as 4H, 6H, 3C and 15R (letter H signifies a hexagonal system, letter C a cubic system, and letter R a rhombohedral system) can be employed as SiC substrate 21.

p$^-$ base regions 23a and 23b each of which has a predetermined depth and is slightly doped with a p-type impurity are spatially formed in predetermined regions in the front surface layer portion of first n$^-$ epitaxial layer 22. Besides, n$^+$ source regions 24a, 24b shallower than p$^-$ base regions 23a, 23b are formed in predetermined regions in the front surface layer portions of p$^-$ base regions 23a, 23b, respectively. Further, a second n$^-$ epitaxial layer piece 25 is extended in the front surface layers of first n$^-$ epitaxial layer 22 and p$^-$ base regions 23a, 23b so as to lie in contact with both n$^+$ source regions 24a and 24b. Second n$^-$ epitaxial layer piece 25 functions as a channel forming layer in the front surface of a device during the operation of the device. The impurity concentration of n$^-$ epitaxial layer piece 25 shall be a low concentration between $1\times10^{15}$/cm$^3$ and $1\times10^{17}$/cm$^3$, and shall not be higher than the impurity concentration of p$^-$ base regions 23a, 23b. Besides, recesses 36a, 36b are respectively formed in the upper parts of p$^-$ base regions 23a, 23b and n$^+$ source regions 24a, 24b.

A field insulating film 26 whose thickness is several hundred nm or more is disposed on p$^-$ base regions 23a, 23b and n$^+$ source regions 24a, 24b except second n$^-$ epitaxial layer piece 25 and the outer peripheral edge thereof. Field insulating film 26 has such a structure that a thick upper insulating film 28 which is formed by any expedient (for example, reduced-pressure CVD) other than the thermal oxidization of SiC is stacked on a thin lower insulating film 27 which is formed by the thermal oxidization of the front surface of SiC substrate 21. Besides, numeral 29 designates a gate window which is provided in field insulating film 26, and numeral 30 a gate insulating film which is formed at the bottom of gate window 29. Gate insulating film 30 needs to be a film which is annealed in such a way that it is directly exposed to an oxidizing gas containing oxygen atoms, during or after the formation thereof.

Gate insulating film 30 is overlaid with a gate electrode 31 of polycrystalline silicon which is arranged so as to completely cover gate window 29 and to partly stretch on field insulating film 26. An interlayer insulating film 32 is formed on gate electrode 31 and field insulating film 26.

Reference numerals 33a, 33b denote source contact holes which are provided in field insulating film 26 and interlayer insulating film 32, and which penetrate to source/base regions. Source electrodes 34a, 34b exist at the bottoms of source contact hole 33a, 33b. Source electrodes 34a, 34b are formed in such a way that, after a contact metal such as Ni is deposited, it is alloyed with SiC (the source layers and the base layers) by rapid thermal annealing (for example, at 1000° C. for two minutes). Besides, numeral 35 designates a metal interconnection, which connects source electrodes 34a, 34b to another circuit element on the identical substrate or to an external circuit through source contact hole 33a, 33b.

Incidentally, although no illustration is made in the figure, gate electrode contact holes are provided in those parts of interlayer insulating film 32 which overlie the stretching parts of gate electrode 31 of polycrystalline silicon, and contact electrodes which are formed of Ni alloyed with the polycrystalline silicon are also deposited on those parts of gate electrode 31 which correspond to the bottoms of the gate electrode contact holes. A second metal interconnection (not shown) which serves to connect gate electrode 31 to another circuit element on the identical substrate or to an external circuit through the contact electrodes and the gate electrode contact holes, is placed on interlayer insulating film 32.

Meanwhile, a portion 37 on the rear surface of SiC substrate 21 is a drain electrode which is arranged on substantially the whole area of the rear surface except the peripheral edge of the substrate. Drain electrode 37 is formed in such a way that, after a contact metal such as Ni is evaporated onto the rear substrate surface, it is alloyed with SiC substrate 21 by rapid thermal annealing. By the way, in a case where the contact metal is not apprehended to adhere onto the side walls of SiC substrate 21, it may well be deposited on the whole rear surface of the substrate.

Next, a method of manufacturing a planar power MOSFET to which the present invention is applicable will be described. FIGS. 1A, 10B, 10C, 11D, 11E, 11F, 12G, 12H, 12I, and 13J are sectional views showing steps of the manufacturing method.

Figure 10A:
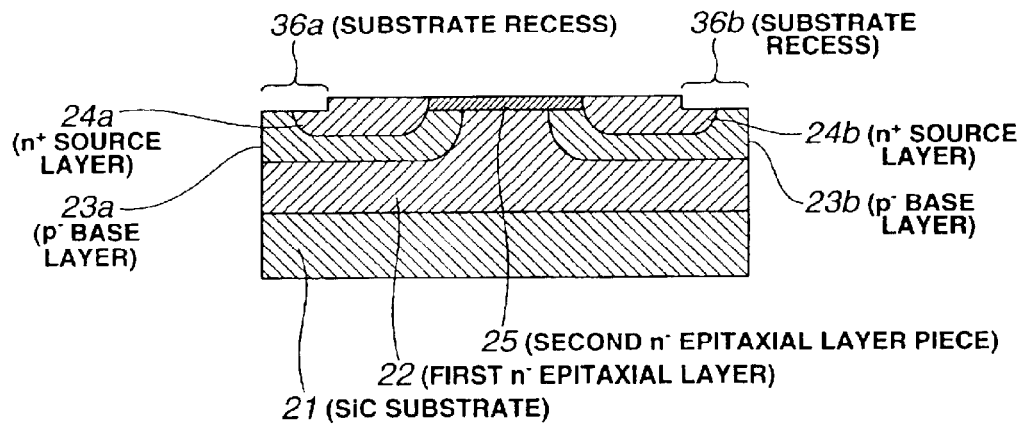
FIGS. 10A, 10B, and 10C are cross sectional views representing parts of the manufacturing process of the MOSFET of the silicon carbide semiconductor device in the second preferred embodiment shown in FIG. 9.

First, referring to FIG. 10A, an $n^+$ SiC substrate 21 is formed with a first $n^-$ epitaxial layer 22, $p^-$ base regions 23a and 23b, $n^+$ source regions 24a and 24b, a second $n^-$ epitaxial layer piece 25, and substrate recesses 36a and 36b. Incidentally, epitaxial layers of poor quality on the rear surface of SiC substrate 21 as are respectively formed simultaneously with the growth of the first and second $n^-$ epitaxial layers shall be eliminated by the steps explained in the first embodiment. It is noted that, in the ensuing description, "substrate" shall signify SiC substrate 21 formed with epitaxial layer 22 or any other film or an electrode unless otherwise specified.

Figure 10B:
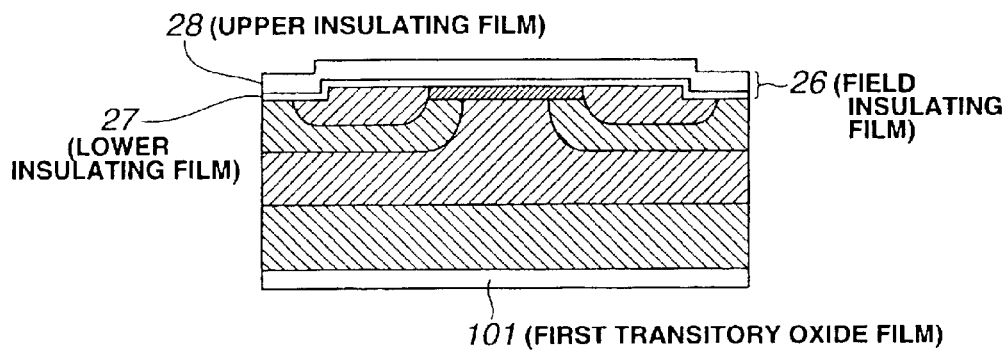

Next, referring to FIG. 10B, the substrate sufficiently washed by RCA cleaning or the like is thermally oxidized in a dry oxygen atmosphere to grow thermal oxide films on the front surface and rear surface of the substrate, and the thermal oxide films are immediately removed using a buffered hydrofluoric acid solution. On this occasion, the thickness of each of the thermal oxide films should desirably be less than 50 nm, preferably be 5 to 20 nm, for the reasons already stated. After the substrate subjected to the above sacrificial oxidization is sufficiently washed again by the RCA cleaning or the like, a field insulating film 26 which consists of a thin lower insulating film 27 and a thick upper insulating film 28 is formed on the front substrate surface. It is possible to use as lower insulating film 27 a thermal oxide film of about 10 nm which is formed by thermally oxidizing the front substrate surface in a dry oxygen atmosphere, and as upper insulating film 28 an insulating film of desired thickness which is formed by a method other than thermal oxidization, for example, an $SiO_2$ film being 400 nm thick as is formed by atmospheric-pressure CVD employing oxygen and silane. The thickness of lower insulating film 27 should desirably be less than 50 nm, preferably be 5–20 nm. The thermal oxidization of lower insulating film 27 is not restricted to the dry oxiduzation, but it may well be wet oxidization or one employing any other oxidizing gas. Besides, upper insulating film 28 may be formed after lower insulating film 27 has been grown on the front substrate surface. Contrariwise, lower insulating film 27 (thermal oxide film) may well be formed between the substrate and upper insulating film 28 by forming upper insulating film 28 and then thermally oxidizing it. Incidentally, numeral 101 in FIG. 10B designates a first transitory thermal oxide film which is automatically formed on the rear substrate surface during the formation of lower insulating film 27. Transitory thermal oxide film 101 has the function of effectively eliminating any considerably deep polishing damage layer at the rear substrate surface as has appeared at steps of FIG. 10A.

Figure 10C:
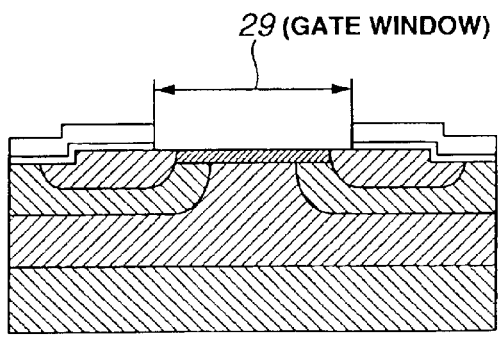

Next, referring to FIG. 10C, the front substrate surface is coated with a photoresist, exposed to light and developed, and the resultant substrate is immersed in a buffered hydrofluoric acid solution for wet etching, whereby gate window 29 is formed at the predetermined position of field insulating film 26. First transitory thermal oxide film 101 disappears here. Besides, in forming minute gate window 29, it is possible to use dry etching such as reactive ion etching which employs $CF_4$-gas plasma or the like. In this case, however, it is necessary to first perform the dry etching, and to switch it to the wet etching employing the buffered hydrofluoric acid solution, without fail when the field insulating film has remained several hundred nm. When the etching has ended, the photoresist is stripped off.

Figure 11D:
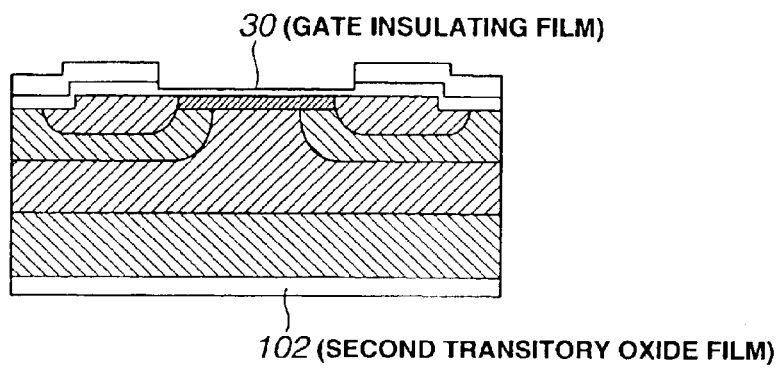
FIGS. 11D, 11E, and 11F are cross sectional views representing other parts of the manufacturing process of the MOSFET in the second embodiment shown in FIG. 9.

Next, referring to FIG. 11D, the substrate contaminated with resist residue is sufficiently washed again by the RCA cleaning or the like. At the final stage of the washing, the substrate is immersed in a buffered hydrofluoric acid solution for 5 seconds to 10 seconds in order to remove a chemical oxide film produced on the surface of gate window 29 by the RCA cleaning, and the buffered hydrofluoric acid solution is completely washed away by ultra-deionized water, whereupon the substrate is dried.

The dried substrate is immediately subjected to thermal oxidization, whereby a gate insulating film 30 of desired thickness (herein, 40 nm by way of example) is thermally grown on the front substrate surface corresponding to gate window 29. Regarding the conditions of the gate oxidization, dry oxidization at a temperature of 1100° C., for example, is recommended though not restrictive. Here, an important point for realizing gate insulating film 30 which endures rapid thermal annealing such as contact annealing is that the temperature of the thermal oxidization is set higher than any annealing temperature at all the subsequent steps. In this embodiment, the oxidization temperature of 1100° C. has been selected because rapid thermal annealing at 1000° C. is performed later in order to realize the ohmic contact of a drain electrode 37 and source electrodes 34a, 34b. In some elements, it is desired to form a gate insulating film 30 of or above 50 nm whose surface roughens conspicuously. In such a case, the desired thickness is attained by overlaying a thermal oxide film of SiC with an insulating film formed by another expedient for film formation (for example, CVD-$SiO_2$ film). Besides, numeral 102 designates a second transitory thermal oxide film being comparatively thick, which is automatically formed on the rear substrate surface when the gate insulating film is formed by the thermal oxidization.

Figure 11E:
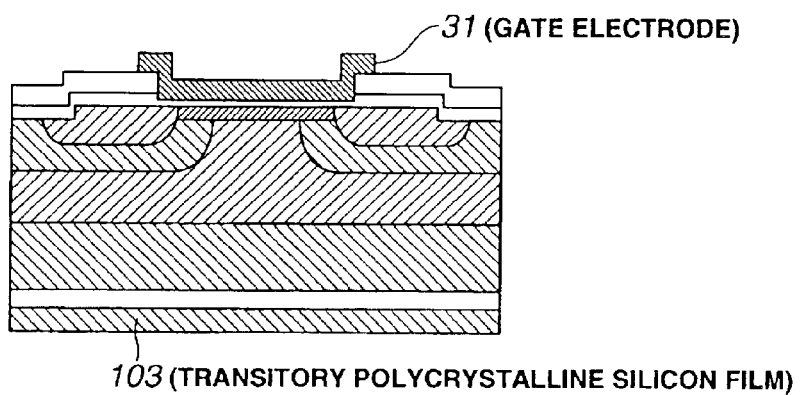

Next, referring to FIG. 11E, as soon as gate insulating film 30 has been formed, polycrystalline silicon films 103 each being 300 to 400 nm thick are formed on the whole front and rear surfaces of the substrate by reduced-pressure CVD (growth temperature: 600° C.–700° C.) employing a raw material of silane. Thereafter, the polycrystalline silicon films are doped with P (phosphorus) by well-known thermal diffusion (treatment temperature: 900° C.–950° C.) employing phosphorus chlorate ($POCl_3$) and oxygen, so as to afford a conductivity type.

The front substrate surface is coated with a photoresist, and the unnecessary part of the polycrystalline silicon film on the front substrate side is eliminated by employing photolithography, and reactive ion etching (RIE) whose etchants are $C_2F_6$ and oxygen. Thus, a gate electrode 31 is formed.

Figure 11F:
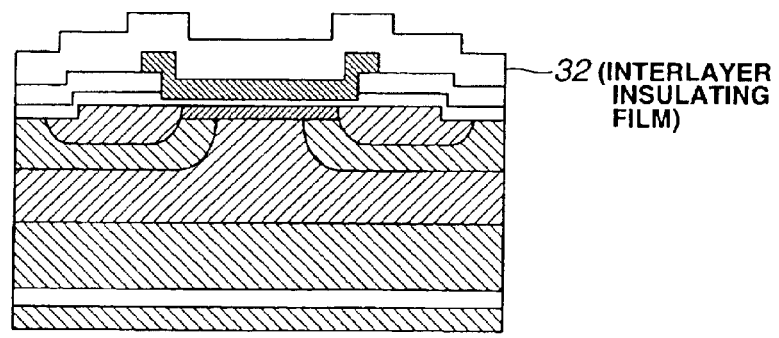

Next, referring to FIG. 11F, the resist used for the RIE is completely removed, and the substrate is subjected to the RCA cleaning. When the substrate has been cleaned, an interlayer insulating film 32 is deposited on gate electrode 31 and field insulating film 26 on the front substrate surface. Suitable as the material of interlayer insulating film 32 is an $SiO_2$ film being about 1 $\mu$m thick, which is formed by atmosheric-pressure CVD employing silane and oxygen as raw materials, phosphosilicate glass (PSG) which is further doped with phosphorus, or the like. However, the material is not restrictive. Thereafter, the substrate is put in an ordinary diffusion furnace and is subjected to moderate annealing in an $N_2$ atmosphere for several tens minutes, so as to densify interlayer insulating film 32. An annealing temperature on this occasion is appropriately selected within a range of 900° C.–1000° C.

Figure 12G:
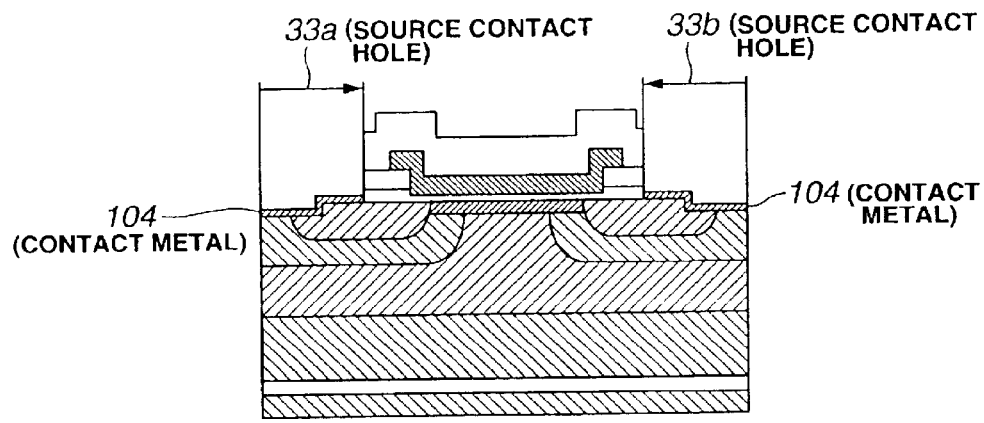
FIGS. 12G, 12H, and 12I are cross sectional views representing still other parts of the manufacturing process of the MOSFET in the second embodiment shown in FIG. 9.

Next, referring to FIG. 12G, the front surface of the substrate is coated with a photoresist, exposed to light and developed, and the resultant substrate is immersed in a buffered hydrofluoric acid solution ($NH_4F+HF$ mixed solution) for wet etching, whereby source contact holes 33a, 33b and gate electrode contact holes (not shown) are formed at the predetermined positions of the interlayer insulating film 32 and field insulating film 26. Since the gate electrode contact holes are overlaid with interlayer insulating film 32 only, they penetrate somewhat earlier than source contact holes 33a, 33b which are also overlaid with field insulating film 26. Since, however, the gate electrode contact holes are underlaid with gate electrode 31 of polycrystalline silicon not etched in the buffered hydrofluoric acid solution, their etching automatically stops when they have reached the polycrystalline silicon. In forming the minute holes, it is possible to use dry etching such as reactive ion etching which employs $CF_4$-gas plasma or the like. In this case, however, it is necessary to first perform the dry etching, and to switch it to the wet etching employing the buffered hydrofluoric acid solution, without fail when the insulating film on the source and gate contact holes 33a, 33b has remained several hundred nm.

When the etching has ended, the substrate is sufficiently washed and dried. The dried substrate remaining the photoresist as an etching mask is immediately set into an evaporation apparatus whose interior is kept at a high degree of vacuum, and a contact metal 104, for example, Ni being 50 nm thick is evaporated onto the whole front substrate surface. A time period for which the substrate is let stand between the etching of the contact holes and the evaporation of the contact metal, is a very important factor which governs magnitudes of the contact resistances of source electrodes. More specifically, when the time period is long, natural oxide films are formed on the parts of the front SiC surface corresponding to the contact holes, or hydrocarbon adheres to the above parts again. This forms a cause for hampering the homogeneous formation of alloy layers to be stated later, resulting in a sharp increase or scattering in the contact resistances. Accordingly, contact metal 104 needs to be deposited as early as possible after the etching of the openings.

When the evaporation has ended, the substrate is immersed in a dedicated photoresist stripper so as to completely remove the photoresist which remains on the front substrate surface. Thus, contact metal 104 deposited on the photoresist is simultaneously removed, thereby to form a substrate structure in which contact metal 104 is left behind at only the bottoms of source contact holes 33a, 33b and gate electrode contact holes.

Figure 12H:
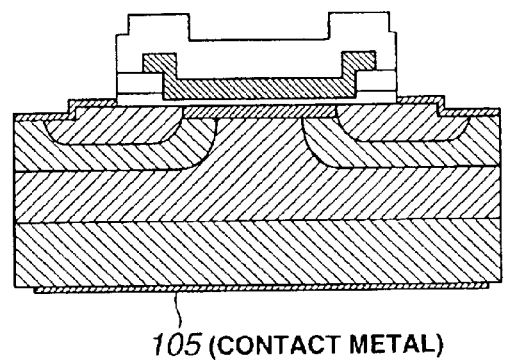

Next, referring to FIG. 12H, the substrate is sufficiently washed and dried. Thereafter, the whole front surface is coated with a protective resist material (which may be a photoresist) having a thickness of at least 1 $\mu$m, and the substrate is once immersed in a buffered hydrofluoric acid buffer solution, thereby to eliminate an $SiO_2$ film formed on polycrystalline silicon film 103 on the rear substrate side. Next, rear surface side polycrystalline silicon film 103 is completely eliminated by dry etching which employs $CF_4$ and $O_2$. The surface protection step employing the resist is indispensable for preventing contact metal 104 and gate insulating film 30 from deteriorating due to plasma damages and charging which might occur during the dry etching.

Next, the substrate is immersed in a buffered hydrofluoric acid solution, thereby to remove second transitory thermal oxide film 102 having been formed inside polycrystalline silicon film 103 and to denude a clean crystal surface on the rear substrate side. Besides, the buffered hydrofluoric acid solution is completely washed away with ultra-deionized water, and the substrate is dried. Then, the dried substrate is promptly set into an evaporation apparatus whose interior is kept at a high degree of vacuum, and a desired rear contact metal 105 is evaporated onto the rear substrate surface. The material of the rear contact metal 105 (rear surface electrode) is, for example, an Ni film being 50 nm thick. By the way, in a case where the electrode material is apprehended to adhere onto the side surfaces (walls) of the substrate, the evaporation is performed in a state where the outer peripheral edge of the substrate is hidden using a shadow mask. FIG. 12H shows an example in which the rear surface electrode has been evaporated using the shadow mask.

Figure 12I:
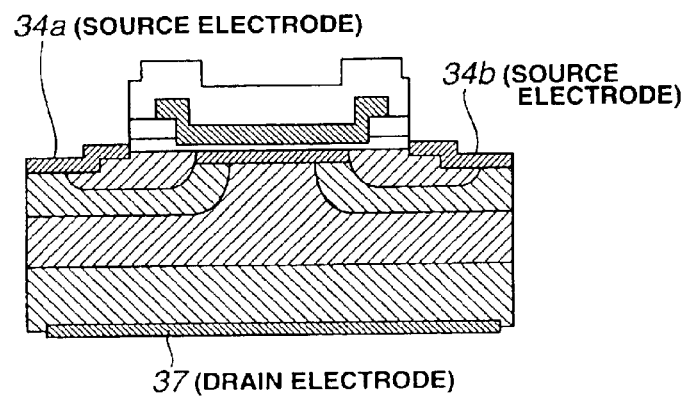

Next, referring to FIG. 12I, the resist used for the surface protection is completely stripped off with the dedicated stripper solution of the resist, and the substrate is sufficiently washed and then dried. The dried substrate is immediately set into a rapid thermal annealing apparatus, and is subjected to rapid thermal annealing (contact annealing) at 1000° C. in an atmosphere of high-purity Ar for 2 minutes. Owing to the annealing, contact metal portions 104 and 105 (Ni films) at the bottoms of source contact holes 33a, 33b as well as gate electrode contact holes (not shown) and on the rear surface are simultaneously alloyed with the SiC of the $n^+$ source regions, as well as the $n^+$ polycrystalline silicon and the $n^+$ SiC of the rear surface, thereby to form source electrodes 34a, 34b, gate electrode contacts (not shown) and a drain electrode 37 exhibiting very low resistances, respectively. On this occasion, the whole structure of the gate electrode—gate insulating film—semiconductor SiC (MOS) in which gate insulating film 30 is entirely covered with polycrystalline silicon gate electrode 31 is heated at the same time.

Figure 13J:
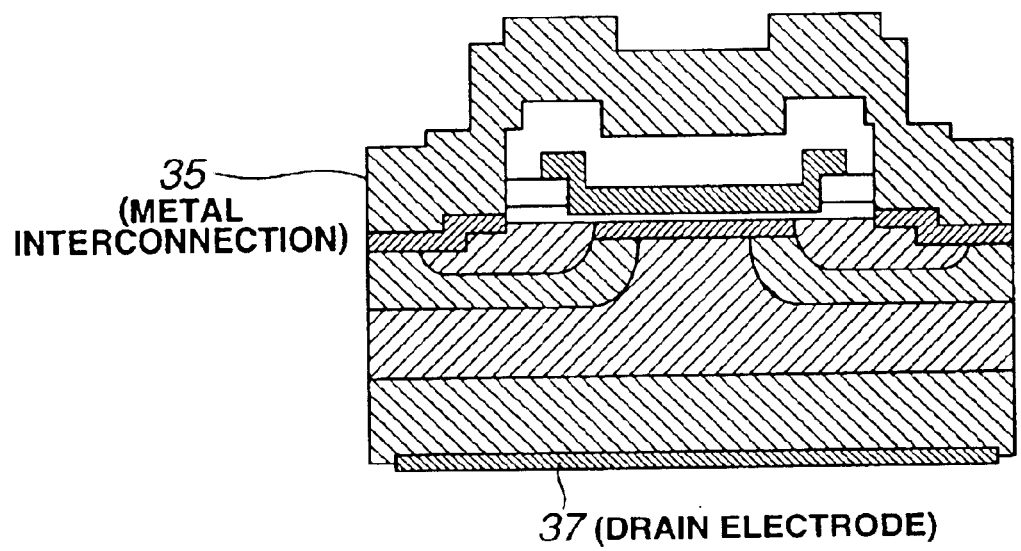
FIG. 13J is a cross sectional view representing a further another part of the manufacturing process of the MOSFET in the second embodiment shown in FIG. 9.

Next, referring to FIG. 13J, the substrate subjected to the contact annealing is immediately set into a magnetron sputtering apparatus whose interior is kept at a high degree of vacuum, and a desired metal interconnection material, for example, Al is evaporated to a thickness of 1 $\mu$m onto the whole upper surface of the substrate formed with interlayer insulating film 32 and source openings 33a, 33b.

Thereafter, the front surface of the substrate formed with the Al film is coated with a photoresist and is exposed and developed, so as to form a resist mask for etching. Further, the rear substrate surface is coated again with the photoresist for rear surface electrode protection, and the resist is sufficiently dried. Next, the Al film is patterned with an etching solution of phosphoric acid type, thereby to form a metal interconnection 35. The resist on the rear surface is formed in order to prevent drain electrode 37 from dissolving in the phosphoric acid type etching solution and from disappearing or changing in quality. This resist, however, can be dispensed with in a case where drain electrode 37 is not apprehended to dissolve or where the Al film is etched by RIE (dry).

At a final stage, the resist mask and the protective resist used for the drain electrode protection are completely removed by the dedicated stripper solution thereof, and the substrate is sufficiently washed and then dried. Thus, the planar power MOSFET according to the present invention as shown in FIG. 9 is finished up.

When the I-V characteristic and high-frequency C-V characteristic of the gate insulating film of the planar power MOSFET fabricated in this way were estimated, characteristics equivalent to those in FIGS. 7 and 8 (described in the first embodiment) were obtained, respectively. By the way, in the measurement, samples in each of which the spacing between $p^-$ base 23a and $p^-$ base 23b was especially enlarged to 200 $\mu$m were used so as to facilitate the measurement.

As described above, even in the case of applying the present invention to the planar power MOSFET, advantages equivalent to those of the MOS capacitor described in the first embodiment are attained. It can be understood that the result is one expected when the structures and processes in the vicinities of the gate windows of both the devices are compared. More specifically, n⁺ source regions 24a, 24b and p⁻ base regions 23a, 23b in FIG. 9 are regions doped with an n-type impurity and a p-type impurity, respectively, but their parent region is n-epitaxial layer (22 or 25) as described with reference to FIG. 9. Accordingly, the sectional structure of the gate window (including its outer edge) of the planar power MOSFET according to the present invention as shown in FIG. 9 does not differ from that of the gate window (including its outer edge) of the MOS capacitor according to the first embodiment.

Besides, when the manufacturing process of the planar power MOSFET and that of the MOS capacitor are compared, the steps which are implemented since the formation of the gate insulating film till the formation of the interlayer insulating film are quite the same. Regarding the subsequent steps, although the step of simultaneously forming source contact metal (Ni) 104 and the contact metal (not shown) of the gate electrode at the bottoms of the source openings 33a, 33b and the bottoms of the gate electrode openings is inserted in the MOSFET, this step is a process at a room temperature, and hence, both the manufacturing processes of the MOSFET and the MOS capacitor are the same when compared from the viewpoint of thermal budget at high temperatures.

Further, the second embodiment according to the present invention, not only has the advantages common to the first embodiment, but also can solve problems peculiar to prior-art SiC vertical MOSFETs including the planar MOSFET, as elucidated below.

Figure 3:
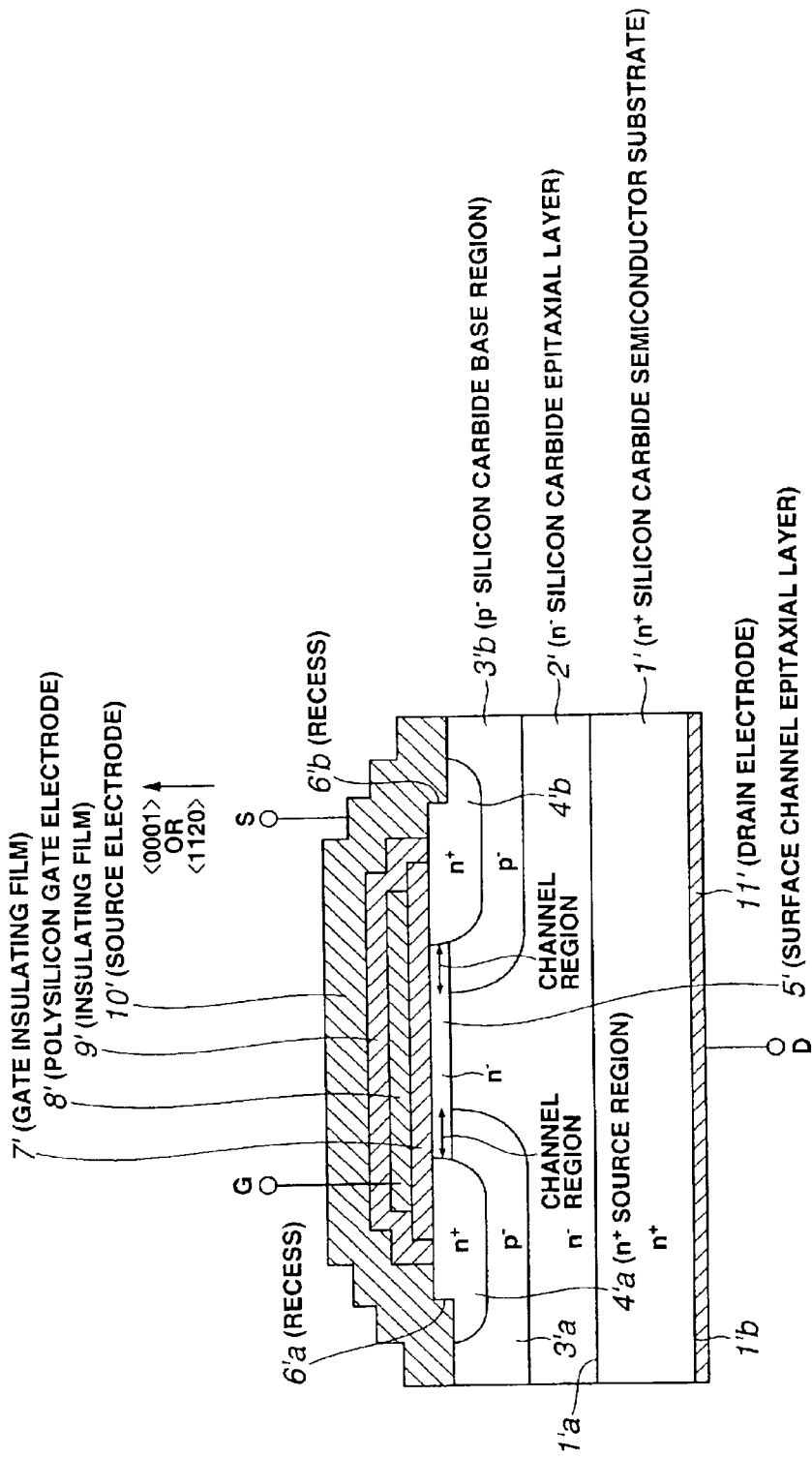
FIG. 3 is a cross sectional view of a conventional MOSFET (Metal Oxide Semiconductor Field Effect Transistor) described in a Japanese Patent Application First Publication No. Heisei 10-308510 published on Nov. 17, 1998.

FIG. 3 is a schematic sectional view of an essential portion of a conventional power MOSFET employing SiC as disclosed in Japanese Patent Application First Publication No. Heisei 10-308510 (published on Nov. 17, 1998). The structure of this conventional MOSFET will be briefly described. Sign 1' denotes an n⁺-type silicon carbide semiconductor substrate of hexagonal system, the upper surface of which is a principal surface 1a' and the lower surface of which opposite to the principal surface is a rear surface 1b'. An n⁻-type silicon carbide epitaxial layer 2' which has a dopant concentration lower than that of the n⁺-type silicon carbide semiconductor substrate 1', is stacked on principal surface 1a' of substrate 1'. A p⁻-type silicon carbide base region 3a' and a p⁻-type silicon carbide base region 3b' each having a predetermined depth are spatially formed in predetermined regions in the front surface layer portion of n⁻-type silicon carbide epitaxial layer 2'. Besides, an n⁺-type source region 4a' shallower than p⁻-type silicon carbide base region 3a' is formed in a predetermined region in the front surface layer portion of base region 3a', while an n⁺-type source region 4b' shallower than p⁻-type silicon carbide base region 3b' is formed in a predetermined region in the front surface layer portion of base region 3b'. Further, an n⁻-type SiC layer 5' is extended in the front surface portions of n⁻-type silicon carbide epitaxial layer 2' and p⁻-type silicon carbide base regions 3a', 3b' between n⁺-type source regions 4a' and 4b'. That is to say, n⁻-type SiC layer 5' is arranged so as to tie source regions 4a', 4b' and n⁻-type silicon carbide epitaxial layer 2' in the front surface portions of base regions 3a', 3b'. Besides, recesses 6a', 6b' are formed in the front surface portions of p⁻-type silicon carbide base regions 3a', 3b' and n⁺-type source regions 4a' and 4b'. A gate insulating film (silicon oxide film) 7' is formed on the upper surface of the surface channel epitaxial layer 5' and the upper surfaces of n⁺-type source regions 4a', 4b'. Further, a gate electrode 8' of polysilicon is formed on gate insulating film 7'. Gate electrode 8' is covered with an insulating film 9'. An LTO (Low Temperature Oxide) film is employed as insulating film 9'. This insulating film 9' is overlaid with a source electrode 10' which serves also as an internal metal interconnection. Source electrode 10' lies in contact with n⁺-type source regions 4a', 4b' and p⁻-type silicon carbide base regions 3a', 3b'. Besides, a drain electrode layer 11' is formed on rear surface 1b' of n⁺-type silicon carbide semiconductor substrate 1'.

As is well known, in a device which controls a large current, such as the power MOSFET, a contact resistance should desirably be lowered to the utmost in order to diminish a thermal loss. In, for example, a device in a class of a reverse blocking voltage of 1 kV, the contact resistance of a source/drain needs to be lowered to, at the highest, $10^{-5}$ Ωcm. A contact metal with the source/drain as meets this purpose is only Ni at present, as Crofton et al. investigated and have discussed in a general report (Phys. Stat. Sol., 202, p. 581 (1997)). However, when the Ni hopeful as the contact metal is used as source electrode 10' serving also as the internal metal interconnection, there is the problem that, since the strength of adhesion of the Ni with the underlying the LTO film (silicon oxide film) 9' is poor, the Ni on the LTO film peels off, so also the Ni on the SiC peels off. Another problem is that, when the Ni is subjected to contact annealing, underlying LTO film (silicon oxide film) 9' is reduced and corroded.

In contrast, according to the second embodiment of the present invention, as seen from FIGS. 9 and 12G, the double preventive measure is taken that structurally the contact metal (Ni) 104 of the source is not formed on the silicon oxide film, namely, interlayer insulating film 32, and that high-temperature or rapid thermal annealing such as the contact annealing is carried out before metal interconnection 35 is stacked. That is, the second embodiment features (1) the structure in which any metal interconnection of Ni or the like forming the cause of deterioration is not located on the gate insulating film, and (2) the expedient in which the rapid thermal annealing is carried out before forming the metal interconnection above. Therefore, the problems as mentioned above do not take place at all. In other words, the MOSFET according to the second embodiment of the present invention has the special advantage that the problems of the prior-art MOSFET can be solved.

Besides, Japanese Patent First Application No. 2000-200907 (published on Jul. 18, 2000) has pointed out that, when the MOSFET shown in FIG. 3 (disclosed in Japanese Patent Application First Publication No. Heisei 10-308510) is illuminated with light, its flat-band voltage shifts greatly in a positive direction, and it has proposed the resolution that, in order to avoid the drawback, the doping concentration of the surface channel layer with nitrogen is set at or below $1 \times 10^{15}/cm^3$. With this method, however, the use of the nitrogen N as ion implantation species (an n-type dopant) is equivalently forbidden at the ion implantation step of controlling the threshold voltage of the MOSFET or forming a buried channel, and a serious restriction is imposed on the manufacturing technology of the MOSFET.

In contrast, in the power MOSFET according to the second embodiment of the present invention, the phenomenon of the great shift of the flat-band voltage attributed to the light illumination is not observed even when the MOSFET is constructed by employing the epitaxial layer of or above $10^{15}/cm^3$. In other words, the structure and manufacturing method of the power MOSFET according to the second embodiment according to the present invention has the advantage of being capable of solving the problem of the MOSFET of the construction in FIG. 3 that the flat-band voltage shifts greatly in the positive direction when the MOSFET is illuminated with light. Simultaneously, the structure and manufacturing method of the power MOSFET according to the second embodiment according to the present invention has the excellent advantage of relieving the restriction of the use of the dopant nitrogen N as imposed for solving the problem by Japanese Patent Application First Publication No. 2000-200907, and permitting the use of the nitrogen N as the ion implantation species.

(Third Embodiment)

The third embodiment of the silicon carbide semiconductor device and its manufacturing method according to the present invention is an example to which the present invention is applicable in order to realize favorable gate insulating film characteristic and MOS interface characteristic in a planar power IGBT (Insulated Gate Bipolar Transistor) of n-channel type.

Figure 14:
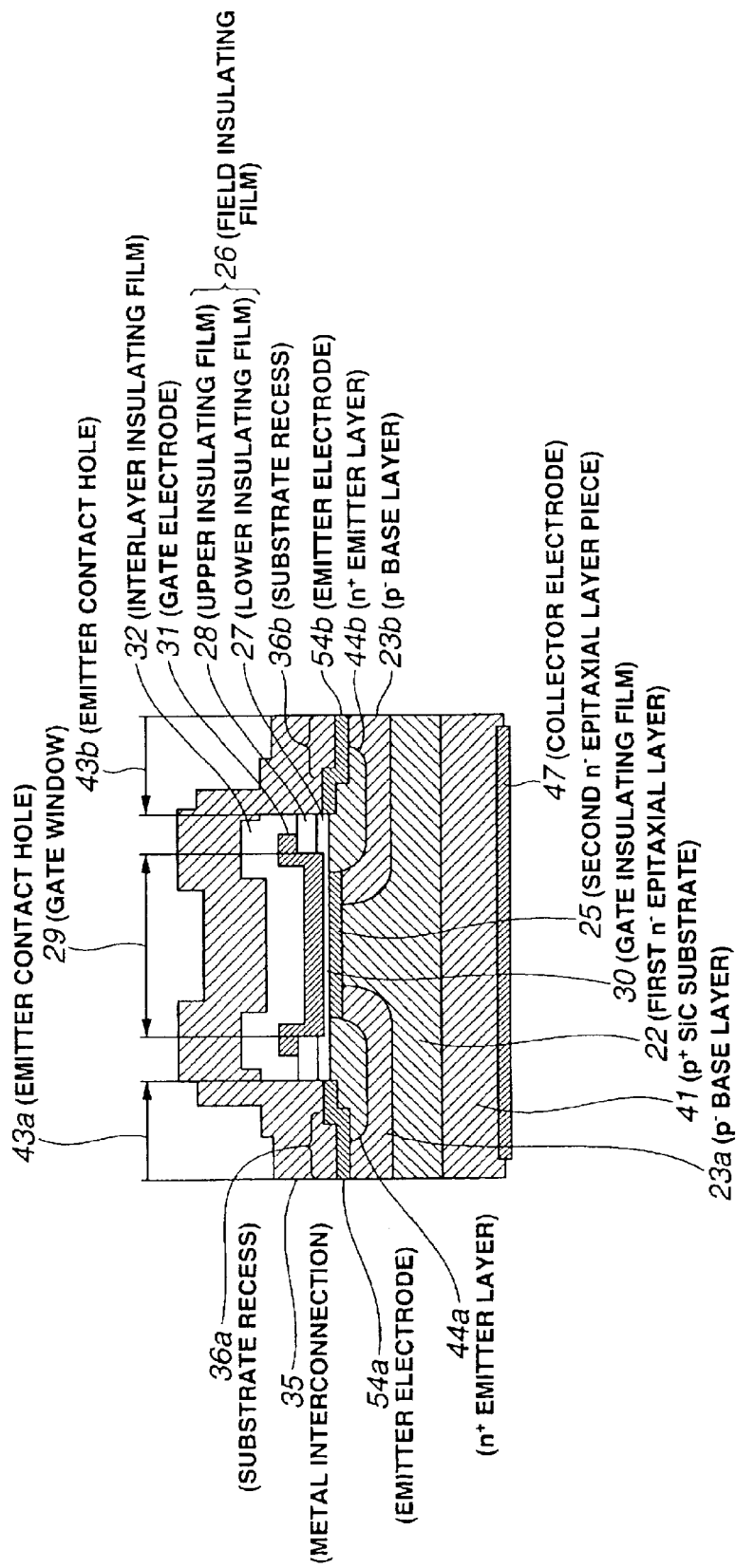
FIG. 14 is a cross sectional view of an essential part of an IGBT (Insulated Gate Bipolar Transistor) of the silicon carbide semiconductor device in a third preferred embodiment according to the present invention.

FIG. 14 is a sectional view of the essential portion of a planar power IGBT. The structure of the IGBT closely resembles that of the planar power MOSFET (FIG. 9) described before, but the close resemblance is not incidental. The reason therefor is that the IGBT is a composite device which consists of a MOSFET and a bipolar transistor, and which, from the viewpoint of technological history, has been invented aiming at abrupt decrease in the resistance component of first n⁻ epitaxial layer 22 in such a way that a conductivity modulation effect is induced by replacing drain side n⁺ substrate 21 of the n-channel MOSFET with a p⁺ substrate 41.

Referring to FIG. 14, numeral 41 designates the p⁺ SiC substrate of low resistance, and a first n⁻ epitaxial layer 22 having a thickness of 10 μm and doped with nitrogen at $4×10^{15}/cm^3$ is homo-epitaxially grown on the front surface (upper principal surface in the figure) of p⁺ SiC substrate 41. p⁺ SiC substrate 41 is doped with Al as a p-type impurity at a concentration of or above $1×10^{19}/cm^3$, and it may be a substrate of any of all crystal systems such as 4H, 6H, 3C and 15R (letter H signifies a hexagonal system, letter C a cubic system, and letter R a rhombohedral system). Besides, p⁻ base regions 23a and 23b each of which has a predetermined depth and is slightly doped with a p-type impurity are spacedly formed in predetermined regions in the front surface layer portion of n⁻ epitaxial layer 22. Also, n⁺ emitter layers 44a, 44b shallower than p⁻ base regions 23a, 23b are formed in predetermined regions in the front surface layer portions of the p⁻ base regions 23a, 23b, respectively. Further, a second n⁻ epitaxial layer piece 25 is extended in the front surface layers of first n⁻ epitaxial layer 22 and p⁻ base regions 23a, 23b so as to lie in contact with both n⁺ emitter layers 44a and 44b. Second n⁻ epitaxial layer piece 25 functions as a channel forming layer in the front surface of a device during an operation of the device. The impurity concentration of n⁻ epitaxial layer piece 25 shall be a low concentration between $1×10^{15}/cm^3$ and $1×10^{17}/cm^3$, and shall not be higher than the impurity concentration of p⁻ base regions 23a, 23b. Besides, substrate recesses 36a, 36b are respectively formed in the upper parts of p⁻ base regions 23a, 23b and n⁺ emitter layers 44a, 44b.

A field insulating film 26 whose thickness is several hundred nm or more is formed on p⁻ base regions 23a, 23b and n⁺ emitter layers 44a, 44b except second n⁻ epitaxial layer piece 25 and the outer peripheral edge thereof. Field insulating film 26 has such a structure that a thick upper insulating film 28 which is formed by any expedient (for example, reduced-pressure CVD) other than the thermal oxidization of SiC is stacked on a thin lower insulating film 27 which is formed by the thermal oxidization of the front surface of p⁺ SiC substrate 41 (exactly, n⁻ epitaxial layer 22).

Besides, numeral 29 designates a gate window which is provided in field insulating film 26, and numeral 30 a gate insulating film which is formed at the bottom of gate window 29. Gate insulating film 30 needs to be a film which is annealed in such a way that it is directly exposed to an oxidizing gas containing oxygen atoms, during or after the formation thereof. Gate insulating film 30 is overlaid with a gate electrode 31 of polycrystalline silicon which is arranged so as to completely cover gate window 29 and to partly stretch on field insulating film 26. An interlayer insulating film 32 is formed on gate electrode 31 and field insulating film 26.

Signs 43a, 43b denote emitter contact holes which are provided in field insulating film 26 and interlayer insulating film 32, and which penetrate to emitter/base regions. Emitter electrodes 54a, 54b exist at the bottoms of emitter contact windows 43a, 43b. Emitter electrodes 54a, 54b are formed in such a way that, after a contact metal such as Ni is deposited, it is alloyed with SiC by rapid thermal annealing.

Besides, numeral 35 designates a metal interconnection, which connects emitter electrodes 54a, 54b to another circuit element on the identical substrate or to an external circuit through emitter contact windows 43a, 43b.

Incidentally, although no illustration is made in the figure, gate electrode contact holes are provided in those parts of interlayer insulating film 32 which overlie the stretching parts of gate electrode 31, and contact electrodes which are formed of Ni alloyed with the polycrystalline silicon are also disposed on those parts of gate electrode 31 which correspond to the bottoms of the gate electrode contact holes. Besides, a second metal interconnection (not shown) which serves to connect gate electrode 31 to another circuit element on the identical substrate or to an external circuit through the contact electrodes and the gate electrode contact holes, is placed on interlayer insulating film 32.

Meanwhile, a portion 47 on the rear surface of p⁺ SiC substrate 41 is a collector electrode which is arranged on substantially the whole area of the rear surface except the peripheral edge of the substrate. Collector electrode 47 is formed in such a way that, after a contact metal layer such as of Ti/Al in which Ti and Al are respectively stacked to thicknesses of 80 nm and 380 nm in the order mentioned is evaporated onto the rear substrate surface, it is alloyed with p⁺ SiC substrate 41 by rapid thermal annealing.

The structure of the IGBT seems to somewhat differ from that of the MOSFET in FIG. 9. Essentially different, however, are only the two points that SiC substrate 41 is the p⁺ substrate, and that the material of collector electrode 47 on the rear substrate surface is the Ti/Al layer which is easy of attaining ohmic contact with the p-type substrate. Incidentally, emitter contact holes 43a, 43b, emitter layers 44a, 44b and emitter electrodes 54a, 54b are named merely for convenience' sake here because the IGBT is a bipolar device, and they are the same constituents as source contact holes 33a, 33b, source layers 24a, 24b and source electrodes 34a, 34b, respectively.

Next, a method of manufacturing the planar power IGBT shown in FIG. 14 will be described with reference to FIGS. 15A, 15G, and 15H and FIGS. 16I and 16J.

Figure 15A:
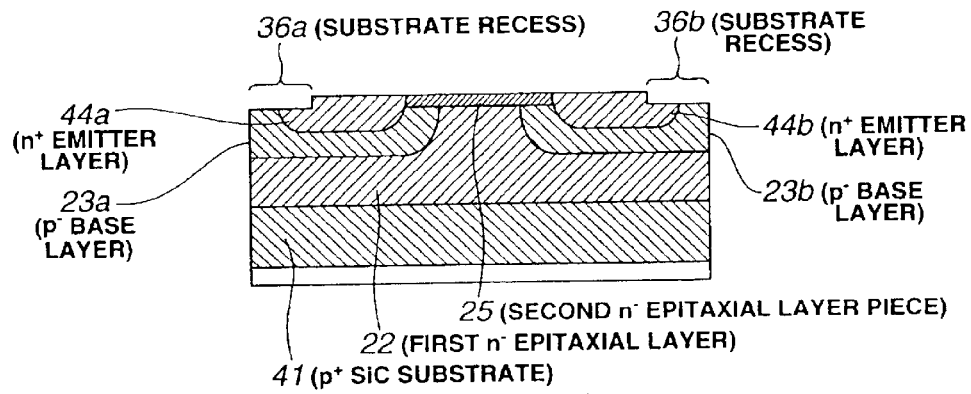
FIGS. 15A, 15G, and 15H are cross sectional views representing parts of the manufacturing process of the IGBT in the third embodiment according to the present invention.

First, referring to FIG. 15A, a p⁺ SiC substrate 41 is formed with a first n⁻ epitaxial layer 22, p⁻ base regions 23a and 23b, n⁺ emitter layers 44a and 44b, a second n⁻ epitaxial layer piece 25, and substrate recesses 36a and 36b. Here, it needs to be noted that the conductivity type of SiC substrate 41 is p⁺. Besides, epitaxial layers of porr quality on the rear surface of p⁺ SiC substrate 41 as are respectively formed simultaneously with the growth of the first and second n⁻ epitaxial layers are eliminated by the steps explained in the first embodiment. Incidentally, in the ensuing description, the "substrate" shall signify p⁺ SiC substrate 41 formed with epitaxial layer 22 or any other film or an electrode unless otherwise specified.

Figure 15G:
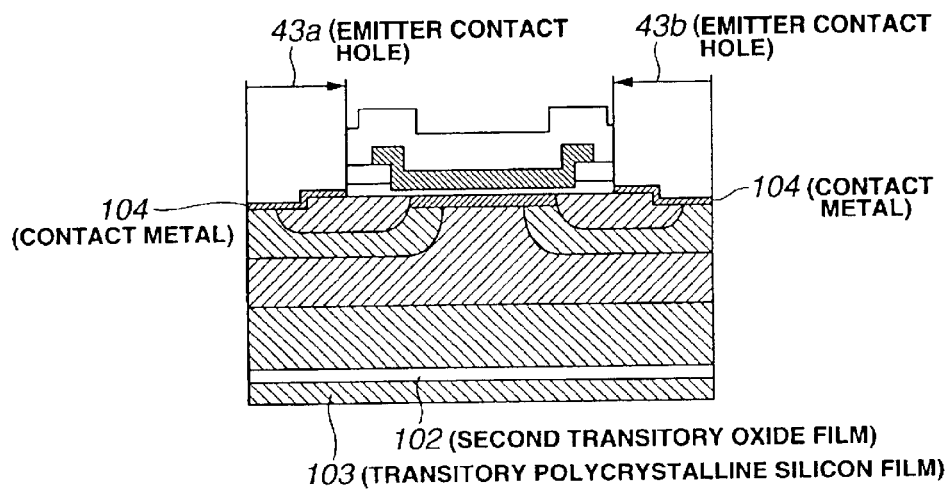

Next, quite the same manufacturing steps as described with reference to FIG. 10B through FIG. 12G in the second embodiment are carried out, thereby to finish a substrate structure in which contact metal (Ni) 104 is left behind at only the bottoms of emitter openings 43a, 43b and gate electrode contact holes (not shown). This state is shown in FIG. 15G.

Figure 15H:
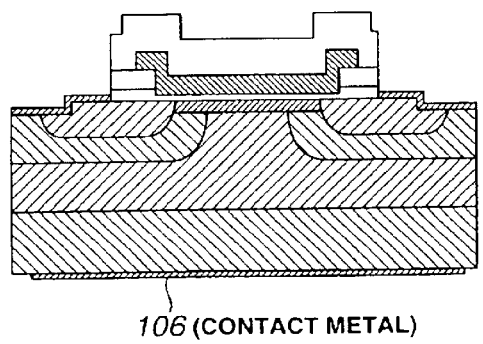

Next, referring to FIG. 15H, the substrate is sufficiently washed and dried. Thereafter, the whole front surface is coated with a protective resist material (which may be a photoresist) having a thickness of at least 1 $\mu$m, and the substrate is once immersed in a buffered hydrofluoric acid solution, thereby to eliminate an $SiO_2$ film formed on transitory polycrystalline silicon film 103 on the rear substrate side part. Next, transitory polycrystalline silicon film 103 on the rear substrate side is completely eliminated by dry etching which employs $CF_4$ and $O_2$. Incidentally, the surface protection step employing the resist is indispensable for preventing contact metal 104 and gate insulating film 30 from deteriorating due to plasma damages and charging which might occur during the dry etching.

Next, the substrate is immersed in a buffered hydrofluoric acid solution, thereby to remove second transitory thermal oxide film 102 having been formed inside transitory polycrystalline silicon film 103 and to denude a clean crystal surface on the rear surface of p⁺ SiC substrate 41. Besides, the buffered hydrofluoric acid solution is completely washed away with ultra-deiobized water, and the substrate is dried. Then, the dried substrate is promptly set into an evaporation apparatus whose interior is kept at a high degree of vacuum, and a desired rear contact metal 106 is evaporated onto the rear substrate surface. The material of the rear contact metal (rear surface electrode) is, for example, a Ti/Al film in which Ti and Al are respectively stacked to thicknesses of 80 nm and 380 nm in the order mentioned. By the way, in a case where the electrode material is apprehended to adhere onto the side surfaces of the substrate, the evaporation is performed in a state where the outer peripheral edge of the substrate is hidden using a shadow mask. FIG. 15H shows an example in which the rear surface electrode has been evaporated using the shadow mask. When contact metal 106 is not apprehended to adhere onto the side walls of the substrate, it may well be disposed on the whole rear surface.

Figure 16I:
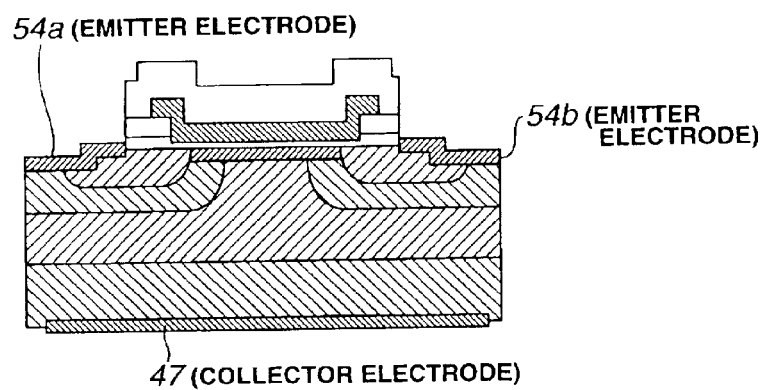
FIGS. 16I and 16J are cross sectional views representing other parts of the manufacturing process of the IGBT in the third embodiment shown in FIG. 14.

Next, referring to FIG. 16I, the resist used for the surface protection is completely stripped off with the dedicated stripper solution of the resist, and the substrate is sufficiently washed and then dried. The dried substrate is immediately set into a rapid thermal annealing apparatus, and is subjected to rapid thermal annealing (contact annealing) at 1000° C. in an atmosphere of high-purity Ar for 2 minutes. Owing to the annealing, the contact metal (Ni film) portions 104 at the bottoms of emitter openings 43a, 43b and the gate electrode openings (not shown) are respectively alloyed with the SiC of the n⁺ emitter layers and the n⁺ polycrystalline silicon, thereby to form emitter electrodes 54a, 54b and gate electrode contacts (not shown) exhibiting very low resistances. Simultaneously, the contact metal (Ti/Al film) 106 on the rear surface of the substrate is alloyed with the rear surface of p⁺ SiC substrate 41, thereby to form a collector electrode 47 exhibiting a very low resistance. On this occasion, the whole structure of the gate electrode—gate insulating film— semiconductor SiC (MOS) in which gate insulating film 30 is entirely covered with polycrystalline-silicon gate electrode 31 is heated at the same time.

Figure 16J:
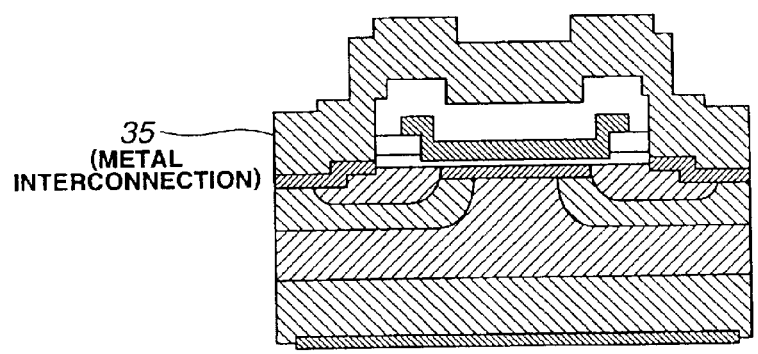

Next, referring to FIG. 16J, the substrate subjected to the contact annealing is promptly set into a magnetron sputtering apparatus whose interior is kept at a high degree of vacuum, and a desired metal interconnection material, for example, Al is evaporated to a thickness of 1 $\mu$m onto the whole upper surface of the substrate formed with interlayer insulating film 32 and emitter contact holes 43a, 43b.

Thereafter, the front surface of the substrate formed with the Al film is coated with a photoresist and is exposed and developed, so as to form a resist mask for etching. Further, the rear substrate surface is coated with the photoresist for rear surface electrode protection, and the resist is sufficiently dried. Next, the Al film is patterned with an etching solution of phosphoric acid type, thereby to form a metal interconnection 35. The resist on the rear surface is formed in order to prevent collector electrode 47 from dissolving in the phosphoric acid type etching solution and from disappearing or changing in quality. This resist, however, can be dispensed with in a case where collector electrode 47 is not apprehended to dissolve or where the Al film is etched by RIE (dry).

At the last stage, the resist mask and the protective resist used for the collector electrode protection are completely removed by the dedicated stripper solution thereof, and the substrate is sufficiently washed and then dried. Thus, the planar power IGBT of the silicon carbide semiconductor device according to the present invention as shown in FIG. 14 is finished up.

Also in this embodiment, the same advantages as in the case of the first and second embodiments are brought forth as is supposed from the same basic structures.

(Fourth Embodiment)

Now, the fourth embodiment of the silicon carbide semiconductor device and its manufacturing method according to the present invention will be described by mentioning as an example a case where the present invention is applicable to a MOS capacitor which is the simplest MOS element. The MOS capacitor is used as a variable capacitance element or the like in an SiC integrated circuit.

Figure 17:
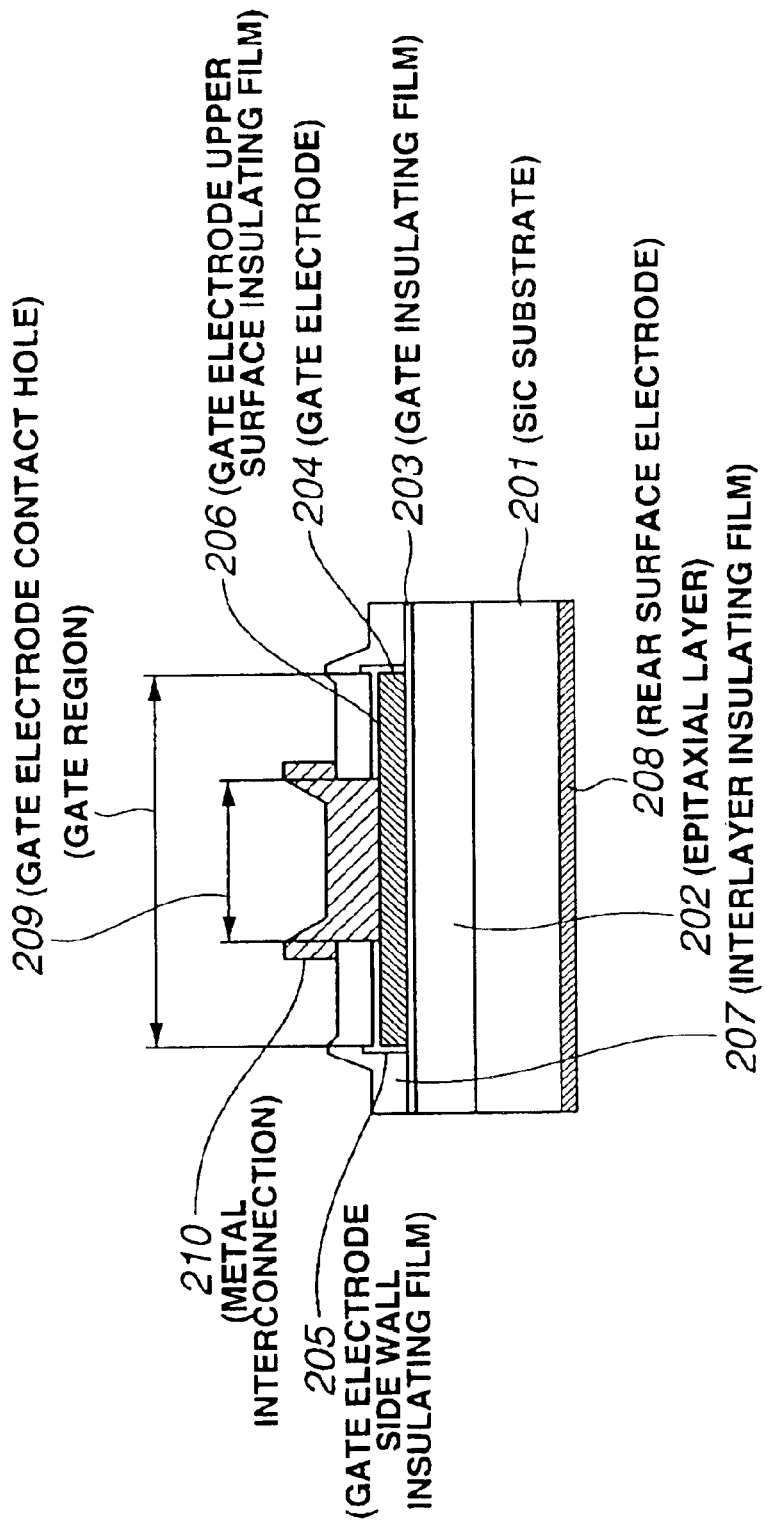
FIG. 17 is a cross sectional view of an essential part of the MOS capacitor of the silicon carbide semiconductor device in a fourth preferred embodiment according to the present invention.

FIG. 17 is a sectional view of an essential portion of the MOS capacitor to which the present invention is applicable. Referring to FIG. 17, numeral 201 designates a singlecrystalline silicon carbide substrate (hereinbelow, abbreviated to "SiC substrate") of n-type at a high impurity concentration (nitrogen>$1\times10^{19}$/cm³), and an n⁻ epitaxial layer 202 having a thickness of 10 $\mu$m and doped with nitrogen at $4\times10^{15}$/cm³ is homo-epitaxially grown on the front surface of SiC substrate 201. A substrate of any of all crystal systems such as 4H, 6H, 3C and 15R (letter H signifies a hexagonal system, letter C a cubic system, and letter R a rhombohedral system) can be employed as SiC substrate 201. Here, signs n⁻ and n⁺ shall be used to signify dopings with an n-type impurity at a low concentration and a high concentration, respectively. In case of dopings with a p-type impurity, signs p⁻ and p⁺ shall be similarly used.

Epitaxial layer 202 is overlaid with a gate insulating film 203 of desired thickness (for example, 40 nm). Gate insulating film 203 needs to be a film which is annealed by being directly exposed to a gas containing oxygen atoms, during or after the formation of the film. A gate electrode 204 of polycrystalline silicon having a desired shape and area is disposed on gate insulating film 203. The side surfaces and upper surface of gate electrode 204 are respectively formed with a gate-electrode side-wall insulating film 205 and a gate-electrode upper-surface insulating film 206 which are formed by thermally oxidizing polycrystalline silicon gate electrode 204. An interlayer insulating film 207 is formed on gate insulating film 203 and gate electrode side wall insulating film 205 as well as gate electrode upper surface insulating film 206. Incidentally, although the whole insulating film formed on epitaxial layer 202 is called the "gate insulating film 203" in the above, a part which really operates as a gate insulating film is only that part of gate insulating film 203 which lies in a gate region underneath gate electrode 204.

Shown at numeral 208 is a rear surface electrode, which is an ohmic electrode arranged on the whole area of the rear surface of SiC substrate 201. Rear surface electrode 208 is formed in such a way that, after a contact metal such as Ni or Co is evaporated onto the rear surface of SiC substrate 201, it is alloyed with SiC substrate 201 by rapid thermal annealing at a temperature which is lower than one for forming gate insulating film 203.

Numeral 209 designates a gate electrode contact hole which is provided in interlayer insulating film 207. Numeral 210 designates a metal interconnection which serves to connect gate electrode 204 to another circuit element on the identical substrate or to an external circuit, and which can be made of a material such as Al or an Al—Si eutectic.

Next, a method of manufacturing the MOS capacitor shown in FIG. 17 will be described. FIGS. 18A, 18B, 18C, and 18D and FIGS. 19E, 19F, 19G are sectional views showing the method of manufacturing the MOS capacitor shown in FIG. 17.

Figure 18A:
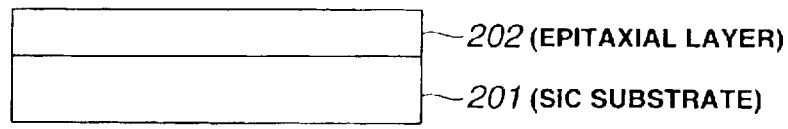
FIGS. 18A, 18B, 18C, and 18D are cross sectional views representing parts of the manufacturing process of the MOS capacitor in the fourth embodiment shown in FIG. 17.

First, referring to FIG. 18A, on the front surface (herein, Si termination surface) of a (0001)-face 8°OFF high-concentration n-type 4H—SiC substrate 201 which is doped with nitrogen forming donor atoms, at or above $1 \times 10^{19}/cm^3$, a high-quality homo-epitaxial layer 202 in the order of $10^{15}/cm^3$ is grown to a predetermined thickness (here, 10 $\mu$m by way of example) by CVD (chemical vapor deposition) which employs silane and propane as raw materials. After the growth, a homo-epitaxial film of low quality having adhered to the rear surface (here, C termination surface) of SiC substrate 201 is removed by mechanical polishing. In the polishing, it is important to protect the front surface of epitaxial layer 202 with, e. g., a CVD-SiO$_2$ film being thick (having a thickness of at least 1 $\mu$m), lest cracks forming a factor for the deterioration of the electric characteristics of a gate insulating film 203 should appear in epitaxial layer 202. After the polishing of the rear surface, the front protective film is removed with a removing solution suited to its material, such as a buffered hydrofluoric acid solution. It is noted that, in the ensuing description, the "substrate" shall signify SiC substrate 201 formed with epitaxial layer 202 or any other film or an electrode unless otherwise specified.

Next, the substrate is sufficiently washed by RCA cleaning (a traditional cleaning method for a semiconductor substrate, which is implemented by combining H$_2$O$_2$+ NH$_4$OH mixed solution SC-1 and H$_2$O$_2$+HCl mixed solution SC-2) or the like. Thereafter, the substrate is thermally oxidized in a dry oxygen atmosphere to grow thermal oxide films on the front surface of epitaxial layer 202 and the rear surface of the substrate, it is immediately immersed in a buffered hydrofluoric acid solution so as to remove the grown thermal oxide films, and it is dried after the buffered hydrofluoric acid solution has been sufficiently washed with ultra-deionized water. On this occasion, oxidization conditions are set so that the thin oxide film may be grown on the front surface of epitaxial layer 202. The thickness of the thermal oxide film should desirably be less than 50 nm, preferably be 5 t6 20 nm. In a case where the thermal oxide film is thinner than 5 nm, there is the problem that the effect of eliminating the contamination layer or damage layer of the front surface of the substrate is slight, and in a case where it is thicker than 50 nm, there is the problem that the front substrate surface is gradually roughened by excessive oxidization. It is accordingly unfavorable that the film is too thick or too thin.

As stated above, the contamination layer and crystalline defective layer of the front layer of the singlecrystalline SiC substrate are eliminated at a stage before the formation of the gate oxide film, whereby the probability lowers at which latent defects will be incorporated into the gate insulating film to be formed by thermal oxidization later. It is therefore possible to effectively relieve the deterioration of the gate insulating film as is induced by a mechanism in which the latent defects are actualized by high-temperature annealing including rapid thermal annealing, that is, the problems (1) that the breakdown voltage of the gate insulating film lowers, and (2) that the leakage current thereof increases.

Besides, the thermal oxide film on the rear surface as is formed at the above-described thermal oxidization is not insignificant, but it has the function of effectively eliminating any considerably deep damage layer at the rear substrate surface as has been incurred by the polishing of the rear substrate surface at the step shown in FIG. 18A. Literature has reported that oxidization proceeds at the C terminated surface (rear surface) of a 6H-SiC substrate at a rate which is about 10 times higher than at the Si terminated surface thereof.

Figure 18B:
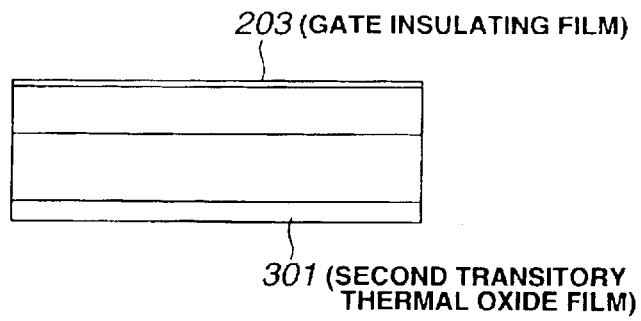

Next, referring to FIG. 18B, the dried substrate is immediately subjected to thermal oxidization, thereby to grow gate insulating film 203 of desired thickness (here, 40 nm by way of example) on the front surface of epitaxial layer 202. Regarding the conditions of the gate oxidization, dry oxidization at a temperature of 1100° C., for example, is recommended though not restrictive. The important point of this step to be noted for realizing the gate insulating film which can endure rapid thermal annealing such as contact annealing is that the temperature of the thermal oxidization is set higher than any annealing temperature at all the subsequent steps. In this embodiment, the oxidization temperature of 1100° C. has been selected because rapid thermal annealing at 1000° C. is performed later in order to realize the low-resistivity ohmic contact of a rear surface electrode. Incidentally, when it is desired to form a gate insulating film of or above 50 nm at which the front surface of the substrate roughens conspicuously, the desired thickness is attained by overlaying a thermal oxide film of SiC with an insulating film formed by another expedient for film formation (for example, CVD-SiO$_2$ film).

Besides, numeral 301 in FIG. 18B designates a transitory thermal oxide film being comparatively thick, which is automatically formed on the rear substrate surface during the formation of the gate insulating film based on the thermal oxidization. Transitory thermal oxide film 301 has the effect of eliminating a polishing damage layer similarly to the transitory thermal oxide film stated before, and also has the important function of protecting the rear substrate surface from damages ascribable to dry etching for the removal of polycrystalline silicon on the rear surface as will be explained at the subsequent step in FIG. 18C. Without the protection by the oxide film, there occurs the problem that the crystallinity of the rear substrate surface is disordered to increase the contact resistance or degrade the surface flatness of the rear surface electrode 208 which is formed at a step in FIG. 19E.

Figure 18C:
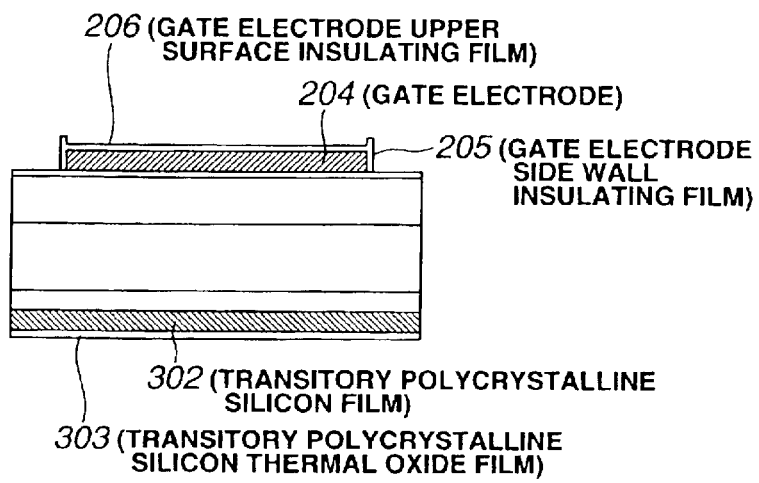

Next, referring to FIG. 18C, immediately after the step of FIG. 18B, polycrystalline silicon films each being 300–400 nm thick are formed on the whole front and rear substrate surfaces by reduced-pressure CVD (growth temperature: 600 to 700° C.) employing a raw material of silane. Thereafter, the polycrystalline silicon films are doped with an impurity P till degeneracy by well-known thermal diffusion (treatment temperature: 900 to 950° C.) employing phosphorus chlorate ($POCl_3$) and oxygen, so as to afford a conductivity type. Next, the front substrate surface is coated with a photoresist, and the unnecessary part of the polycrystalline silicon film on the front substrate side is removed by employing photolithography, and reactive ion etching (RIE) whose etchants are $C_2F_6$ and oxygen. Thus, a gate electrode 204 is formed. Incidentally, a polycrystalline silicon film 302 formed on the rear substrate side is a transitory conductor film which is removed at a later step.

Next, a resist mask used by the RIE is completely removed. Thereafter, the substrate is sufficiently washed by the RCA cleaning stated above, and it is sufficiently washed with ultra-deionized water and then dried. Further, the substrate is thermally oxidized in a dry oxygen atmosphere at 900° C., whereby a gate-electrode side-wall insulating film 205 being 50 nm to 100 nm thick is grown on the side walls of the gate electrode of polycrystalline silicon. On this occasion, a gate-electrode upper-surface insulating film 206 is simultaneously formed on the upper surface of the gate electrode, and a transitory polycrystalline-silicon thermal oxide film 303 on the outer side of transitory polycrystalline silicon film 302 on the rear surface of the substrate. Incidentally, gate electrode 204 is oxidized simultaneously from its top surface and from its side walls, and the side walls are oxidized at a faster rate. As a result, gate electrode side wall insulating film 205 becomes a structure in which it protrudes somewhat upwards beyond the upper surface of the gate electrode as shown in FIG. 18C.

When gate electrode 204 is formed by dry etching such as RIE, gate insulating film 203 in the vicinity of the outer edge of the gate electrode (in a belt-shaped minute region overlaid with the gate electrode and being near to the outer edge of the gate electrode) is deteriorated due to ion bombardment or metallic contamination, and the deterioration forms a factor for increasing the leakage current of gate insulating film 203 or abruptly lowering the breakdown voltage thereof. In the case of the present invention, such a problem has been solved by the above-described thermal oxidization step of the polycrystalline silicon. More specifically, the polycrystalline silicon which lies directly over the belt-shaped region of the gate oxide film having been deteriorated by the ion bombardment or metallic contamination is completely turned into gate electrode side wall insulating film 205 which is a nonconductive oxide ($SiO_2$) film, and gate electrode 203 is not disposed on the deteriorated region. In other words, a structure is established in which, even when a gate voltage is applied, any net electric field does not develop in the deteriorated belt-shaped region of the gate insulating film, whereby gate insulating film 203 is prevented from giving rise to leakage or breakdown with the deteriorated region as a starting point. In this way, the thermal oxidization of the polycrystalline silicon solves the problems of gate insulating film 203 attributed to the gate oxide film deterioration incurred by the dry etching of gate electrode 204; (1) that the breakdown voltage lowers, and (2) that the leakage current increases.

Figure 18D:
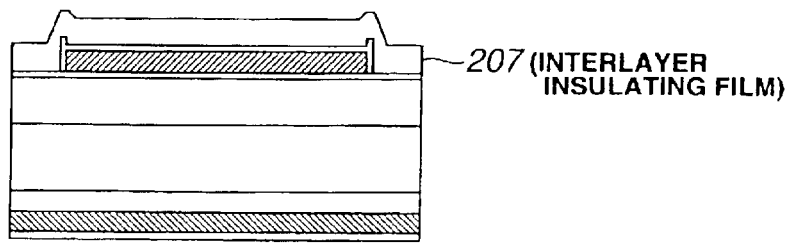

Next, referring to FIG. 18D, an interlayer insulating film 207 is deposited on gate insulating film 203 and polycrystalline silicon gate electrode 204 having thermal oxide films. Suitable as the material of the interlayer insulating film 207 is an $SiO_2$ film being about 1 $\mu$m thick, which is formed by atmospheric-pressure CVD employing silane and oxygen as raw materials, phosphosilicate glass (PSG) which is further doped with phosphorus, or the like. However, the material is not restrictive, but another material such as SiN may well be employed as long as it can endure various succeeding annealing steps. Thereafter, the substrate is put in an ordinary diffusion furnace and is subjected to moderate annealing in an $N_2$ atmosphere for several tens minutes, so as to densify interlayer insulating film 207. An annealing temperature on this occasion is appropriately selected within a range of, for example, 900° C. to 1000° C. so as to be lower than the gate oxidization temperature of 1100° C.

Figure 19E:
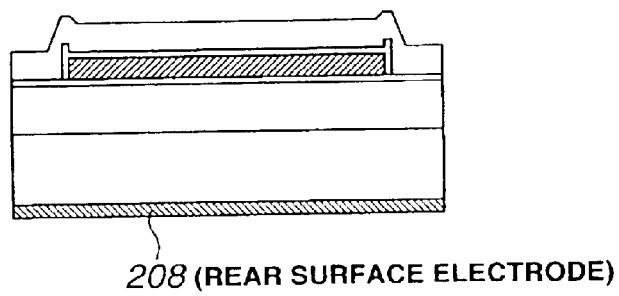
FIGS. 19E, 19F, and 19G are cross sectional views representing other parts of the manufacturing process of the MOS capacitor in the fourth embodiment shown in FIG. 17.

Next, referring to FIG. 19E, the whole front surface of the SiC substrate is coated with a resist material (which may well be a photoresist) having a thickness of at least 1 $\mu$m, so as to protect the front surface, whereupon dry etching whose etchants are $CF_4$ and $O_2$ or the likes is carried out to completely eliminate transitory polycrystalline silicon oxide film 303 and transitory polycrystalline silicon film 302 stacked on the rear surface of the substrate. When the etching has proceeded up to transitory thermal oxide film 301, the treatment is ended. In the dry etching, the substrate is situated in an environment where accelerated ions fly about, so that damages and charging ascribable to ion bombardment are liable to occur. These form causes for the deterioration of the gate insulating film, that is, the problems (1) that the breakdown voltage of the gate insulating film lowers abruptly, and (2) that the leakage current thereof increases. In order to prevent such deterioration, the front surface protection by the resist material is done here. In other words, the front surface resist protection treatment solves the above problems (1) and (2) ascribable to the dry etching of the rear surface. Incidentally, polycrystalline silicon oxide film 303 may well be eliminated by wet etching which employs a buffered hydrofluoric acid solution, not by the dry etching.

Next, the substrate subjected to the dry etching is immersed in a buffered hydrofluoric acid solution so as to completely remove transitory thermal oxide film 301 from the rear surface of the substrate, and the buffered hydrofluoric acid solution is washed away by ultra-deiobized water. That C terminated surface of the rear surface of the SiC substrate which has been denuded in this way, is a clean surface of few damages and little contamination.

As soon as the SiC substrate wet with the ultra-deionized water has been dried, the dried substrate is set in a short time into an evaporation apparatus whose interior is kept at a high degree of vacuum, and a desired rear surface electrode material is evaporated onto the rear substrate surface. By way of example, an Ni film which is 50 nm thick is recommended as the rear surface electrode material. In a case where the electrode material is apprehended to adhere onto the side walls of the SiC substrate, the evaporation is performed in a state where the outer peripheral edge of the substrate is hidden using a shadow mask.

Next, the resist used for the front surface protection is completely stripped off with the dedicated stripper solution of the resist, and the substrate is sufficiently washed and then dried. The dried substrate is immediately set in a rapid thermal annealing apparatus, and is subjected to rear contact annealing at 1000° C. in an atmosphere of 100% high-purity Ar for two minutes. Owing to the annealing, the Ni film is alloyed with the rear substrate surface of low resistance, and rear surface electrode 208 of very low resistance exhibiting a contact resistance in the order of, at the highest, $10^{-6}$ $\Omega cm^2$ can be formed. Incidentally, the temperature of the rear contact annealing is set at a temperature (at least 900° C. in the case of Ni) which is lower than that of the thermal oxidization having formed gate insulating film 203 and which is sufficient for the formation of the ohmic contact between the singlecrystalline silicon carbide and a contact metal (herein, Ni).

A very important point in the above-described contact annealing is that the rapid thermal annealing has been implemented with the structure in which gate insulating film 203 (the gate region part underneath the gate electrode) already formed on this occasion is completely enclosed with gate electrode 204 of the polycrystalline silicon, epitaxial layer 202 of the singlecrystalline SiC substrate, the thermal oxide film of epitaxial layer 202 (the part of gate insulating film 203 outside the gate region, that is to say, the peripheral part of film 203 adjoining the real gate insulating film), and gate electrode side wall insulating film 205 formed of the thermal oxide film of the polycrystalline silicon.

Figure 19F:
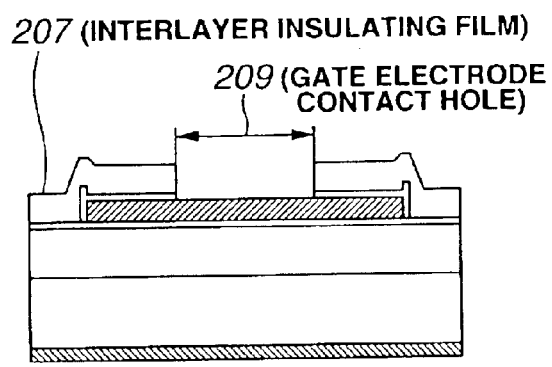

Next, referring to FIG. 19F, the upper substrate surface is coated with a photoresist and is exposed and developed by an exposure apparatus, thereby to form a resist mask on the upper surface of the interlayer insulating film 207. Furthermore, the rear substrate surface is coated with the resist for protection, which is then sufficiently dried. Thereafter, a gate electrode contact hole 209 is provided in interlayer insulating film 207 by etching with a buffered hydrofluoric acid solution. The resist on the rear surface fulfills the function that the ohmic electrode is prevented from dissolving in the buffered hydrofluoric acid solution and from disappearing or changing in quality, or that the electrode material having dissolved or exfoliated from the rear surface is prevented from adhering onto the front surface.

When the etching has ended, the resist used for the resist mask and the rear surface electrode protection is completely peeled off with the dedicated stripper solution of the resist, and the substrate is sufficiently washed and then dried.

Figure 19G:
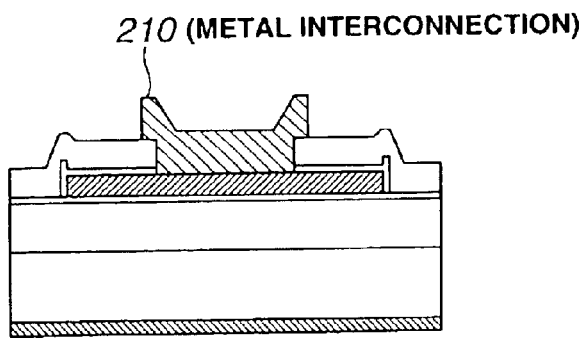

Next, referring to FIG. 19G, the dried substrate is immediately set in a magnetron sputtering apparatus whose interior is kept at a high degree of vacuum, and a desired metal interconnection material, for example, an Al film being 1 μm thick, is evaporated onto the whole upper surface of interlayer insulating film 207 of the substrate. Thereafter, the front surface of the substrate formed with the Al film is coated with a photoresist and is exposed and developed, so as to form a resist mask for etching. Furthermore, the rear substrate surface is coated again with the photoresist for rear surface electrode protection, and the resist is sufficiently dried. Next, the Al film is patterned with an etching solution of phosphoric acid type, thereby to form a metal interconnection 210.

In addition, the resist on the rear surface is formed in order to prevent rear surface electrode 208 from dissolving in the phosphoric acid type etching solution and from disappearing or changing in quality. This resist, however, can be dispensed with in a case where rear surface electrode 208 is not apprehended to dissolve or where the Al film is etched by RIE (dry).

At the last stage, the resist used for the resist mask and the rear surface electrode protection is completely removed by the dedicated stripper solution thereof, and the substrate is sufficiently washed and then dried. Thus, the MOS capacitor based on the present invention as shown in FIG. 17 is finished up.

As described above, in this embodiment, as a metal electrode (namely, rear surface electrode 208) which is brought into contact with a singlecrystalline silicon carbide substrate, except a gate electrode, there is employed a metal electrode which is subjected to thermal annealing at a temperature (at least 900° C.) that is lower than the temperature of thermal oxidization having formed a gate insulating film 203 and that is sufficient for the contact annealing between singlecrystalline silicon carbide and a metal (Ni), after gate insulating film 203 (the part underneath gate electrode 204) has been entirely enclosed with gate electrode 204, the singlecrystalline silicon carbide substrate (an epitaxial layer 202), the thermal oxide film of the singlecrystalline silicon carbide substrate (the part of gate insulating film 203 outside a gate region, that is to say, the peripheral part of film 203 adjoining the real gate insulating film), and a gate electrode side wall insulating film 205. Owing to such a construction, during the thermal annealing, gate insulating film 203 is surrounded completely in vertical and horizontal directions with polycrystalline silicon, $SiO_2$ and SiC which are thermally stable (which neither react nor diffuse). It is therefore possible to very effectively prevent the drawback that any contaminant or metal substance which has come flying from the inner wall of a rapid thermal annealing apparatus or the contact of the silicon carbide substrate enters into gate insulating film 203 (gate region) due to the high-temperature treatment, and the drawback that, in a case where rapid thermal annealing is carried out in a high degree of vacuum at or above 800° C., the $SiO_2$ gate insulating film 203 is inhomogeneously decomposed to change in quality.

Moreover, since the temperature in the case of forming gate insulating film 203 by thermal oxidization is set higher than the temperature of contact annealing, thermal stress attendant upon expansion/contraction to be developed in gate insulating film 203 by the rapid thermal annealing can effectively be released. As will be detailed with reference to FIGS. 20 and 21, therefore, the advantage is brought forth that the deterioration of the characteristics of gate insulating film 203 attributed to the rapid thermal annealing can be solved.

Besides, since the annealing is carried out at the temperature sufficient for the contact annealing between the singlecrystalline silicon carbide and the metal, the very favorable ohmic contact whose contact resistance exhibits the order of $10^{-6}$ $\Omega cm^2$ or below is attained as the contact between the singlecrystalline silicon carbide and the metal.

Figure 20:
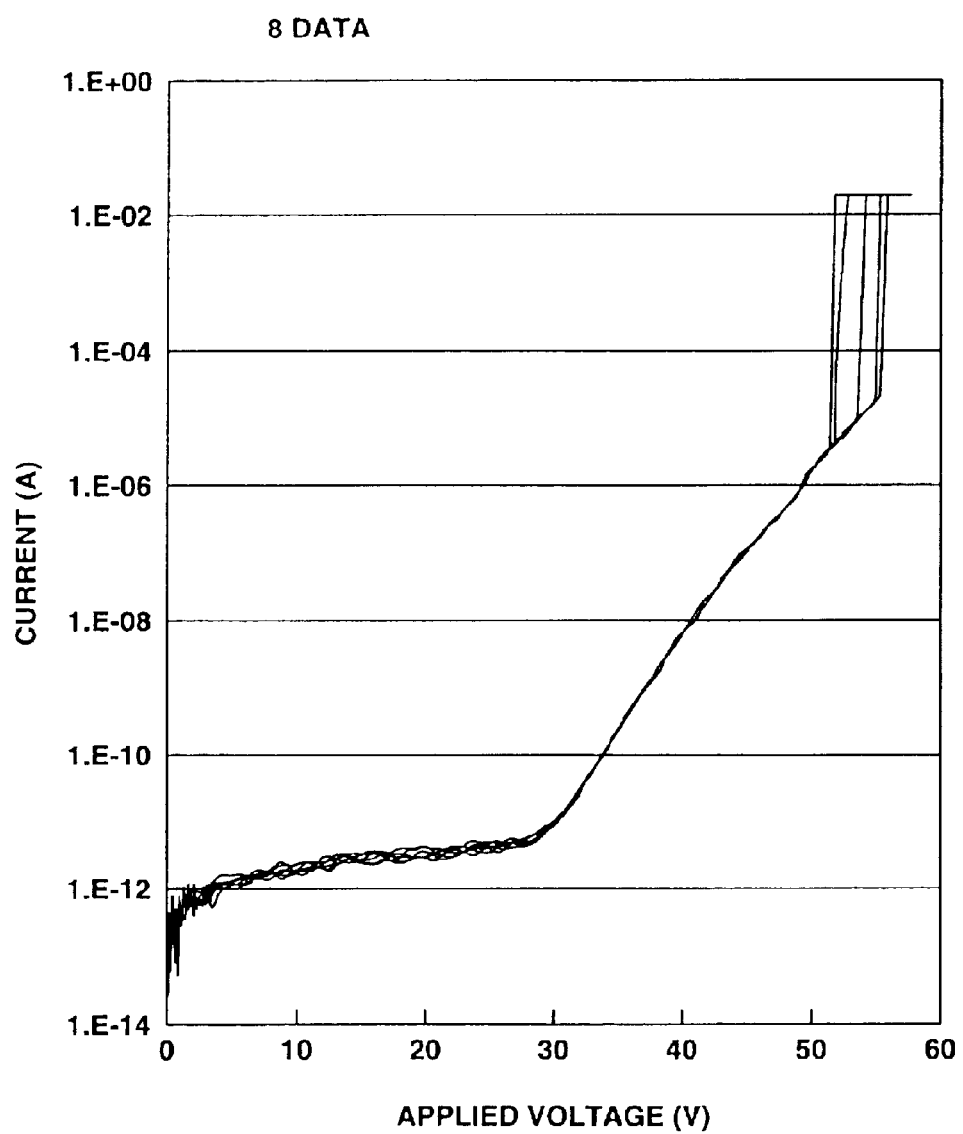
FIG. 20 is a current-voltage characteristic of the MOS capacitor in the fourth embodiment shown in FIG. 17.

FIG. 20 is a diagram showing current-voltage characteristics measured as to arbitrary 8 samples among MOS capacitors thus fabricated. Each of the sample MOS capacitors was such that the area (opening) of the gate electrode was $3.14 \times 10^{-4}$ $cm^2$, and that the thickness of the gate insulating film was 45 nm.

As understood from FIG. 20, the tested MOS capacitors exhibit substantially the same current-voltage characteristics. The current-voltage characteristic is a characteristic intrinsic to a thin oxide film as is known as "Fowler-Nordheim conduction", and leaking conduction suggestive of deterioration is not observed. An excellent value of or above 45 V (10 MV/cm in terms of a field intensity) is given as a breakdown voltage in any of the samples.

Figure 2:
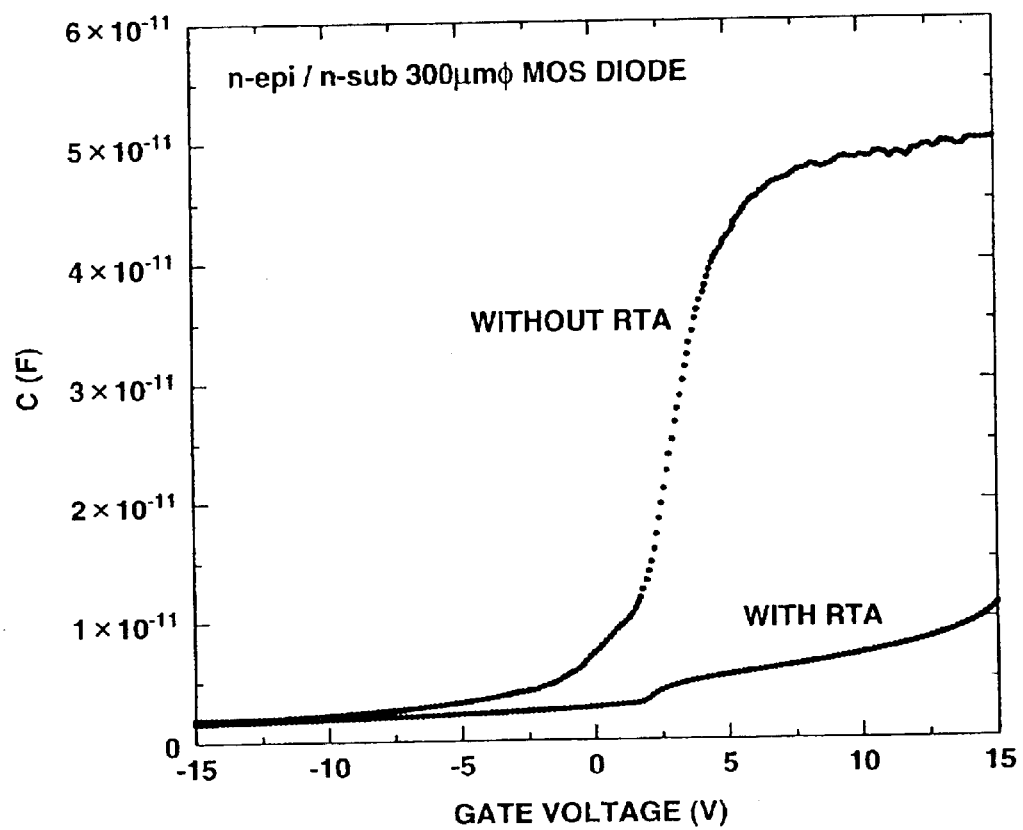
FIG. 2 is a high-frequency capacitance-DC bias voltage characteristic graph of the conventional MOS capacitor.

As understood by comparing the characteristics in FIG. 20 and FIG. 2, the leakage current and breakdown voltage of the gate insulating film of the MOS capacitor based on the present invention are remarkably improved over those of the gate insulating film (with RTA) subjected to the prior-art rapid thermal annealing as shown in FIG. 1A.

Figure 21:
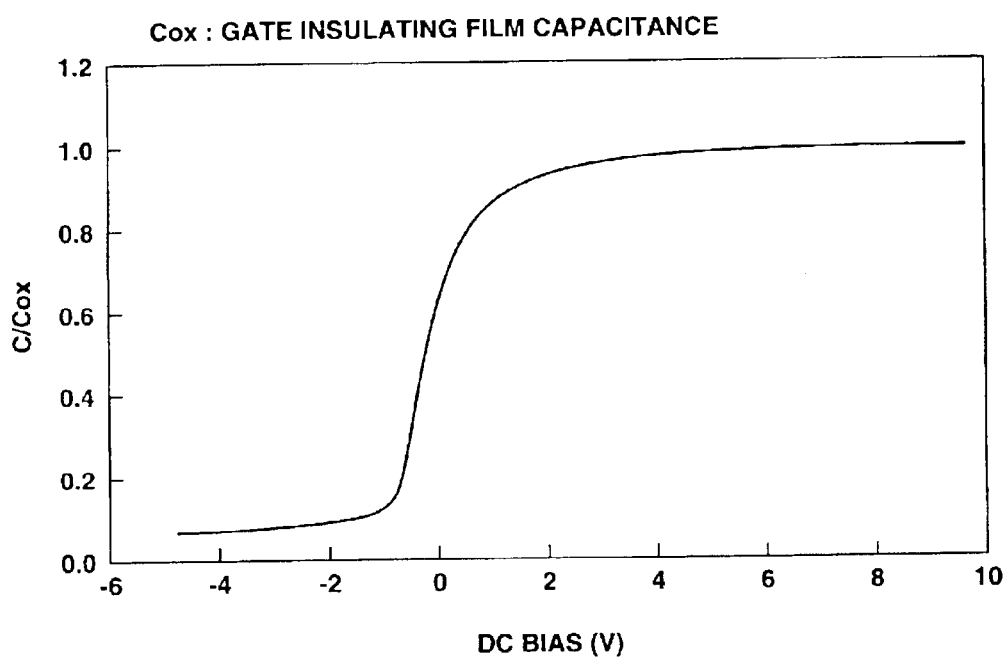
FIG. 21 is a high-frequency capacitance-DC bias voltage characteristic graph of the MOS capacitor in the fourth embodiment shown in FIG. 17.

Besides, FIG. 21 is a high-frequency C-V characteristic diagram of the MOS capacitor according to the present invention. Regarding the prior art shown in FIG. 2, it is pointed out that, as the result of the rapid thermal annealing, a flat-band voltage shifts greatly in a positive direction and becomes at least 15 V. In contrast, it is seen that, in the MOS capacitor subjected to the similar rapid thermal annealing, a flat-band voltage has a value of at most 1 V, which is also decreased much. The lowering (improvement) of the flat-band voltage is a remarkable improvement which corresponds to the decrease of one order in terms of the effective charge density $Q_{eff}$ (/cm$^2$) of an oxide film interface. As apparent from the above description, when the rapid thermal annealing such as contact annealing (for example, at 1000° C. in a vacuum for one minute) is carried out in the prior art, there have been the problems; (1) that the breakdown voltage of the gate insulating film as ought to be about 40 V drops abruptly to at most 5 V being ⅛ (graph in FIG. 1A), (2) that the leakage current of the gate insulating film increases conspicuously (FIG. 1A), and (3) that the flat-band voltage shifts in the positive direction 15 V or more from the vicinity of an ordinary value of zero V (FIG. 2), whereas all the problems have been solved by the present invention.

Besides, in this embodiment, the contact annealing at 1000° C. in the Ar atmosphere for two minutes is added. These thermal annealing conditions and the method of forming the contact afford the optimum manufacturing method for realizing low-resistance ohmic contact with n$^+$ SiC. In this embodiment, accordingly, the ohmic contact of very low resistance is attained at the rear surface of the SiC substrate. In other words, the present invention has solved the above problems (1), (2), and (3) without incurring increase in the contact resistance.

In addition, an important point to be noted is that this embodiment has provided a method for solving the problems (1) to (3) involved, not only in the contact annealing, but also in all the other foregoing thermal steps which the gate insulating film often undergoes in an actual device, for example, the formation of the polycrystalline silicon film, drive-in for doping the polycrystalline silicon film with the phosphorus impurity, the deposition of the interlayer insulating film, and the densifying thermal annealing of the interlayer insulating film.

Furthermore, in view of I-V characteristic in FIG. 1B, it is understood that, with the prior art, the gate insulating films which are not subjected to the rapid thermal annealing have breakdown voltages on the order of, at most, 40 V, and that defective units which break down at low voltages or which exhibit high leakage currents are included in a considerable number. In contrast, the breakdown voltages of the gate insulating films in this embodiment are all as high as 40 V or above, and the best gate insulating film obtained exceeds even 54 V. Besides, all leakage currents are small, and currents exhibit intrinsic conduction till a time immediately before breakdown. In this manner, the silicon carbide semiconductor device and the manufacturing method thereof according to the present invention have the excellent advantages that characteristics which are favorable as compared with those of the gate insulating film in the prior art are exhibited, and that the favorable characteristics can be maintained to the last even when device manufacturing steps which include annealing and dry etching after the formation of the gate insulating film have been undergone.

(Fifth Embodiment)

A fifth embodiment of the silicon carbide semiconductor device and its manufacturing method according to the present invention is found in a case where the present invention is applicable to a MOS capacitor constructed having a field insulating film. This embodiment is common to the fourth embodiment in many points, and it will be briefly described without redundantly repeating the same description of such common points. While the fifth embodiment will now be described with reference to FIGS. 22, 23A, 23B, 23C, 24D, 24E, 24F, 25G, 25H, and 25I, in which constituents assigned the same reference numerals as in the fourth embodiment designate the same portions as in the fourth embodiment unless otherwise specified.

Figure 22:
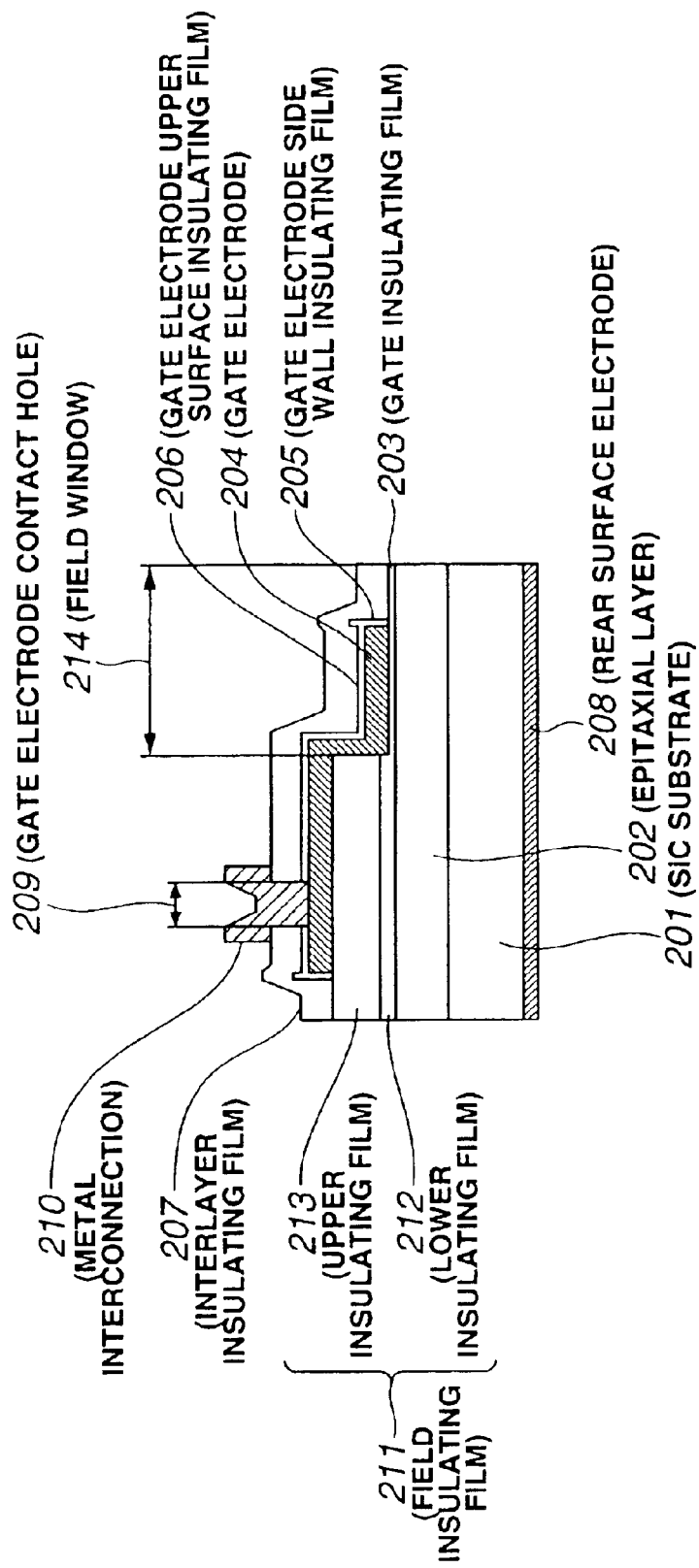
FIG. 22 is a cross sectional view of an essential part of the MOS capacitor in a fifth preferred embodiment according to the present invention.

FIG. 22 is a sectional view of the essential portion of the MOS capacitor having the field insulating film to which the present invention is applicable. Referring to FIG. 22, numeral 201 designates a singlecrystalline silicon carbide substrate (SiC substrate) of n-type at a high impurity concentration (nitrogen>1×10$^{19}$/cm$^3$), and an n$^-$ epitaxial layer 202 having a thickness of 10 μm and doped with nitrogen at 4×10$^{15}$/cm$^3$ is homo-epitaxially grown on the front surface of SiC substrate 201. Epitaxial layer 202 is overlaid with field insulating film 211 whose thickness is several hundred nm or more. Field insulating film 211 has such a structure that a thick upper insulating film 213 which is formed by any expedient (for example, reduced-pressure CVD) other than the thermal oxidization of SiC is stacked on a thin lower insulating film 212 which is formed by the thermal oxidization of, at least, the SiC substrate (exactly, the epitaxial layer). Numeral 214 designates a window which is provided in field insulating film 211, and numeral 203 a gate insulating film which is formed at the bottom of window 214. Gate insulating film 203 needs to be a film which is annealed in such a way that it is directly exposed to a gas containing oxygen atoms, during or after the formation thereof. Gate insulating film 203 and field insulating film 211 are overlaid with a gate electrode 204 of polycrystalline silicon having a predetermined shape and area. The side walls and upper surface of gate electrode 204 are respectively formed with a gate-electrode side-wall insulating film 205 and a gate-electrode upper-surface insulating film 206 which are formed by thermally oxidizing polycrystalline silicon gate electrode 204. An interlayer insulating film 207 is formed on gate insulating film 203, the gate electrode side wall insulating film 205 as well as gate electrode upper surface insulating film 206, and field insulating film 211.

Shown at numeral 208 is a rear surface electrode, which is an ohmic electrode arranged on substantially the whole area of the rear surface of SiC substrate 201. Rear surface electrode 208 is formed in such a way that, after a contact metal such as Ni or Co is evaporated onto the rear surface of SiC substrate 201, it is alloyed with SiC substrate 201 by rapid thermal annealing at a temperature which is lower than one for forming gate insulating film 203.

Numeral 209 designates a gate electrode contact hole which is provided in interlayer insulating film 207, and numeral 210 a metal interconnection which serves to connect gate electrode 204 to another circuit element on the identical substrate or to an external circuit, and which can be made of a material such as Al or an Al—Si eutectic.

Next, a method of manufacturing the MOS capacitor will be described with reference to FIGS. 23A, 23B, 23C, 24D, 24E, 24F, 25G, 25H, and 25I. FIGS. 23A through 23C and FIGS. 25G through 25I are sectional views showing the method of manufacturing the MOS capacitor shown in FIG. 22.

Figure 23A:
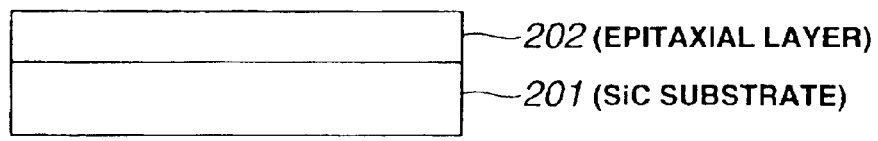
FIGS. 23A, 23B, and 23C are cross sectional views representing parts of the manufacturing process of the MOS capacitor in the fifth embodiment shown in FIG. 22.

First, referring to FIG. 23A, an n-type homo-epitaxial layer 202 (here, 10 μm thick by way of example) having an impurity concentration in the order of $10^{15}/cm^3$ is formed on the upper surface of SiC substrate 201 doped with an n-type impurity at a high concentration, by the method described with reference to FIG. 18A. Thereafter, sacrificial oxidization is similarly performed.

Figure 23B:
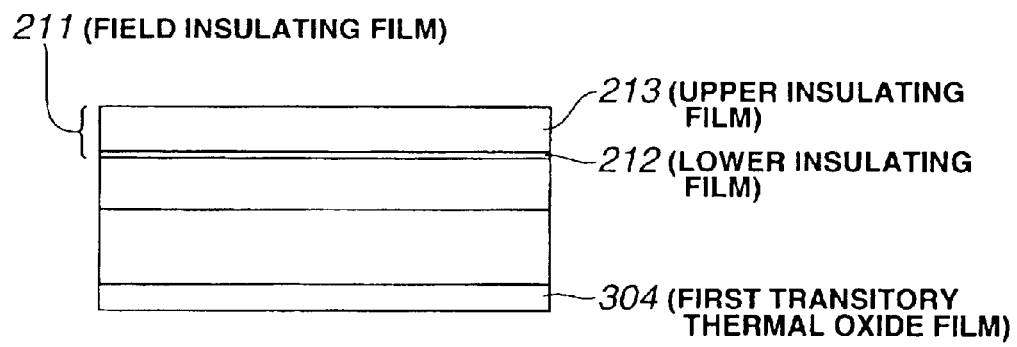

Next, referring to FIG. 23B, the substrate subjected to the above-described sacrificial oxidization is sufficiently washed again by RCA cleaning or the like. Thereafter, a field insulating film 211 which consists of a thin lower insulating film 212 and a thick upper insulating film 213 is formed on the front surface of epitaxial layer 202. It is possible to use as lower insulating film 212 a thermal oxide film of about 10 nm which is formed by dry-oxidizing the front surface of epitaxial layer 202 in an oxygen atmosphere, and as upper insulating film 213 an insulating film of desired thickness which is formed by a method other than thermal oxidization, for example, an $SiO_2$ film being 400 nm thick as is formed by atmospheric-pressure CVD employing oxygen and silane. Incidentally, the thermal oxidization of lower insulating film 212 is not restricted to the dry oxidization, but it may well be wet oxidization or thermal oxidization employing any other oxidative gas. For the same reasons as in the sacrificial oxidization of the step in FIG. 18B, the thickness of lower insulating film 212 should desirably be less than 50 nm, preferably be 5–20 nm. By the way, upper insulating film 213 may be formed after lower insulating film 212 being the thermal oxide film has been grown on the front surface of epitaxial layer 202. Contrariwise, lower insulating film (thermal oxide film) 212 may well be formed between epitaxial layer 202 and upper insulating film 213 by forming upper insulating film 213 and then thermally oxidizing it. The latter processing sequence, however, can be taken only in a case where upper insulating film 213 is an oxygen transmitting film.

Besides, numeral 304 in FIG. 23B designates a second transitory thermal oxide film which is automatically formed on the rear surface of the substrate during the formation of lower insulating film 212. Thermal oxide film 304 has the function of effectively eliminating any polishing damage layer at the rear substrate surface, similarly to a first transitory thermal oxide film 301 in FIG. 24D.

Figure 23C:
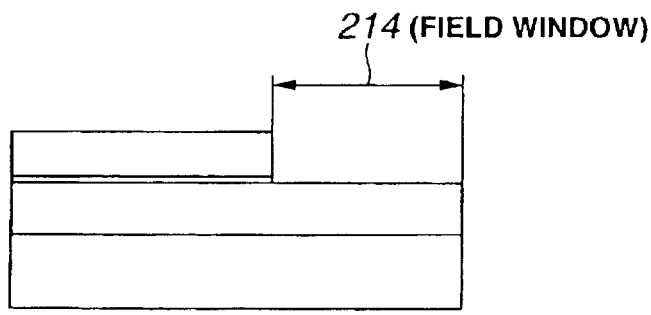

Next, referring to FIG. 23C, the front surface of the substrate is coated with a photoresist, exposed to light and developed, and resultant SiC substrate 201 is immersed in a buffered hydrofluoric acid solution ($NH_4F+HF$ mixed solution) for wet etching, whereby a field window 214 is formed at the predetermined position of field insulating film 211. Second transitory thermal oxide film 304 which has incorporated the damage layer of the rear substrate surface at the step of FIG. 23B, disappears here. In forming minute field window 214, it is possible to use dry etching such as reactive ion etching (RIE) which employs $CF_4$-gas plasma or the like. In this case, however, it is necessary to first perform the dry etching, and to switch it to the wet etching employing the buffered hydrofluoric acid solution, without fail when field insulating film 207 has remained several hundred nm. More specifically, when field window 214 is penetratingly formed by the dry etching down to n-type epitaxial layer 202, the front SiC surface roughens due to plasma damages, or hydrocarbon produced by the dry etching reaction adheres to the bottom of field window 214. This forms a factor for the deterioration of the characteristics of the gate insulating film which is formed at the next step (the problems of items (1), (2) and (3) that the conventional silicon carbide semiconductor has).

When the etching for the field window has been performed as stated above, the photoresist is removed.

Figure 24D:
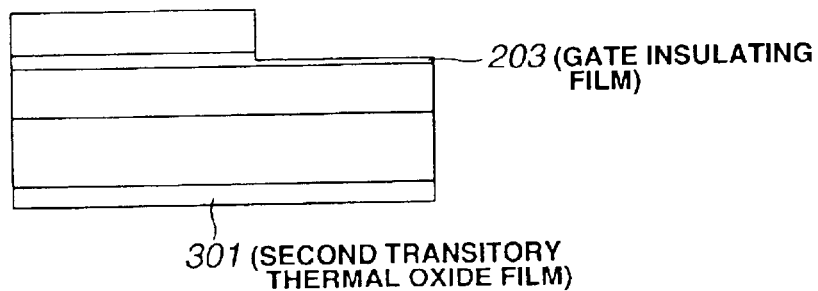
FIGS. 24D, 24E, and 24F are cross sectional views representing other parts of the manufacturing process of the MOS capacitor in the fifth embodiment shown in FIG. 22.

Next, referring to FIG. 24D, the substrate contaminated with resist residue is sufficiently washed again by the RCA cleaning or the like. At the final stage of the washing, the substrate is immersed in a buffered hydrofluoric acid solution for five seconds to ten seconds in order to remove a chemical oxide film produced on the front substrate surface corresponding to field window 214 by the RCA cleaning, and the buffered hydrofluoric acid solution is completely washed away by ultra-deionized water, whereupon the substrate is dried. Since the chemical oxide film is very inferior in quality and is also in homogeneous, it exerts evil influence on the homogeneous growth of the next thermal oxide film. Therefore, the step of removing the chemical oxide film is indispensable.

Next, the dried substrate is immediately subjected to thermal oxidization, whereby gate insulating film 203 of desired thickness (here, 40 nm by way of example) is grown on the front surface of epitaxial layer 202 corresponding to field window 214. Since, on this occasion, the whole substrate is exposed to an oxidizative atmosphere, epitaxial layer 202 underneath field insulating film 211 is somewhat oxidized. Accordingly, the thickness of lower insulating film (thermal oxide film) 212 increases, and transitory thermal oxide film 301 is formed on the rear substrate surface. Regarding the conditions of the thermal oxidization for gate insulating film 203, dry oxidization at a temperature of 1100° C. is recommended by way of example. As described concerning the step of FIG. 18B, it is important that the temperature of the thermal oxidization is set higher than any annealing temperature at all the subsequent steps. When it is desired to form a thick gate insulating film of or above 50 nm whose surface roughens conspicuously with the thermal oxidization, the desired thickness is attained by overlaying a thermal oxide film of SiC thinner than 50 nm, with an insulating film formed by another expedient for film formation (for example, $CVD-SiO_2$ film).

Transitory thermal oxide film 301 on the rear substrate surface has the function of eliminating the polishing damage layer, and the important function of protecting the rear substrate surface from ion damages in the case where polycrystalline silicon film 203 is removed by dry etching at a later step.

Figure 24E:
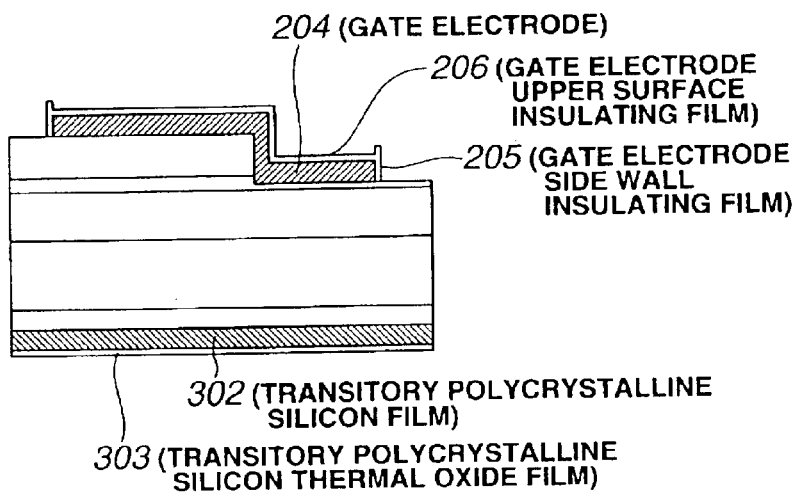

Next, referring to FIG. 24E, immediately after the step of FIG. 24D, polycrystalline silicon films each being 300–400 nm thick are formed on the whole front and rear substrate surfaces by reduced-pressure CVD (growth temperature: 600 to 700° C.) employing a raw material of silane. Thereafter, the polycrystalline silicon films are doped with an impurity P till degeneracy by well-known thermal diffusion (treatment temperature: 900 to 950° C.) employing phosphorus chlorate ($POCl_3$) and oxygen, so as to afford a conductivity type.

Next, as described concerning the step of FIG. 18C, a gate electrode 204 of polycrystalline silicon is formed by photolithography and RIE. Incidentally, a polycrystalline silicon film 302 remaining on the rear substrate side is a transitory conductor film.

Furthermore, a resist mask used in the RIE is completely removed from the substrate, and the substrate is sufficiently washed and then dried. Thereafter, the dried substrate is thermally oxidized in a dry oxygen atmosphere at 900° C., whereby a gate-electrode side-wall insulating film 205 being 50 nm to 100 nm thick is grown on the side walls of polycrystalline silicon gate electrode 204. On this occasion, a gate-electrode upper-surface insulating film 206 is simultaneously formed on the upper surface of gate electrode 204, and a transitory polycrystalline silicon thermal oxide film 303 under transitory polycrystalline silicon film 302 on the rear surface side of the substrate.

As described in the fourth embodiment, the purpose of the formation of gate electrode side wall insulating film 205 is that the polycrystalline silicon which lies directly over a belt-shaped region of the gate insulating film having been deteriorated by ion bombardment or metallic contamination at the formation of the gate electrode by the dry etching is completely turned into a nonconductive oxide (SiO$_2$) film, namely, gate electrode side wall insulating film 205, thereby to establish that outer edge structure of the gate electrode in which any net gate voltage is not applied to the deteriorated region.

Figure 24F:
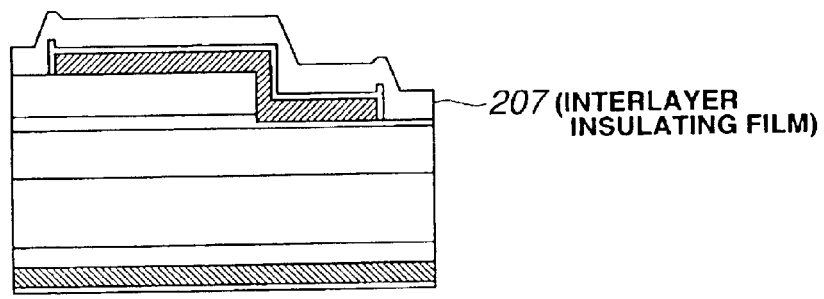

Next, referring to FIG. 24F, an interlayer insulating film 207 is deposited on the whole upper surface of the substrate. Suitable as the material of interlayer insulating film 207 is an SiO$_2$ film being about 1 μm thick, which is formed by normal-pressure CVD, phosphosilicate glass (PSG) which is further doped with phosphorus, or the like. Thereafter, the substrate is put in an ordinary diffusion furnace and is subjected to moderate annealing in an N$_2$ atmosphere for several tens minutes, so as to densify interlayer insulating film 207. An annealing temperature on this occasion is appropriately selected at a temperature lower than the gate oxidization temperature (1100° C.), for example, at 950° C.

Figure 25G:
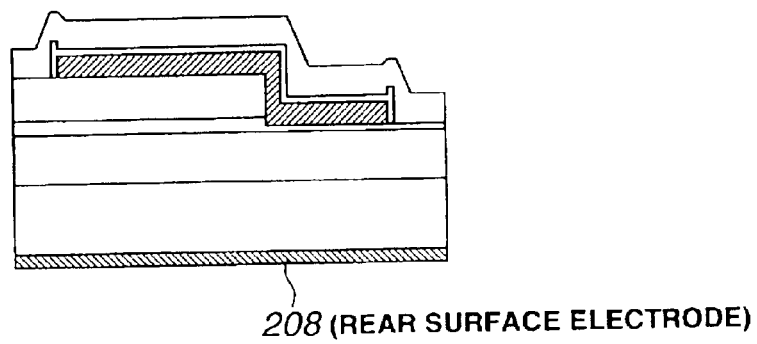
FIGS. 25G, 25H, and 25I are cross sectional views representing other parts of the manufacturing process of the MOS capacitor in the fifth embodiment shown in FIG. 22.

Next, referring to FIG. 25G, as described concerning the step of FIG. 19E, the whole front surface of the SiC substrate is coated with a resist material (which may well be a photoresist) having a thickness of at least 1 μm, so as to protect the front surface, whereupon dry etching whose etchants are CF$_4$ and O$_2$ or the likes, or etching in which wet etching with a buffered hydrofluoric acid solution and dry etching are successively combined is carried out to completely eliminate transitory polycrystalline silicon oxide film 303 and transitory polycrystalline silicon film 302 stacked on the rear surface side of the substrate. When the etching has proceeded up to transitory thermal oxide film 301, the treatment is ended.

Next, the substrate is immersed in a buffered hydrofluoric acid solution so as to completely remove transitory thermal oxide film 301 from the rear surface of the substrate, and the buffered hydrofluoric acid solution is promptly washed away by ultra-deionized water. As soon as the wet SiC substrate has been dried, the dried substrate is set in a short time into an evaporation apparatus whose interior is kept at a high degree of vacuum, and a desired rear surface electrode material is evaporated onto the rear substrate surface. By way of example, an Ni film which is 50 nm thick is recommended as the rear surface electrode material. By the way, in a case where the electrode material is apprehended to adhere onto the side walls of the SiC substrate, the evaporation is performed in a state where the outer peripheral edge of the substrate is hidden using a shadow mask.

Next, the resist used for the front surface protection is completely removed with the dedicated stripper solution of the resist, and the substrate is sufficiently washed with ultra-deionized water and then dried. The dried substrate is immediately set in a rapid thermal annealing apparatus, and is subjected to rear contact annealing at 1000° C. in an atmosphere of 100% high-purity Ar for two minutes. Owing to the rapid thermal annealing, the Ni film is alloyed with the rear substrate surface of low resistance, and a rear surface electrode 208 of very low resistance exhibiting a contact resistivity in the order of, at the highest, $10^{-6}$ Ωcm$^2$ can be formed. As stated before, the temperature of the rear contact annealing is set at a temperature (at least 900° C. in the case of Ni) which is lower than that of the thermal oxidization having formed gate insulating film 203 and which is sufficient for the formation of the ohmic contact between the singlecrystalline silicon carbide and a contact metal (here, Ni).

A very important point in the above-described contact annealing is that the rapid thermal annealing has been implemented with the structure in which gate insulating film 203 (the part underneath gate electrode 204) already formed on this occasion is completely enclosed with gate electrode 204 of the polycrystalline silicon, epitaxial layer 202 of the singlecrystalline SiC substrate, the thermal oxide film of epitaxial layer 202 (the part of gate insulating film 203 outside the gate region, that is, the peripheral part of film 203 adjoining the real gate insulating film, and lower insulating film 212 of the field insulating film), and gate electrode side wall insulating film 205 formed of the thermal oxide film of the polycrystalline silicon.

Figure 25H:
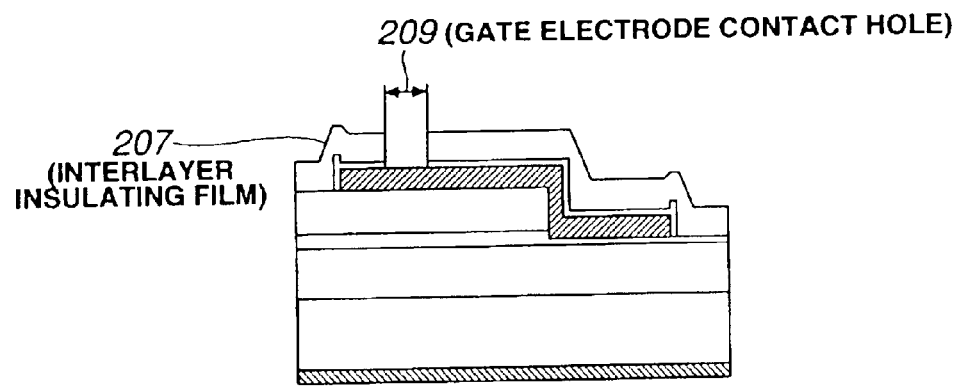

Next, referring to FIG. 25H, the front substrate surface is coated with a photoresist and is exposed and developed by an exposure apparatus, thereby to form a resist mask for providing a gate electrode contact hole 209 by etching, on interlayer insulating film 207. Further, the rear substrate surface is coated with the resist for protection, which is then sufficiently dried. Thereafter, a gate electrode contact hole 209 is provided in interlayer insulating film 207 by the etching with a buffered hydrofluoric acid solution. Incidentally, the resist on the rear surface fulfills the function that rear surface electrode 208 is prevented from dissolving in the buffered hydrofluoric acid solution and from disappearing or changing in quality, or that the electrode material having dissolved or exfoliated from the rear surface is prevented from adhering onto the front surface.

When the etching has ended, the resist used for the resist mask and the rear surface electrode protection is completely removed with the dedicated stripper solution of the resist, and the substrate is sufficiently washed and then dried.

Figure 25I:
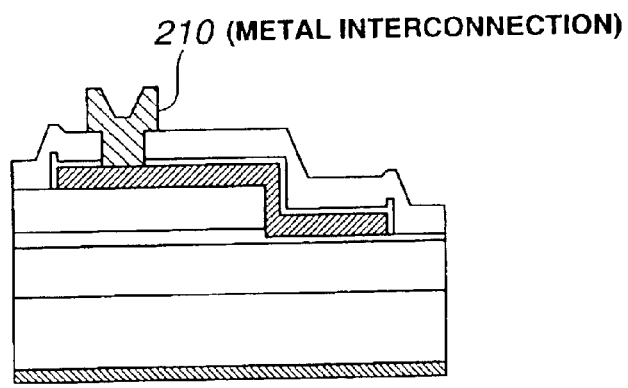

Next, referring to FIG. 25I, the dried substrate is immediately set in a magnetron sputtering apparatus whose interior is kept at a high degree of vacuum, and a desired metal interconnection material, for example, an Al film being 1 μm thick, is evaporated onto the whole upper surface of interlayer insulating film 207 of the substrate.

Thereafter, the front surface of the substrate overlaid with the Al film is coated with a photoresist and is exposed and developed, so as to form a resist mask for etching. Further, the rear substrate surface is coated again with the resist for rear surface electrode protection, and the resist is sufficiently dried. Next, the Al film is patterned with an etching solution of phosphoric acid type, thereby to form a metal interconnection 210.

Incidentally, the resist on the rear surface is coated in order to prevent rear surface electrode 208 from dissolving in the phosphoric acid type etching solution and from disappearing or changing in quality. This resist, however, can be dispensed with in a case where rear surface electrode 208 is not apprehended to dissolve or where metal interconnection 210 is etched by RIE (dry etching). At the last stage, the resist used for the resist mask and the rear surface electrode protection is completely removed by the dedicated stripper solution thereof, and the substrate is sufficiently washed and then dried. Thus, the MOS capacitor based on the present invention as shown in FIG. 22 is finished up.

Also this embodiment brings forth excellent advantages equivalent to those of the fourth embodiment as will be detailed below.

As described above, in this embodiment, as a metal electrode (namely, rear surface electrode 208) which is brought into contact with a singlecrystalline silicon carbide substrate, except a gate electrode, there is employed a metal electrode which is subjected to thermal annealing at a temperature (at least 900° C.) that is lower than the temperature of thermal oxidization having formed a gate insulating film 203 and that is sufficient for the contact annealing between singlecrystalline silicon carbide and a metal (Ni), after gate insulating film 203 has been entirely enclosed with gate electrode 204, the singlecrystalline silicon carbide substrate (an epitaxial layer 202), the thermal oxide film of the singlecrystalline silicon carbide substrate (the part of gate insulating film 203 outside a gate region, that is, the peripheral part of film 203 adjoining the real gate insulating film, and lower insulating film 212 of the field insulating film), and a gate-electrode side-wall insulating film 205. Owing to such a construction as described above, during the thermal annealing, gate insulating film 203 is surrounded completely in vertical and horizontal directions with thermally stable materials (,specifically, which neither react nor diffuse), namely, polycrystalline silicon, $SiO_2$ and SiC. It is, therefore, possible to very effectively prevent the drawback that any contaminant or metal substance which has come flying from the inner wall of a thermal annealing apparatus or the contact of the silicon carbide substrate enters into gate insulating film 203 (gate region) due to the high-temperature treatment, and the drawback that, in a case where rapid thermal annealing is carried out in a high degree of vacuum at or above 800° C., the $SiO_2$ gate insulating film 203 is inhomogeneously decomposed to change in quality.

Moreover, since the temperature in the case of forming gate insulating film 203 by thermal oxidization is set higher than the temperature of contact annealing, thermal impact and thermal stress attendant upon expansion/contraction to be developed in gate insulating film 203 by the rapid thermal annealing can be, in effect, relieved. As will be detailed with reference to FIGS. 26 and 27, therefore, the advantage is brought forth that the deterioration of the characteristics of the gate insulating film 203 (the problems (1), (2), and (3)) attributed to the rapid thermal annealing can be solved.

Besides, since the annealing is carried out at the temperature sufficient for the contact annealing between the singlecrystalline silicon carbide and the metal, the very favorable ohmic contact whose contact resistance exhibits the order of $10^{-6}$ $\Omega cm^2$ or below is attained as the contact between the singlecrystalline silicon carbide and the metal.

Figure 26:
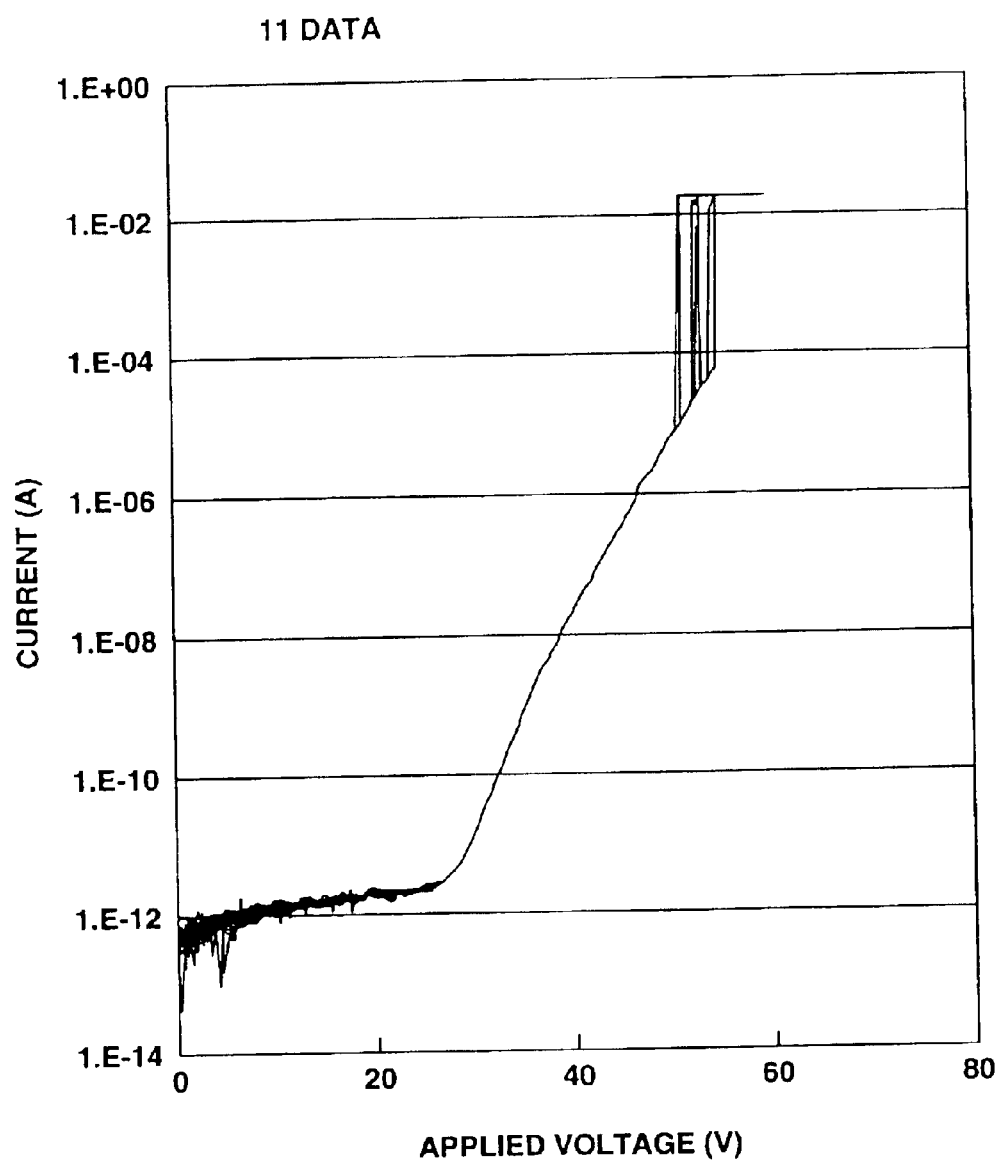
FIG. 26 is a current-voltage characteristic graph of the MOS capacitor in the fifth embodiment shown in FIG. 22.

FIG. 26 is a diagram of current-voltage characteristics measured as to arbitrary 11 samples among MOS capacitors thus fabricated. The area (opening) of the gate electrode was $3.14 \times 10^{-4}$ $cm^2$, and the thickness of the gate insulating film was 45 nm.

As understood from FIG. 26, the tested capacitors exhibit substantially the same current (I)-voltage (V) characteristic. The current-voltage characteristic is a characteristic intrinsic to a thin oxide film as is known as "Fowler-Nordheim conduction", and leaking conduction suggestive of deterioration is not observed. An excellent value of or above 45 V (10 MV/cm in terms of a field intensity) is given as a breakdown voltage in any of the samples.

As understood by comparing the characteristics in FIG. 26 and FIGS. 1A and 1B, the leakage current and breakdown voltage of the gate insulating film of the MOS capacitor based on the present invention are remarkably improved over those of the gate insulating film (with RTA) subjected to the prior-art rapid thermal annealing as shown in FIG. 1A.

Figure 27:
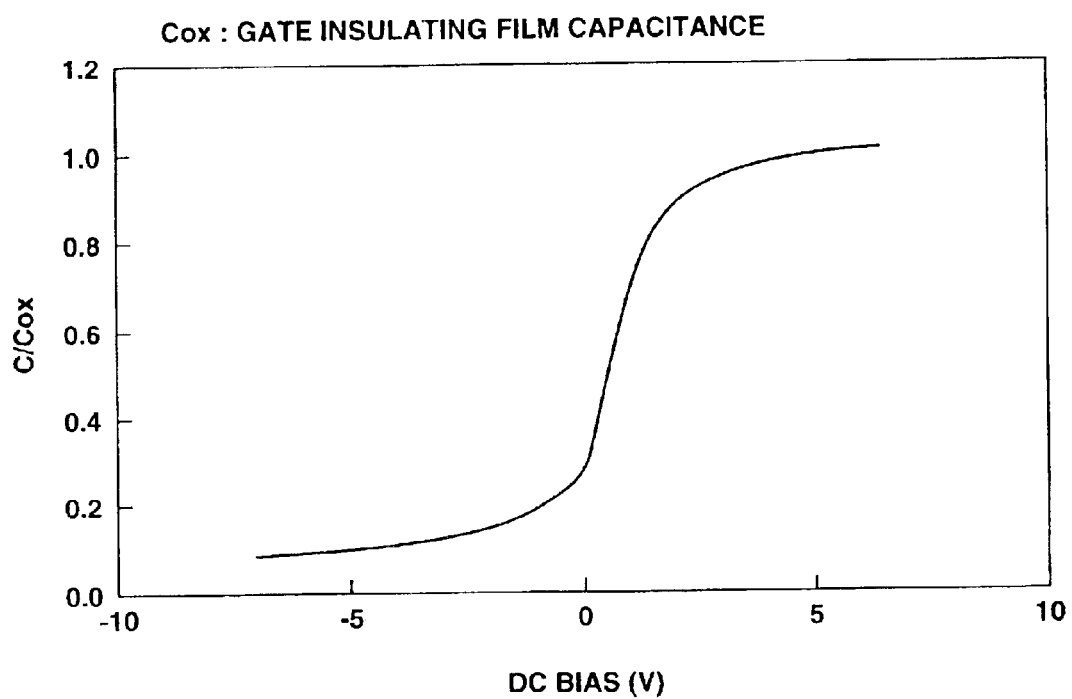
FIG. 27 is a high frequency capacitance to DC bias voltage characteristic graph of the MOS capacitor in the fifth embodiment shown in FIG. 22.

Besides, FIG. 27 is a high-frequency C-V characteristic diagram of the MOS capacitor according to the present invention. Regarding the conventional characteristic shown in FIG. 2, it is pointed out that, as the result of the rapid thermal annealing, a flat-band voltage shifts greatly in a positive direction and becomes at least 15 V. In contrast, it is seen that, in the MOS capacitor subjected to the similar rapid thermal annealing, a flat-band voltage has a value of 2 V odd, which is also decreased much. The lowering (improvement) of the flat-band voltage is a remarkable improvement which corresponds to the decrease of one order in terms of the effective charge density $Q_{eff}$ ($/cm^2$) of an oxide film interface.

As apparent from the above description, when the rapid thermal annealing such as contact annealing (for example, at 1000° C. in a vacuum for one minute) is carried out in the prior art, there have been the problems; (1) that the breakdown voltage of the gate insulating film as ought to be about 40 V drops abruptly to at most 5 V being ⅛ (characteristic graph in FIG. 1A), (2) that the leakage current of the gate insulating film increases conspicuously (the same graph of FIG. 1A), and (3) that the flat-band voltage shifts in the positive direction 15 V or more from the vicinity of an ordinary value of zero V (FIG. 2), whereas all the problems have been solved according to the present invention.

Besides, in this embodiment, the contact annealing at 1000° C. in the Ar atmosphere for 2 minutes is added. These thermal annealing conditions and the method of forming the contact afford the optimum manufacturing method for realizing low-resistance ohmic contact with $n^+$ SiC. In this embodiment, accordingly, the ohmic contact of very low resistance is attained at the rear surface of the SiC substrate. In other words, the present invention has solved the above problems (1), (2), and (3) without incurring increase in the contact resistance.

In addition, an important point to be noted is that this embodiment has provided a method for solving the problems (1), (2), and (3) involved, not only in the contact annealing, but also in all the other foregoing thermal steps which the gate insulating film often undergoes in an actual device, for example, the formation of the polycrystalline silicon film, drive-in for doping the polycrystalline silicon film with the phosphorus impurity, the deposition of the interlayer insulating film, and the densifying thermal annealing of the interlayer insulating film.

Furthermore, in view of I-V characteristic in FIG. 1A, it is understood that, with the prior art, even the gate insulating films which are not subjected to the rapid thermal annealing have breakdown voltages on the order of, at most, 40 V, and that defective units which break down at low voltages or which exhibit high leakage currents are included in a considerable number. In contrast, the breakdown voltages of the gate insulating films in this embodiment are all as high as 40 V or above, and the best gate insulating film obtained exceeds even 54 V. Besides, all leakage currents are small, and currents exhibit intrinsic conduction till a time immediately before breakdown. In this manner, the silicon carbide semiconductor device and the manufacturing method thereof according to the present invention have the excellent advantages that characteristics which are favorable as compared with those of the gate insulating film in the prior art are exhibited, and that the favorable characteristics can be maintained to the last even when device manufacturing steps which include annealing and dry etching after the formation of the gate insulating film have been undergone.

(Sixth Embodiment)

A sixth embodiment of the silicon carbide semiconductor device and its manufacturing method according to the present invention is an example to which the present invention is applicable in order to realize favorable gate insulating film characteristic and MOS interface characteristic in a planar power MOSFET of n-channel type as disclosed in Japanese Patent Application First Publication No. Heisei 10-308510.

Figure 28:
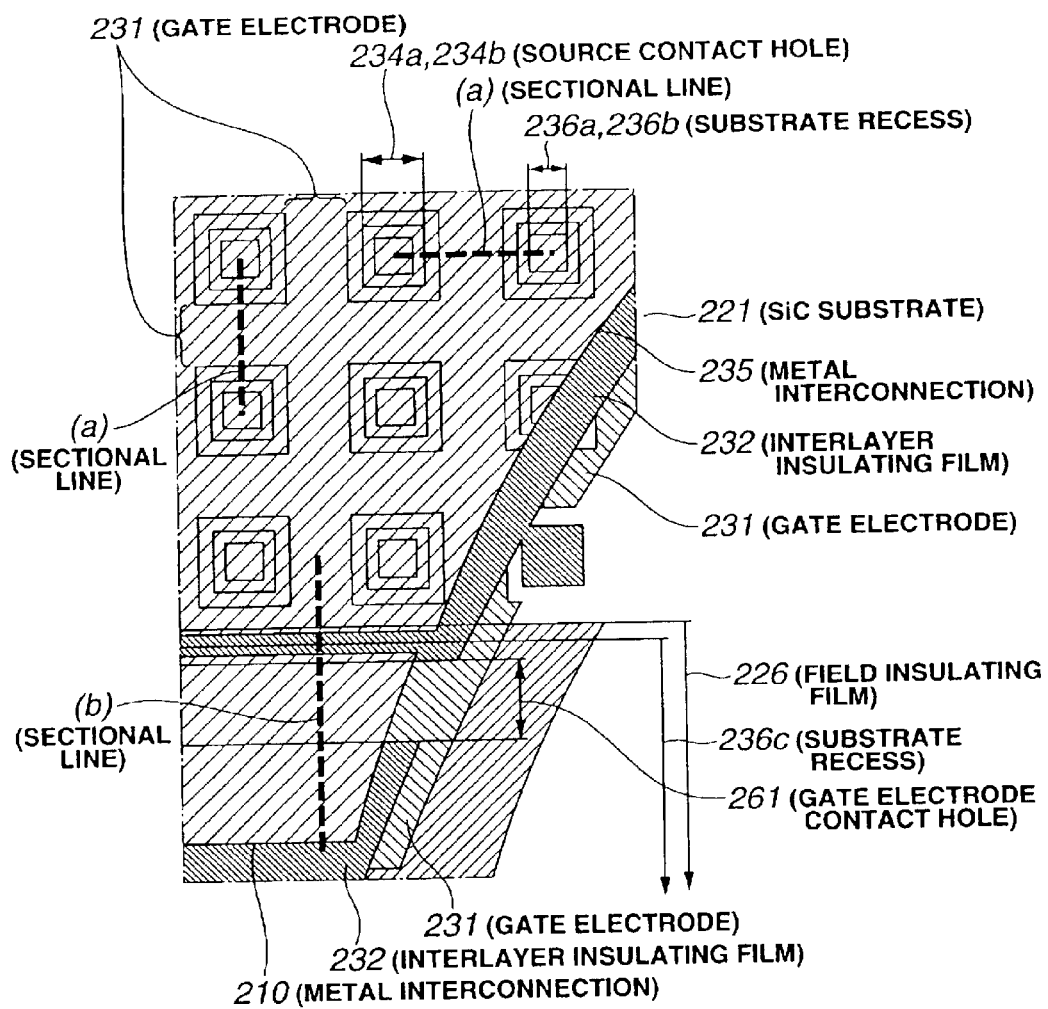
FIG. 28 is a plan view of an essential part of a power MOSFET of the silicon carbide semiconductor device in a sixth preferred embodiment according to the present invention.

FIG. 28 is a view schematically showing the plan construction of a power MOSFET of the silicon carbide semiconductor device according to the present invention.

Figure 29A:
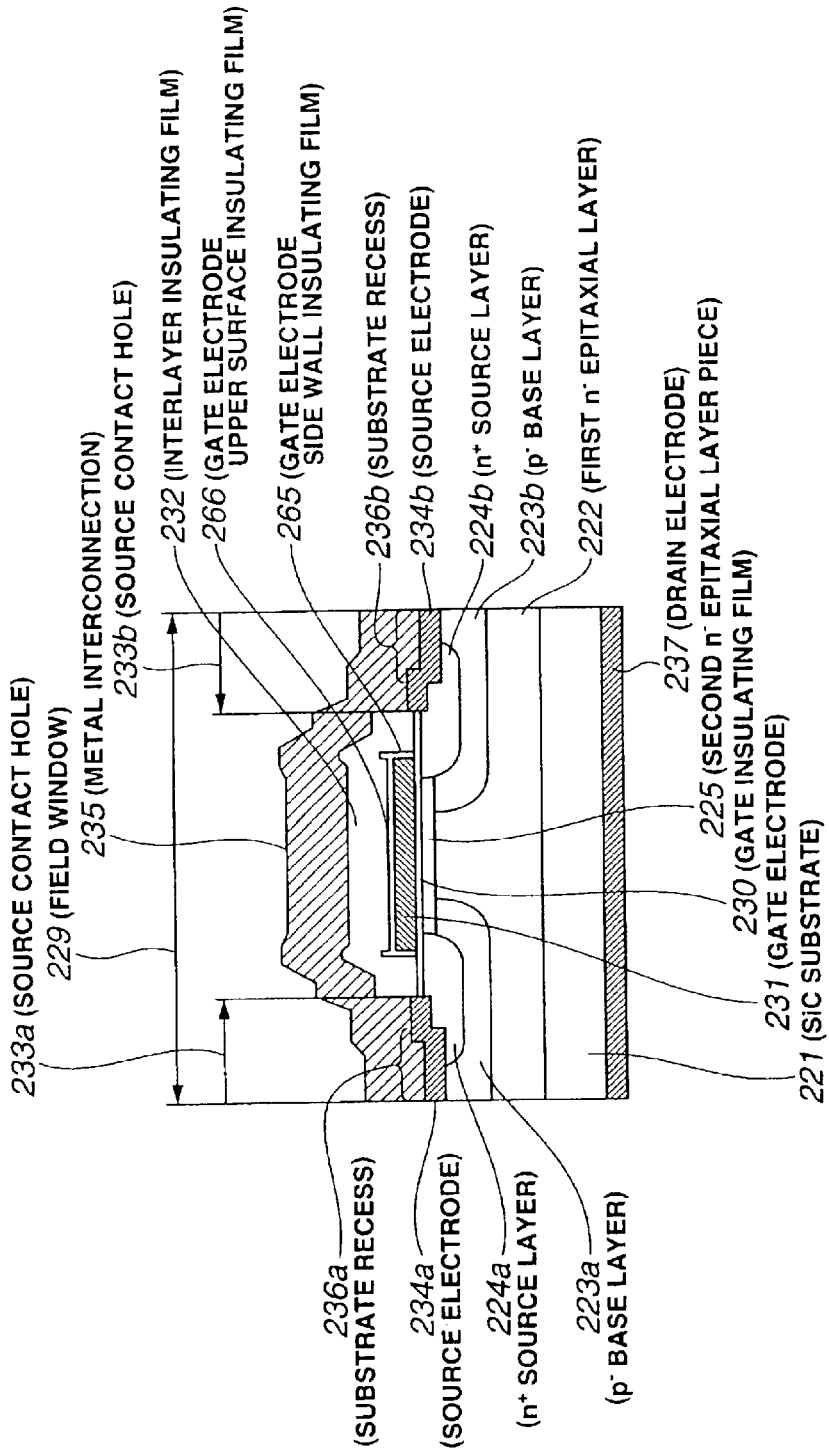
FIGS. 29A and 29B are cross sectional views of essential parts of the power MOS of the silicon carbide semiconductor device in a seventh preferred embodiment according to the present invention.

FIG. 29A is a sectional view of an essential portion in the case where the power MOSFET is sectioned along line (a) in FIG. 28, and it shows the structure of one cell in the power MOSFET. The power MOSFET is constructed by joining a large number of such cells laterally (connecting them in parallel circuit-wise).

Figure 29B:
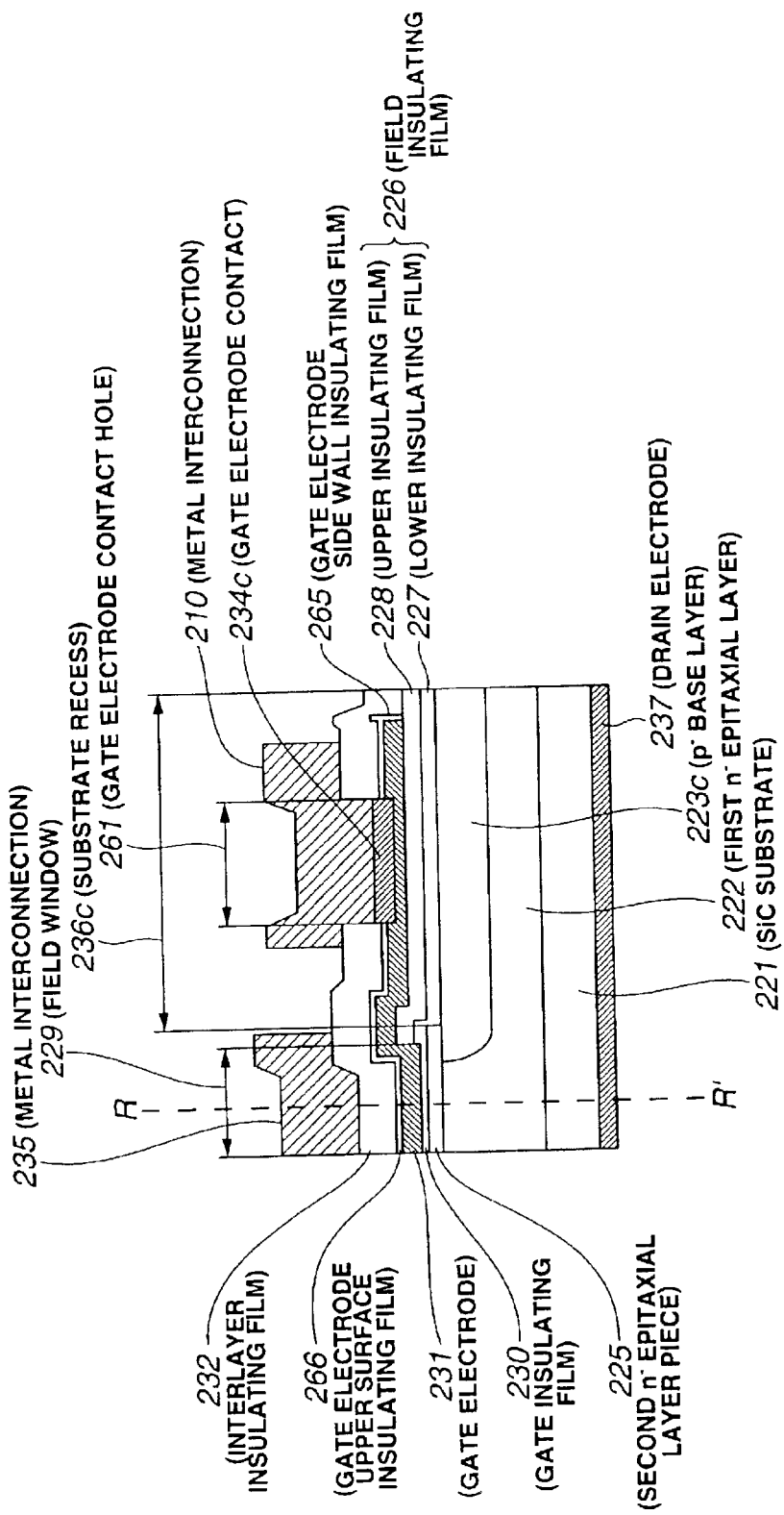

Besides, FIG. 29B shows the sectional structure of the lead-out (extension) part of a gate electrode which is adjacent to an end of the above-described power MOSFET cell, and it is a sectional view of essential portion in the case where the power MOSFET is sectioned along line (b) in FIG. 28.

Although each power MOSFET cell shown in FIG. 28 is a so-called square cell, the present invention is not restricted only to such a square cell, but is similarly applicable to a hexagonal cell or a comb-shaped cell which is well known.

Incidentally, unless section (b) is not especially specified, the ensuing description shall be explanation on section (a) or explanation common to sections (a) and (b).

Referring to FIG. 28 and FIGS. 29A and 29B, numeral 221 designates an n+ singlecrystalline SiC substrate, and a first n− epitaxial layer 222 having a thickness of 10 μm and doped with nitrogen at $4 \times 10^{15}/cm^3$ is homo-epitaxially grown on the front surface (upper principal surface in FIG. 29A) of SiC substrate 221. A substrate of any of all crystal systems such as 4H, 6H, 3C and 15R (letter H signifies a hexagonal system, letter C a cubic system, and letter R a rhombohedral system) can be employed as SiC substrate 221. It is noted that p− base layers 223a and 223b each of which has a predetermined depth and is slightly doped with a p-type impurity are spatially formed in predetermined regions in the front surface layer portion of n− epitaxial layer 222. Besides, a p− base layer 223c is formed in section (b). I is noted that p− base layer 223c is continuous with p− base layer 223a or 223b of the close MOSFET cell.

It is noted that n+ source layers 224a, 224b shallower than p− base layers 223a, 223b are formed in predetermined regions in the front surface layer portion of these p− base layers 223a, 223b, respectively. Further, a second n− epitaxial layer piece 225 is extended in the front surface layers of first n− epitaxial layer 222 and p− base layers 223a, 223b, 223c so as to lie in contact with both n+ source layers 224a and 224b. Second n− epitaxial layer piece 225 functions as a channel forming layer in the front surface of a device during the operation of the device. The impurity concentration of n− epitaxial layer piece 225 shall be a low concentration between $1 \times 10^{15}/cm^3$ and $1 \times 10^{17}/cm^3$, and shall not be higher than the impurity concentration of first n− epitaxial layer 222 or p− base layers 223a, 223b. Besides, substrate recesses 236a, 236b, 236c are respectively formed in the upper parts of p− base layers 223a, 223b, 223c and n+ source layers 224a, 224b. In the section (b), a field insulating film 226 whose thickness is several hundred nm or more is disposed on p− base layer 223c. Field insulating film 226 has such a structure that a thick upper insulating film 228 which is formed by any expedient (for example, reduced-pressure CVD) other than the thermal oxidization of SiC is stacked on a thin lower insulating film 227 which is formed by thermally oxidizing the front surface of SiC substrate 221.

In both sections (a) and (b), numeral 229 designates a field window which is provided in field insulating film 226, and numeral 230 a gate insulating film which is formed at the bottom of field window 229. Gate insulating film 230 needs to be a film which is annealed in such a way that it is directly exposed to an oxidative gas containing oxygen atoms, during or after the formation thereof. A gate electrode 231 of polycrystalline silicon endowed with a conductivity is disposed on the predetermined regions of gate insulating film 230 and field insulating film 226. The side walls and upper surface of gate electrode 231 are respectively formed with a gate-electrode side-wall insulating film 265 and a gate-electrode upper-surface insulating film 266 which are thin and which are formed by thermally oxidizing the polycrystalline silicon. An interlayer insulating film 232 is formed on gate electrode side wall insulating film 265 as well as gate electrode upper surface insulating film 266, the part of gate insulating film 230 not overlaid with gate electrode 231, and field insulating film 226.

Signs 233a, 233b denote source contact holes which are provided in interlayer insulating film 232, and which penetrate to n+ source layers 224a, 224b and p− base layers 223a, 223b. Source electrodes 234a, 234b exist at the bottoms of source contact holes 233a, 233b. Source electrodes 234a, 234b are formed in such a way that, after the thin layer of a contact metal such as Ni is disposed, the contact metal is alloyed with SiC by rapid thermal annealing. Numeral 235 designates a metal interconnection which serves to connect source electrodes 234a, 234b to another circuit element on the identical substrate or to an external circuit through source openings 233a, 233b.

In section (b), a gate electrode contact hole 261 is provided in that part of interlayer insulating film 232 which overlies polycrystalline silicon gate electrode 231 formed on field insulating film 226, and a gate electrode contact 234c which is made of Ni alloyed with polycrystalline silicon is located at the bottom of hole 261. Placed on interlayer insulating film 232 is a second metal interconnection 210 which serves to connect gate electrode 231 to another circuit element on the identical substrate or to an external circuit through gate electrode contact 234c as well as gate electrode contact hole 261.

Meanwhile, a portion 237 which is disposed on the whole area of the rear surface of n+ singlecrystalline SiC substrate 221 is a drain electrode. Drain electrode 237 is formed in such a way that, after the thin film of a contact metal such as Ni is evaporated onto the rear substrate surface, the contact metal is alloyed with SiC by rapid thermal annealing.

Next, a method of manufacturing the planar power MOSFET (the cell and the gate electrode lead-out (external connection) portion) to which the present invention is applicable will be described. FIGS. 30A1, 30A2, 30A3, 31A4, 31A5, 31A6, 32A7, 32A8, 33A9, and 33A10 are sectional views showing the steps of the manufacturing method of the element shown in FIG. 29A. FIGS. 34B1, 34B2, 35B4, 35B5, 35B6, 36B7, 36B8, 37B9, 37B10 are sectional views showing the steps of the manufacturing method of the element shown in FIG. 29B. The manufacturing steps of the respective elements will be collectively described below.

First, referring to FIG. 30A1 and FIG. 34B1, as described in Japanese Patent Application First Publication No. Heisei 10-308510, an n+ SiC substrate 221 is formed with a first n− epitaxial layer 222, p− base layers 223a and 223b, 223c, n+ source layers 224a and 224b, a second n− epitaxial layer piece 225, and substrate recesses 236a and 236b, 236c. Epitaxial layers of low quality on the rear surface of SiC substrate 221 as are respectively formed simultaneously with the growth of the first and second n− epitaxial layers shall be eliminated by the steps explained in the fourth or fifth embodiment. By the way, in the ensuing description, the "substrate" shall signify SiC substrate 221 formed with epitaxial layer 222 or any other film or an electrode unless otherwise specified.

Next, referring to FIG. 30A2 and FIG. 34B2, the substrate sufficiently washed by RCA cleaning or the like is thermally oxidized in a dry oxygen atmosphere to grow thermal oxide films on the front surface and rear surface of the substrate, and the thermal oxide films are immediately removed using a buffered hydrofluoric acid solution. On this occasion, the thickness of each of the thermal oxide films should desirably be less than 50 nm, preferably be 5–20 nm, for the reasons already stated. After the substrate subjected to the above-described sacrificial oxidation is sufficiently washed again by the RCA cleaning or the like, a field insulating film 226 which consists of a thin lower insulating film 227 and a thick upper insulating film 228 is formed on the front substrate surface. It is possible to use as lower insulating film 227 a thermal oxide film of about 10 nm which is formed by oxidizing the front substrate surface in a dry oxygen atmosphere, and as upper insulating film 228 an insulating film of desired thickness which is formed by a method other than thermal oxidization, for example, an $SiO_2$ film being 400 nm thick as is formed by atmospheric-pressure CVD employing oxygen and silane. The thickness of lower insulating film 227 should desirably be less than 50 nm, preferably be 5 to 20 nm. The thermal oxidization of lower insulating film 227 is not restricted to the dry oxidization, but it may well be wet oxidization or one employing any other oxidative gas. Upper insulating film 228 may be formed after lower insulating film 227 has been grown on the front substrate surface. Contrariwise, lower insulating film (thermal oxide film) 227 may well be formed between the substrate and upper insulating film 228 by forming upper insulating film 228 and then thermally oxidizing it. Incidentally, numeral 401 in FIG. 30A2 or FIG. 34B2 designates a first transitory thermal oxide film which is automatically formed on the rear substrate surface during the formation of lower insulating film 227. First transitory thermal oxide film 401 has the function of effectively eliminating any considerably deep polishing damage layer at the rear substrate surface as has appeared at the step of FIGS. 30A1 and 34B1, by accepting the damage layer and being removed at the subsequent step. Next, referring to FIG. 30A3 and FIG. 34B3, the front surface of the substrate is coated with a photoresist, exposed to light and developed, and the resultant substrate is immersed in a buffered hydrofluoric acid solution for wet etching, whereby a field window 229 is formed at the predetermined position of field insulating film 226. First transitory thermal oxide film 401 is etched together and disappears here. In forming minute field window 229, it is possible to use dry etching such as reactive ion etching which employs $CF_4$-gas plasma or the like. In this case, however, it is necessary to first perform the dry etching, and to switch it to the wet etching employing the buffered hydrofluoric acid solution, without fail when the field insulating film has remained several hundred nm. When the etching has ended, the photoresist is removed.

Next, referring to FIG. 31A4 and FIG. 35B4, the substrate contaminated with resist residue is sufficiently washed again by the RCA cleaning or the like. At the final stage of the washing, the substrate is immersed in a buffered hydrofluoric acid solution for 5 seconds to 10 seconds in order to remove a chemical oxide film ($SiO_2$) produced on the surface of field window 229 by the RCA cleaning, and the buffered hydrofluoric acid solution is completely washed away by ultra-deionized water, whereupon the substrate is dried.

The dried substrate is immediately subjected to thermal oxidization, whereby a gate insulating film 230 of desired thickness (here, 40 nm by way of example) is grown on the front substrate surface corresponding to field window 229. Regarding the conditions of the gate oxidization, dry oxidization at a temperature of 1100° C., for example, is recommended though not restrictive.

Here, an important point for realizing gate insulating film 230 which endures rapid thermal annealing such as contact annealing is that the temperature of the thermal oxidization is set higher than any annealing temperature at all the subsequent steps. In this embodiment, the oxidization temperature of 1100° C. has been selected because rapid thermal annealing at a temperature of 1000° C. is performed later in order to realize the ohmic contacts of source electrodes 234a, 234b on the front substrate side and a drain electrode 237 on the rear substrate surface. When it is desired to form a thick gate insulating film of or above 50 nm whose surface roughens conspicuously, the desired thickness is attained by overlaying a thermal oxide film of SiC with an insulating film formed by another expedient for film formation (for example, CVD-$SiO_2$ film).

In the gate oxidization, the SiC substrate underlying field insulating film 226 (parts of second $n^-$ epitaxial layer piece 225 and $p^-$ base layer 223c) is also oxidized to some extent, so that the thickness of lower insulating film 227 of field insulating film 226 increases. Besides, numeral 402 designates a second transitory thermal oxide film being comparatively thick, which is automatically formed on the rear substrate surface during the gate oxidization. Also thermal oxide film 402 has the function of effectively eliminating any polishing damage layer in the rear substrate surface, similarly to first transitory thermal oxide film 401.

Next, referring to FIG. 31A5 and FIG. 35B5, as soon as gate insulating film 230 has been formed, polycrystalline silicon films each being 300–400 nm thick are formed on the whole front and rear surfaces of the substrate by reduced-pressure CVD (growth temperature: 600 to 700° C.) employing a raw material of silane. Thereafter, the polycrystalline silicon films are doped with P (phosphorus) by well-known thermal diffusion (treatment temperature: 900 to 950° C.) employing phosphorus chlorate ($POCl_3$) and oxygen, so as to afford a conductivity type.

Next, the front substrate surface is coated with a photoresist, and the unnecessary part of the polycrystalline silicon film on the front substrate side is eliminated by employing photolithography, and reactive ion etching (RIE) whose etchants are $C_2F_6$ and oxygen. Thus, a gate electrode 231 is formed. Incidentally, numeral 403 designates a transitory polycrystalline-silicon film deposited on the rear substrate surface by the formation of the polycrystalline silicon film.

Further, after the photoresist used for the RIE has been completely removed, the substrate is subjected to the RCA cleaning. When the substrate has been satisfactorily cleaned, the substrate is thermally oxidized in a dry oxygen atmosphere at 900° C., whereby the front polycrystalline-silicon surface is formed with thermal oxide films of polycrystalline silicon. Numerals 265 and 266 designate the insulating films which are thus formed on the side wall and upper surface of the polycrystalline-silicon gate electrode 231. Besides, numeral 404 designates a transitory polycrystalline silicon thermal oxide film which is formed on the front surface of transitory polycrystalline silicon film 403 on this occasion.

Next, referring to FIG. 31A6 and FIG. 35B6, an interlayer insulating film 232 is deposited on the whole area of the front surface of the substrate. Suitable as the material of interlayer insulating film 232 is an SiO$_2$ film being about 1 μm thick, which is formed by normal-pressure CVD employing silane and oxygen as raw materials, phosphosilicate glass (PSG) which is further doped with phosphorus, borophosphosilicate glass (BPSG) which is further doped with boron, or the like. However, the material is not restrictive. Thereafter, the substrate is put in an ordinary diffusion furnace and is subjected to moderate annealing in an N$_2$ atmosphere for several tens minutes, so as to densify interlayer insulating film 232. An annealing temperature on this occasion is appropriately selected at a temperature lower than the temperature for the formation (thermal oxidization) of the gate insulating film, for example, within a range of 900 to 1000° C.

Next, referring to FIG. 32A7 and FIG. 36B7, the front surface of the substrate is coated with a photoresist, exposed to light and developed, and the resultant substrate is immersed in a buffered hydrofluoric acid solution (NH$_4$F+ HF mixed solution) for wet etching, whereby source contact holes 233a, 233b and a gate electrode contact hole 261 are formed at the predetermined positions of interlayer insulating film 232. In forming the minute holes, it is possible to use dry etching such as reactive ion etching (RIE) which employs CF$_4$-gas plasma or the like. However, when it is desired to form source contacts of particularly low resistances, the dry etching is first performed, and it is switched to the wet etching employing the buffered hydrofluoric acid solution, when interlayer insulating film 232 has remained several hundred nm without being penetrated. Incidentally, during the wet etching with the buffered hydrofluoric acid solution, also the polycrystalline-silicon thermal oxide film 404 on the rear substrate side is removed together.

When the etching has ended, the substrate is sufficiently washed and dried. The dried substrate bearing the photoresist as an etching mask is immediately set into an evaporation apparatus whose interior is kept at a high degree of vacuum, and a contact metal 405 is evaporated onto the whole front substrate surface. By way of example, Ni being 50 nm thick is recommended as the contact metal.

In this case, a time period for which the substrate is let stand between the etching of the openings and the evaporation of the contact metal is one of very important factors which determine the magnitudes of the contact resistances of source electrodes and a gate electrode contact to be stated later. More specifically, when the time period is long, natural oxide films are formed on the surfaces of SiC corresponding to the contact holes and on the surface of polycrystalline silicon, or hydrocarbon adheres to the above surface parts again. This forms a cause for hampering the homogeneous formation of alloy layers to be stated later, resulting in a drastic increase or discrepancy in the contact resistances. Accordingly, contact metal 405 needs to be deposited as early as possible after the etching of the contact holes.

When the evaporation has ended, the substrate is immersed in a dedicated photoresist stripper so as to completely remove the photoresist which remains on the front substrate surface. Thus, contact metal 405 deposited on the photoresist is simultaneously removed, thereby to finish a substrate structure in which contact metal 405 is left behind at only the bottoms of source contact holes 233a, 233b and gate electrode contact holes 261.

Next, referring to FIG. 32A8 and FIG. 36B8, the substrate is sufficiently washed and dried. Thereafter, the whole front surface is coated with a protective resist material (which may be a photoresist) having a thickness of at least 1 μm, and the substrate is subjected to dry etching employing CF$_4$ and O$_2$, thereby to completely eliminate rear-side polycrystalline silicon film 403. The surface protection step employing the resist is indispensable for preventing contact metal 405 and gate insulating film 230 from deteriorating due to plasma damages, charging and contamination which might occur during the dry etching.

Next, the substrate is immersed in a buffered hydrofluoric acid solution, thereby to remove second transitory thermal oxide film 402 and to denude a clean crystal surface on the rear surface of the substrate. Besides, the buffered hydrofluoric acid solution is completely washed away with ultradeionized water, and the substrate is dried. Then, the dried substrate is promptly set into an evaporation apparatus whose interior is kept at a high degree of vacuum, and a desired rear surface contact metal 406 is evaporated onto the rear substrate surface. An Ni film being 50 nm thick, for example, can be employed as the material of rear surface contact metal 406.

Next, referring to FIG. 33A9 and FIG. 37B9, the resist used for the surface protection is completely removed with the dedicated stripper solution of the resist, and the substrate is sufficiently washed and then dried. The dried substrate is immediately set into a rapid thermal annealing apparatus, and is subjected to rapid thermal annealing (contact annealing) at 1000° C. in an atmosphere of high-purity Ar for two minutes. Owing to the annealing, contact metal portions (Ni films) 405 and 406 in source contact holes 233a, 233b as well as gate electrode contact hole 261 and on the rear substrate surface are simultaneously alloyed with the SiC and n$^+$ polycrystalline silicon of the n$^+$ source layers and p$^-$ base layers, and the n$^+$ SiC of the rear substrate surface, thereby to form source electrodes 234a, 234b, gate electrode contact 234c and drain electrode 237 which exhibit very low resistances, respectively. It needs to be noted that, on this occasion, a heat-proof and thermal impact-proof structure is established in which gate insulating film 230 (the gate region part underneath gate electrode 231) undergoing the annealing at the same time is completely enclosed with gate electrode 231 of the polycrystalline silicon, second epitaxial layer piece 225, the thermal oxide film of second epitaxial layer piece 225 (the part of gate insulating film 230 outside the gate region, that is, the peripheral part of film 230 adjoining the real gate insulating film, and lower insulating film 227 of the field insulating film), and the gate electrode side wall insulating film 265 being the thermal oxide film of the polycrystalline silicon.

Next, referring to FIG. 33A10 and FIG. 37B10, the substrate subjected to the contact annealing is promptly set into a magnetron sputtering apparatus whose interior is kept at a high degree of vacuum, and a desired metal interconnection material, for example, Al is evaporated to a thickness of 1 μm onto the whole upper surface of the substrate.

Thereafter, the upper surface of the substrate formed with the Al film is coated with a photoresist and is exposed and developed, so as to form a resist mask for etching. Further, the rear substrate surface is coated with the photoresist for rear surface electrode protection, and the resist is sufficiently dried. Next, the Al film is patterned with an etching solution of phosphoric acid type, thereby to form a metal interconnection 235 connected to the source electrodes and a metal interconnection 210 connected to the gate electrode. The resist on the rear surface is formed in order to prevent drain electrode 237 from dissolving in the phosphoric acid type etching solution and from disappearing or changing in quality. This resist, however, can be dispensed with in a case where drain electrode 237 is not apprehended to dissolve or where the Al film is etched by RIE (dry).

At the last stage, the resist mask and the protective resist used for the drain electrode protection are completely removed by the dedicated stripper solution thereof, and the substrate is sufficiently washed and then dried. Thus, the planar power MOSFET according to the present invention as shown in FIGS. 28, 29A, and 29B is finished up.

When the I-V characteristic and high-frequency C-V characteristic of the gate insulating film of the planar power MOSFET fabricated in this way were estimated, characteristics equivalent to those in FIGS. 20 and 21 or FIGS. 26 and 27 were obtained, respectively. By the way, in the measurement, samples in each of which the spacing between p⁻ base 223a and p⁻ base 223b was especially enlarged to 200 µm were used so as to facilitate the measurement.

As described above, even in the case of applying the present invention to the planar power MOSFET, advantages equivalent to those of the MOS capacitors described in the fourth and fifth embodiments are attained. It can be understood that the result is one naturally expected when the structures in the vicinities of the gate electrode of the MOS capacitor and that of the planar power MOSFET cell and the processes for fabricating the structures are compared.

More specifically, n⁺ source layers 224a, 224b and p⁻ base layers 223a, 223b, 223c in FIG. 29A are regions doped with an n-type impurity and a p-type impurity, respectively, but their parent region is n-epitaxial layer (225 or 237) as described with reference to FIG. 30A1. That is to say, the sectional structure in the vicinity of the gate electrode of the planar power MOSFET according to the present invention as shown in FIG. 29A is the combination between the sectional structures in the fourth and fifth embodiments, and it does not substantially differ.

Besides, when the manufacturing process of the planar power MOSFET and that of the MOS capacitor in the fifth embodiment are compared, the steps which are implemented since the formation of the gate insulating film till the formation of the interlayer insulating film are quite the same. Regarding the subsequent steps, although the step of simultaneously forming source (gate electrode) contact metal 405 and the contact metal Ni of the gate electrode at the bottoms of source contact holes 233a, 233b and the bottom of gate electrode contact hole 261, respectively, is inserted in the MOSFET, this step is a process at room temperature, and hence, both the manufacturing processes of the MOSFET and the MOS capacitor may be said to be the same when compared from the viewpoint of annealing hysterisis at high temperatures as affect the characteristics of the gate insulating films.

Furthermore, the sixth embodiment of the present invention, not only has the advantages common to the fourth and fifth embodiments, but also can solve problems peculiar to prior-art SiC vertical MOSFETs including the planar MOSFET, as elucidated below.

As described with reference to the second embodiment, FIG. 3 shows the schematic sectional structure of the essential portions of the conventional power MOSFET cell employing SiC as disclosed in Japanese Patent Application First Publication No. Heisei 10-308510. As is well known, in a device which controls a large current, such as the power MOSFET, a contact resistance should desirably be lowered to the utmost in order to diminish a thermal loss. In, for example, a device in the class of a reverse blocking voltage of 1 kV, the contact resistance of a source/drain needs to be lowered to, at the highest, $10^{-5}$ Ωcm. The most suitable contact metal with the source/drain as meets this purpose is Ni at present, as Crofton et al. have discussed in a general report (Phys. Stat. Sol., 202, p. 581 (1997)). However, when the Ni hopeful as the contact metal is used as source electrode 10' serving also as the internal metal interconnection, there is the problem that, since the strength of the adhesion of the Ni with the underlying LTO film (silicon oxide film) 9' is low, the Ni on the LTO film peels off, so also the Ni on the SiC strips off. Another problem is that, when the Ni is subjected to contact annealing, the underlying LTO film (deposited silicon oxide film) is reduced and corroded.

In contrast, according to the sixth embodiment of the present invention, as seen from FIG. 32A7, such problems do not occur at all because of the preventive measure taken that structurally contact metal (Ni) 405 of the sources is not formed on the silicon oxide film, namely, interlayer insulating film 232, and that high-temperature or abrupt annealing such as the contact annealing is carried out before metal interconnection 235 is evaporated. That is, the MOSFET according to the sixth embodiment according to the present invention has the special advantage that the problems of the prior-art MOSFET can be solved.

Besides, Japanese Patent Application First Publication No. 2000-200907 published on Jul. 18, 2000 has pointed out a drawback such that, when the MOSFET of the structure in FIG. 3 (disclosed in Japanese Patent Application First Publication No. Heisei 10-308510) is illuminated with light, its flat-band voltage shifts greatly in a positive direction, and it has proposed the resolution that, in order to avoid the drawback, the doping concentration of the surface channel layer with nitrogen is set at or below $1 \times 10^{15}/cm^3$. With this method, however, the use of the nitrogen N as ion implantation species (an n-type dopant) is equivalently forbidden at an ion implantation step for controlling the threshold voltage of the MOSFET or forming a buried channel, and a serious restriction is imposed on the manufacturing technology of the MOSFET.

In contrast, in the power MOSFET according to the sixth embodiment according to the present invention, the phenomenon of the great shift of the flat-band voltage attributed to the light illumination is not observed even when the MOSFET is constructed by employing the epitaxial layer of or above $10^{15}/cm^3$. In other words, the structure and manufacturing method of the power MOSFET in the sixth embodiment according to the present invention has the advantage of being capable of solving the problem of the MOSFET of the construction in FIG. 3 that the flat-band voltage shifts greatly in the positive direction when the MOSFET is illuminated with light. Simultaneously, the structure and manufacturing method of the power MOSFET in the sixth embodiment according to the present invention has the excellent advantage of releasing the restriction of the use of the dopant nitrogen N as imposed for solving the problem by Japanese Patent Application First Publication No. 2000-200907, and permitting the use of the nitrogen N as the ion implantation species.

(Seventh Embodiment)

A seventh embodiment of the silicon carbide semiconductor device and its manufacturing method is an example to which the present invention is applicable in order to realize favorable gate insulating film characteristic and MOS interface characteristic in a planar power IGBT (Insulated Gate Bipolar Transistor) of n-channel type.

Figure 38A:
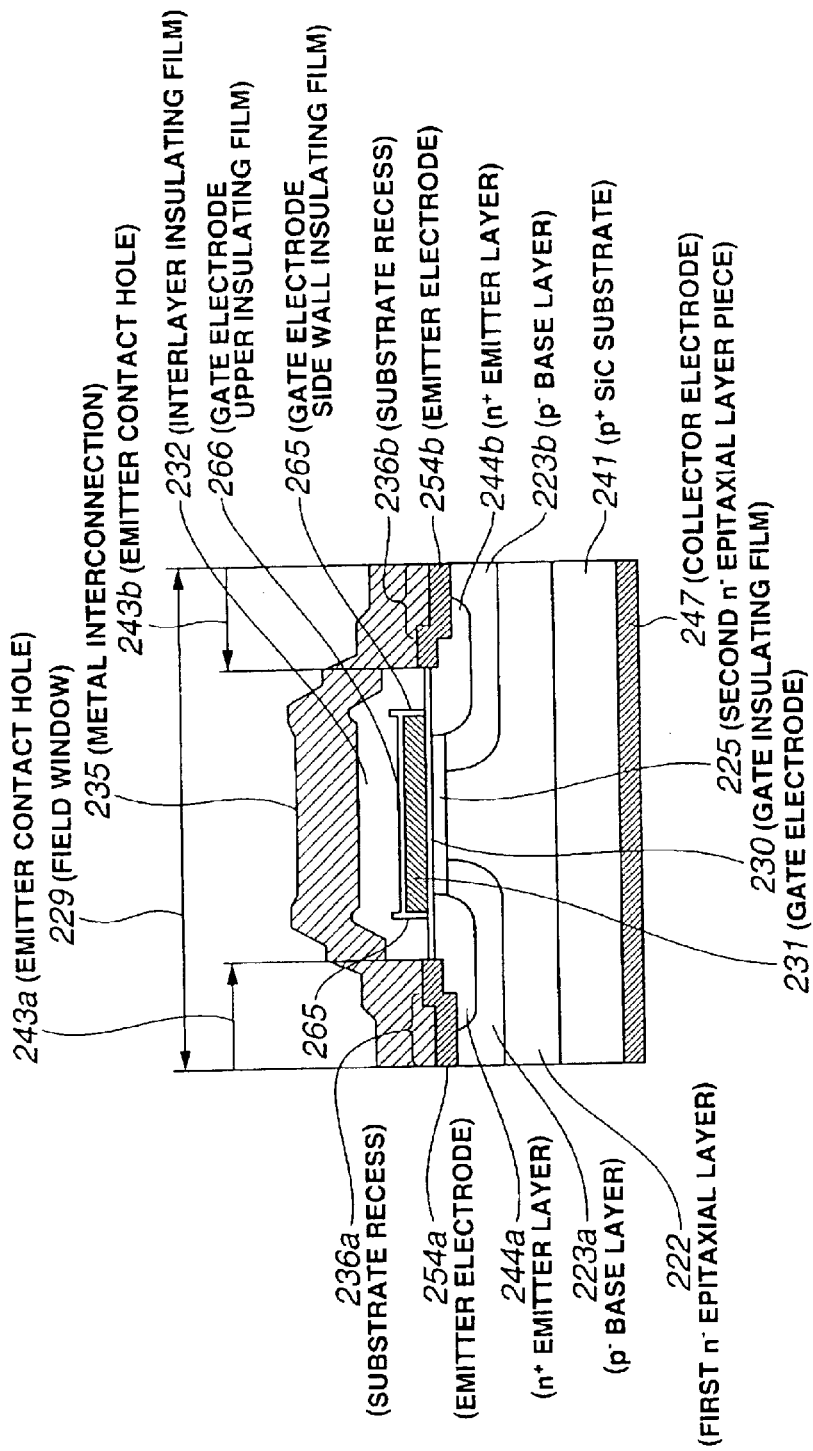
FIGS. 38A and 38B are cross sectional views of a planer power IGBT of the silicon carbide semiconductor device in a seventh preferred embodiment according to the present invention.
Figure 38B:
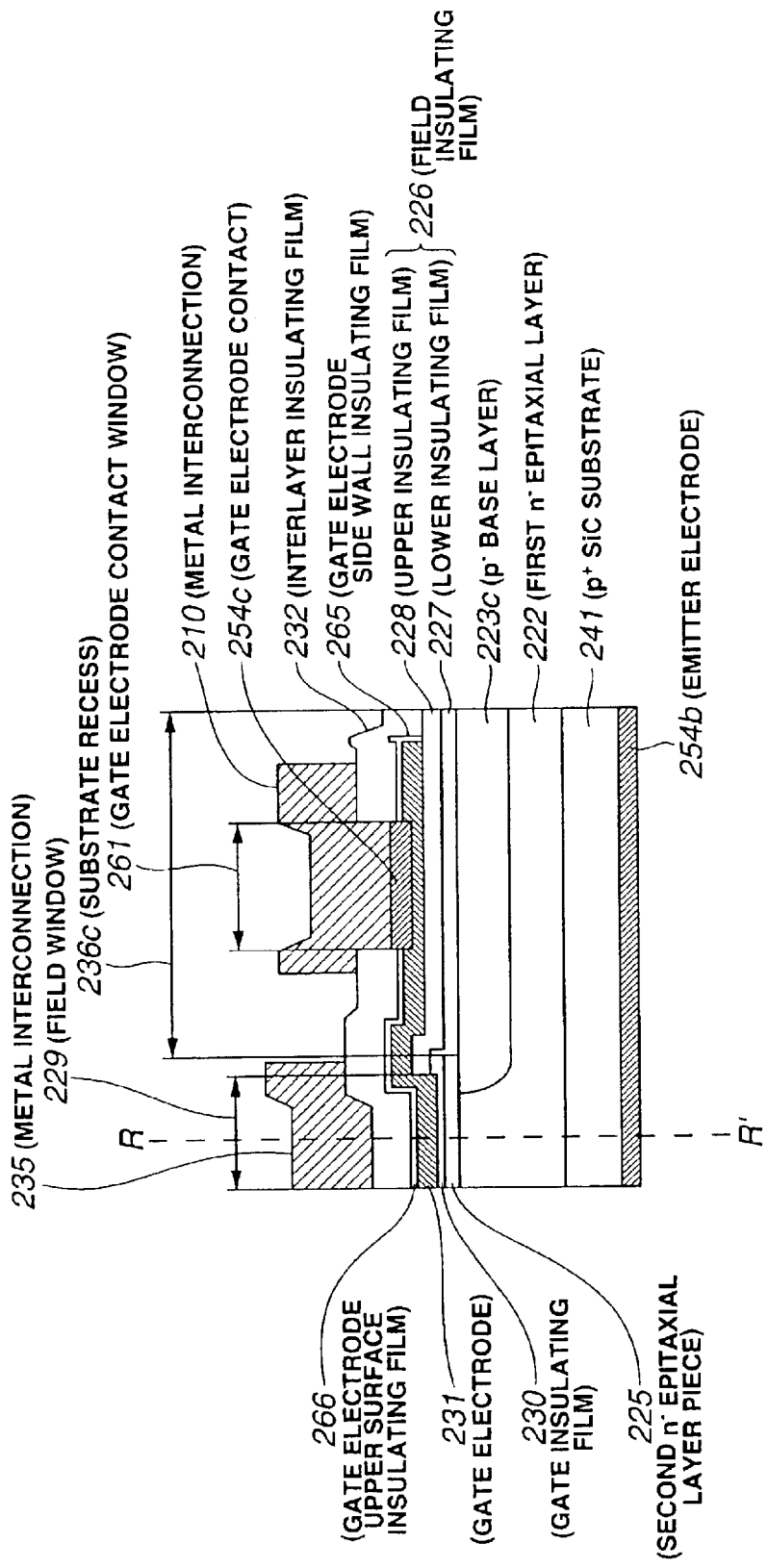

FIGS. 38A and 38B are sectional views of the essential portions of a planar power IGBT. The structure of the IGBT closely resembles that of the planar power MOSFET (FIGS. 29A and 29B) described before, but the close resemblance is not incidental. The reason therefor is that the IGBT is a composite device which consists of a MOSFET and a bipolar transistor, and which, from the viewpoint of history, has been invented aiming at abrupt decrease in the resistance component of first n⁻ epitaxial layer 222 in such a way that a conductivity modulation effect is induced by replacing drain side n⁺ substrate 221 of the n-channel MOSFET with a p⁺ substrate 241.

FIG. 38A shows a sectional view of essential portions of a power IGBT cell. The cell may be a square cell, a hexagonal cell or a comb-shaped cell which is well known. The power IGBT is constructed by joining a large number of such cells vertically and laterally (connecting them in parallel circuit-wise). On the other hand, FIG. 38B shows the section of the lead-out part of a gate electrode which is adjacent to an end of the above-described power IGBT composed of the cells. A section cut away along axis R-R' indicated in FIG. 38B has the structure of FIG. 38A.

Incidentally, unless section (b) of FIG. 38B is not especially specified, the ensuing description shall be explanation on section (a) of FIG. 38A or explanation common to sections (a) and (b).

Referring to FIGS. 38A and 38B, numeral 241 designates a singlecrystalline p⁺-type SiC substrate of low resistance, and a first n⁻ epitaxial layer 222 having a thickness of 10 μm and doped with nitrogen at $4 \times 10^{15}/cm^3$ is homoepitaxially grown on the front surface (upper principal surface in the figures) of p⁺ SiC substrate 241. It is noted that p⁺ SiC substrate 241 is doped with Al as a p-type impurity at a concentration of or above $1 \times 10^{19}/cm^3$, and it may be a substrate of any of all crystal systems such as 4H, 6H, 3C and 15R (letter H signifies a hexagonal system, letter C a cubic system, and letter R a rhombohedral system). It is noted that p⁻ base regions 223a and 223b each of which has a predetermined depth and is slightly doped with a p-type impurity are spatially formed in predetermined regions in the front surface layer portion of n⁻ epitaxial layer 222. Besides, a p⁻ base layer 223c is formed in section (b). It is noted that p⁻ base layer 223c is continuous with p⁻ base layer 223a or 223b of the close IGBT cell. Also, n⁺ emitter layers 244a, 244b shallower than p⁻ base layers 223a, 223b are formed in predetermined regions in the front surface layer portions of these p⁻ base layers 223a, 223b, respectively. Further, a second n⁻ epitaxial layer piece 225 is extended in the front surface layers of first n⁻ epitaxial layer 222 and p⁻ base layers 223a, 223b, 223c so as to lie in contact with both n⁺ emitter layers 244a and 244b. Second n⁻ epitaxial layer piece 225 functions as a channel forming layer in the front surface of a device during the operation of the device. The impurity concentration of n⁻ epitaxial layer piece 225 shall be a low concentration between $1 \times 10^{15}/cm^3$ and $1 \times 10^{17}/cm^3$, and shall not be higher than the impurity concentration of p⁻ base regions 223a, 223b, 223c. Recesses 236a, 236b, 236c are formed in the upper parts of p⁻ base layers 223a, 223b, 223c and n⁺ emitter layers 244a, 244b.

In section (b), a field insulating film 226 whose thickness is several hundred nm or more is disposed on p⁻ base layer 223c. Field insulating film 226 has such a structure that a thick upper insulating film 228 which is formed by any expedient (for example, reduced-pressure CVD) other than the thermal oxidation of SiC is stacked on a thin lower insulating film 227 which is formed by thermally oxidizing the front surface of SiC substrate 241.

In both sections (a) and (b), numeral 229 designates a field window which is provided in field insulating film 226, and numeral 230 a gate insulating film which is formed at the bottom of field window 229. Gate insulating film 230 needs to be a film which is annealed in such a way that it is directly exposed to an oxidative gas containing oxygen atoms, during or after the formation thereof. A gate electrode 231 of polycrystalline silicon endowed with a conductivity is disposed on gate insulating film 230 and field insulating film 226. The side walls and upper surface of gate electrode 231 are respectively formed with a gate-electrode side-wall insulating film 265 and a gate electrode upper surface insulating film 266 which are thin and which are formed by thermally oxidizing the polycrystalline silicon. An interlayer insulating film 232 is formed on gate electrode side wall insulating film 265 as well as gate electrode upper surface insulating film 266, the part of gate insulating film 230 not overlaid with gate electrode 231, and field insulating film 226.

Signs 243a, 243b denote emitter contact holes which are provided in interlayer insulating film 232, and which penetrate to n⁺ emitter layers 244a, 244b/p⁻ base layers 223a, 223b. Emitter electrodes 254a, 254b exist at the bottoms of emitter contact holes 243a, 243b. It is noted that emitter electrodes 254a, 254b are formed in such a way that, after a contact metal such as Ni is disposed, it is alloyed with SiC by rapid thermal annealing. Numeral 235 designates a metal interconnection which serves to connect emitter electrodes 254a, 254b to another circuit element on the identical substrate or to an external circuit through emitter openings 243a, 243b.

In section (b), a gate electrode contact hole 261 is provided in that part of interlayer insulating film 232 which overlies polycrystalline silicon gate electrode 231 formed on field insulating film 226, and a gate electrode contact 254c which is made of Ni alloyed with polycrystalline silicon is located at the bottom of hole 261. Placed on interlayer insulating film 232 is a second metal interconnection 210 which serves to connect gate electrode 231 to another circuit element on the identical substrate or to an external circuit through gate electrode contact 254c as well as gate electrode connection opening 261. Meanwhile, a portion 247 disposed on the whole rear surface of p⁺ singlecrystalline SiC substrate 241 is a collector electrode. Collector electrode 247 is formed in such a way that, after a contact metal layer such as of Ti/Al in which Ti and Al are respectively stacked to thicknesses of 80 nm and 380 nm in the order mentioned is evaporated onto the rear substrate surface, it is alloyed with the p⁺ SiC by rapid thermal annealing.

The structure of the IGBT is essentially different from that of the MOSFET in FIGS. 29A and 29B in only the two points that SiC substrate 241 is the p⁺ substrate, and that the material of collector electrode 247 on the rear substrate surface is the Ti/Al layer which is easy of attaining ohmic contact with the p-type substrate. Incidentally, emitter holes 243a, 243b, emitter layers 244a, 244b and emitter electrodes 254a, 254b are named merely for convenience' sake here because the IGBT is a bipolar device, and they are the same constituents as source contact holes 233a, 233b, source layers 224a, 224b and source electrodes 234a, 234b in FIGS. 29A and 29B, respectively.

Next, a method of manufacturing the planar power IGBT to which the present invention is applicable will be described.

FIGS. 39A1, 39A7, 39A8, 40A9, 40A10, 41B1, 41B7, 41B8, 42B9, and 42B10 are sectional views showing the steps of the manufacturing method of the IGBT shown in FIGS. 38A and 38B. FIG. 39A1 through FIG. 40A10 are sectional views showing the steps of the manufacturing method of the structure in FIG. 38A, while FIG. 41B1 through FIG. 42B10 are sectional views showing the steps of the manufacturing method of the structure in FIG. 38B. The common parts of manufacturing steps will be collectively described below.

First, referring to FIG. 39A1 and FIG. 41B1, a p$^+$ SiC substrate 241 is formed with a first n$^-$ epitaxial layer 222, p$^-$ base layers 223a and 223b, 223c, n$^+$ emitter layers 244a and 244b, a second n$^-$ epitaxial layer piece 225, and substrate recesses 236a and 236b, 236c. Here, it needs to be noted that the conductivity type of SiC substrate 241 is p$^+$. Besides, epitaxial layers of low quality on the rear surface of p$^+$ SiC substrate 241 as are respectively formed by the growth of the first and second n$^-$ epitaxial layers are eliminated by the steps explained in the fourth embodiment. By the way, in the ensuing description, the "substrate" shall signify p$^+$ SiC substrate 241 formed with epitaxial layer 222 or any other film or an electrode unless otherwise specified.

Next, the same manufacturing steps as described with reference to FIGS. 30A2 through- 32A7 or FIGS. 34B2 through 36B7 in the sixth embodiment are carried out, thereby to finish a substrate structure in which the contact metal (Ni) 405 is left behind at only the bottoms of emitter contact holes 243a, 243b and gate electrode contact hole 261. This state is shown in FIG. 39A7 and FIG. 41B7.

Next, referring to FIG. 39A8 and FIG. 41B8, the substrate is sufficiently washed and dried. Thereafter, the whole front surface of the substrate is coated with a protective resist material (which may be a photoresist) having a thickness of at least 1 $\mu$m, and the substrate is subjected to dry etching employing CF$_4$ and O$_2$, thereby to completely remove polycrystalline silicon film 403 on the rear substrate side. The surface protection step employing the resist is indispensable for preventing contact metal 405 and gate insulating film 230 from deteriorating due to plasma damages, charging and contamination which might occur during the dry etching.

Next, the substrate is immersed in a buffered hydrofluoric acid solution, thereby to remove second transitory thermal oxide film 402 having been formed between p+SiC substrate 241 and polycrystalline silicon film 403, and to denude a clean SiC crystal surface on the rear substrate surface. Thereafter, the buffered hydrofluoric acid solution is completely washed away with ultra-deiobized water, and the substrate is dried. Then, the dried substrate is promptly set into an evaporation apparatus whose interior is kept at a high degree of vacuum, and a desired rear contact metal 407 is evaporated onto the whole rear substrate surface. The material of a rear surface contact metal 407 is, for example, a Ti/Al film in which Ti and Al are respectively stacked to thicknesses of 80 nm and 380 nm in the order mentioned. In a case where the electrode material is apprehended to adhere onto the side surfaces of the substrate, the evaporation is performed in a state where the outer peripheral edge of the substrate is hidden using a shadow mask.

Next, referring to FIG. 40A9 and FIG. 42B9, the resist used for the surface protection is completely removed with the dedicated stripper solution of the resist, and the substrate is sufficiently washed and then dried. The dried substrate is immediately set into a rapid thermal annealing apparatus, and is subjected to rapid thermal annealing (contact annealing) at 1000° C. in an atmosphere of high-purity Ar for 2 minutes. Owing to the annealing, contact metal (Ni film) portions 405 at the bottoms of emitter contact holes 243a, 243b and gate electrode contact hole 261 are respectively alloyed with the SiC of the n$^+$ emitter layers and the n$^+$ polycrystalline silicon of the p$^-$ base layers, thereby to form emitter electrodes 254a, 254b and gate electrode contact 254c exhibiting very low resistances. Simultaneously, rear surface contact metal (Ti/Al film) 407 on the rear surface substrate side is alloyed with the rear surface of p$^+$ SiC substrate 241, thereby to form a collector electrode 247 exhibiting a very low resistance. It needs to be noted that, on this occasion, a heat-proof and thermal impact-proof structure is established in which gate insulating film 230 undergoing the annealing at the same time is completely enclosed with gate electrode 231 of the polycrystalline silicon, second epitaxial layer piece 225, the thermal oxide film of second epitaxial layer piece 225 (the part of gate insulating film 230 outside the gate region, that is, the peripheral part of film 230 adjoining the real gate insulating film, and lower insulating film 227 of the field insulating film), and gate electrode side wall insulating film 265 formed of the thermal oxide film of the polycrystalline silicon.

Next, referring to FIG. 40A10 and FIG. 42B10, the substrate subjected to the contact annealing is promptly set into a magnetron sputtering apparatus whose interior is kept at a high degree of vacuum, and a desired metal interconnection material, for example, Al is evaporated to a thickness of 1 $\mu$m onto the whole upper surface of the substrate.

Thereafter, the upper surface of the substrate covered with the Al film is coated with a photoresist and is exposed and developed, so as to form a resist mask for etching. Further, the rear substrate surface is coated with the photoresist for rear surface electrode protection, and the resist is sufficiently dried. Next, the Al film is patterned with an etching solution of phosphoric acid type, thereby to form metal interconnections 235 and 210. The resist on the rear surface is formed in order to prevent collector electrode 247 from dissolving in the phosphoric acid type etching solution and from disappearing or changing in quality. This resist, however, can be dispensed with in a case where collector electrode 247 is not apprehended to dissolve or where the Al film is etched by RIE (dry).

At the last stage, the resist mask and the protective resist used for the drain electrode protection are completely removed by the dedicated stripper solution thereof, and the substrate is sufficiently washed and then dried. Thus, the planar power IGBT according to the present invention as shown in FIGS. 38A and 38B is finished up.

Also in the seventh embodiment, the same advantages as in each of the fourth, fifth, and sixth embodiments are brought forth as is supposed from the same basic structures.

(Eighth Embodiment)

As described in the fourth to seventh embodiments, gate electrode side wall insulating films 205 and 265 play one of very important roles in the present invention. In any of these embodiments, the method in which the gate electrode of polycrystalline silicon is merely thermally oxidized is adopted for forming the gate electrode side wall insulating film. With this method, however, not only side wall of the gate electrode, but also the upper surface thereof is simultaneously oxidized. As a result, the thickness of the gate electrode decreases to incur the restriction that gate electrode side wall insulating film 205 or 265 cannot be thickened as desired. The restriction becomes an issue as a problem when the dry etching of the gate electrode resorts inevitably to an etching apparatus with which damages and contamination are liable to occur even in the interior of the gate insulating film.

The eighth embodiment is intended to provide a gate electrode side wall insulating film which is free from such a restriction as described above. Here, by way of example, this embodiment shall be described in connection with the step of forming gate electrode side wall insulating film 205 of the MOS capacitor of the fifth embodiment shown in FIG. 22. It is remarked beforehand, however, that the eighth embodiment is not restricted to gate electrode side wall insulating film 205 in the fifth embodiment, but that it is similarly applicable to the gate electrode side wall insulating films 205 and 265 of the elements in FIG. 17, FIGS. 29A and 29B, and FIGS. 38A and 38B.

Incidentally, since the structure of the MOS capacitor fabricated in the eighth embodiment is quite the same as shown in FIG. 22, the description of the structure itself will herein be omitted.

Then, a method of manufacturing the MOS capacitor to which the present invention is applicable will be described. FIGS. 43D, 43E1, 43E2, and FIG. 44E3 are sectional views showing the steps of the manufacturing method of the cell shown in FIG. 22. Incidentally, the respective steps of FIGS. 23A, 23B, 23C, and 24D in the fifth embodiment apply equally well to the eighth embodiment. The above manufacturing steps are carried out, thereby to finish a substrate structure in which gate insulating film 203 and a second transitory thermal oxide film 301 are respectively formed at the bottom of field opening 214 and on the rear surface of the substrate. This state is shown in FIG. 43D.

Next, referring to FIG. 43E1, immediately after the step of FIG. 43D, polycrystalline silicon films each being 300 to 400 nm thick are formed on the whole front and rear substrate surfaces by reduced-pressure CVD (growth temperature: 600° C. to 700° C.) employing a raw material of silane. Thereafter, the polycrystalline silicon films are doped with an impurity P till degeneracy by well-known thermal diffusion (treatment temperature: 900° C. to 950° C.) employing phosphorus chlorate ($POCl_3$) and oxygen, so as to afford a conductivity type.

Next, the substrate is thermally oxidized in a dry oxygen atmosphere at 900° C., whereby thin thermal oxide films of polycrystalline silicon are grown at the surfaces of the polycrystalline silicon films on the front and rear surfaces of the resultant substrate. Thereafter, silicon nitride ($Si_3N_4$) films each being 150 nm thick are formed on the whole front and rear surfaces of the resultant substrate by reduced-pressure CVD employing dichlorosilane and ammonia as raw materials. A temperature for forming the silicon nitride films is 750° C. to 800° C. In general, silicon nitride produced by the reduced-pressure CVD has a very high tensile stress, so that when formed directly on the polycrystalline silicon film, it might adversely affect the polycrystalline silicon film and the underlying gate insulating film. Therefore, the polycrystalline silicon thermal oxide film is interposed between the polycrystalline silicon film and the silicon nitride film as a stress relaxation layer as stated above. Thereafter, the upper surface of the substrate is coated with a photoresist and is exposed and developed. Using a mask thus formed, reactive ion etching (RIE) employing $C_2F_6$ and oxygen is carried out, whereby the unnecessary parts of the silicon nitride film, polycrystalline-silicon thermal oxide film and polycrystalline silicon film on the upper substrate side are removed to form a gate electrode 204 of the polycrystalline silicon. Further, the resist mask used for the RIE is completely removed from the substrate.

Incidentally, a portion 206 on the upper substrate side is a gate electrode upper surface insulating film (the thermal oxide film of the polycrystalline silicon), while a portion 406A is the transitory silicon nitride film formed by the reduced-pressure CVD. Besides, on the rear surface of the substrate, numeral 302 designates the transitory polycrystalline silicon film, numeral 408 the transitory polycrystalline silicon thermal oxide film formed by the thermal oxidization simultaneously with gate electrode upper surface insulating film 206, and numeral 407A the transitory silicon nitride film formed simultaneously with the polycrystalline silicon nitride film 406A.

Next, referring to FIG. 43E2, the substrate is sufficiently washed and then dried. Thereafter, the substrate is thermally oxidized in a dry oxygen atmosphere at 900° C., whereby a gate electrode side wall insulating film 205 of desired thickness (for example, 200 nm) is grown on the side walls of polycrystalline silicon gate electrode 204. It is noted that gate electrode side wall insulating film 205 in which the polycrystalline silicon has combined with oxygen into an oxide ($SiO_2$), expands into a structure in which film 205 somewhat protrudes beyond the upper surface of original gate electrode 204 as shown in this figure.

As described in the fourth embodiment, one of the important purposes of the formation of gate electrode side wall insulating film 205 is that the polycrystalline silicon which lies directly over the belt-shaped region of the gate insulating film having been deteriorated by the ion bombardment or metallic contamination at the formation of the gate electrode by the dry etching is completely turned into the nonconductive oxide ($SiO_2$), namely, gate electrode side wall insulating film 205, thereby to establish the gate electrode outer edge structure in which any net gate voltage is not applied to the deteriorated region. To the accomplishment of the purpose, the gate electrode overlying the deteriorated belt-shaped region of the gate insulating film needs to be entirely changed into the sidewall insulating film. Nevertheless, with the method in which the polycrystalline silicon gate electrode is simply subjected to the thermal oxidization as described on the manufacturing steps of each of the fourth, fifth, sixth, and seventh embodiments, the thermal oxidization of the gate electrode proceeds at the upper surface and the side walls at the same time, and hence, the thickness of the side wall insulating film is limited to at most 100 nm. Accordingly, in a case where the deteriorated belt shaped region of the gate insulating film is still thicker (due to the property of a dry etching apparatus), gate electrode side wall insulating film 205 cannot be satisfactorily formed in some cases.

In this regard, according to the eighth embodiment, the upper surface of gate electrode 204 of the polycrystalline silicon is covered with transitory silicon nitride film 406A of high oxidization resistance, so that the thermal oxidization takes place only at the side walls of gate electrode 204 denuded to the vapor phase, and the upper surface of gate electrode 204 is not thermally oxidized. That is to say, the eighth embodiment features that the thickness of gate electrode side wall insulating film 205 can be set at will without considering the thermal oxidization of the upper surface of gate electrode 204. Accordingly, it is also possible to grow up gate electrode side wall insulating film 205 the thickness of which exceeds that of gate electrode 204.

Incidentally, also transitory polycrystalline silicon film 302 on the rear substrate side is released from the thermal oxidization similarly to the upper surface of gate electrode 204 as understood from the fact that it is covered with transitory silicon nitride film 407A.

Next, referring to FIG. 44E3, the substrate is immersed in a buffered hydrofluoric acid solution for several seconds, thereby eliminating the thermal oxide films (which are not shown in FIG. 43E2 because they are very thin) of transitory silicon nitride films 406A and 407A as have been slightly formed on the surfaces of these silicon nitride films by the side-wall thermal oxidization of the gate electrode at the preceding step. After the substrate is sufficiently washed with ultra-deionized water, it is immersed in hot undiluted phosphoric acid this time, thereby to remove transitory silicon nitride films 406A and 407A. Thereafter, the substrate is sufficiently washed with ultra-deionized water and then dried.

Thenceforth, steps are carried out in quite the same way as described with reference to FIGS. 24F, 25G, 25H, and 25I. Thus, the MOS capacitor is finished up.

Also, in the eighth embodiment, the same advantages as in the fourth, fifth, sixth, and seventh embodiments are brought forth as is supposed from the same basic structures. Needless to say, the steps of FIG. 43E1 through FIG. 44E3 for forming the gate electrode side wall insulating film as described in the eighth embodiment are also applicable as methods of forming the gate electrode side wall insulating film of the MOS capacitor structure shown in FIG. 17, the gate electrode side wall insulating film of the power MOSFET cell structure shown in FIG. 29A, and the gate electrode side wall insulating film of the power IGBT cell structure shown in FIG. 38A.

The entire contents of Japanese Patent Applications No. 2001-377397 (filed in Japan Dec. 11, 2001) and No. 2002-122215 (filed in Japan on Apr. 24, 2002) are herein incorporated by reference. The scope of the invention is defined with reference to the following claims.

What is claimed is:

1. A silicon carbide semiconductor device, comprising:
   a gate insulating film:
   an electrode member that is inactive to the gate insulating film;
   an insulating film that is inactive to the gate insulating film; and
   a singlecrystalline silicon carbide substrate, the gate insulating film being treated with a predetermined heat process after being enclosed with the electrode member, the insulating film, and the singlecrystalline silicon carbide substrate.

2. A silicon carbide semiconductor device, comprising:
   a gate insulating film:
   an electrode member that is inactive to the gate insulating film;
   a field insulating film that is inactive to the gate insulating film; and
   a singlecrystalline silicon carbide substrate, the gate insulating film being treated with a predetermined heat process after being enclosed with the electrode member, the field insulating film, and the singlecrystalline silicon carbide substrate.

3. A silicon carbide semiconductor device, comprising: comprising:
   a singlecrystalline silicon carbide substrate;
   a field insulating film formed on a surface of the substrate;
   a gate window opened to the field insulating film;
   a gate insulating film formed by a method including a thermal oxidization over the whole surface of the singlecrystalline silicon carbide substrate at the gate window, the gate insulating film being thinner than the field insulating film;
   a gate electrode formed on the gate insulating film so as to cover the whole gate window; and
   a metal electrode that is another than the gate electrode, is contacted with the singlecrystalline silicon carbide substrate, and is treated with a predetermined heat process at a temperature which is lower than a thermal oxidization temperature by which the gate insulating film is formed and is sufficient to carry out a contact annealing between the singlecrystalline silicon carbide substrate and a metal after a whole surrounding of the gate insulating film is enclosed with the singlecrystalline silicon carbide substrate, the field insulating film, and the gate electrode.

4. A silicon carbide semiconductor device as claimed in claim 3, wherein the silicon carbide semiconductor device is a MOS capacitor of a gate electrode-gate insulating film-singlecrystalline silicon carbide structure comprising: an epitaxial layer of the singlecrystalline silicon carbide formed on a main surface of the singlecrystalline silicon carbide substrate; the gate insulating film formed on the epitaxial layer; the field insulating film formed on a surrounding of the gate insulating film; the gate electrode formed on the gate insulating film; an interlayer insulating film formed on the gate electrode and the field insulating film; a metal interconnection connected to the gate electrode via a hole opened to the interlayer insulating film; and a rear surface electrode disposed on a rear surface of the singlecrystalline silicon carbide substrate.

5. A silicon carbide semiconductor device as claimed in claim 3, wherein the silicon carbide semiconductor device is a MOSFET of a gate electrode-gate insulating film-singlecrystalline silicon carbide structure comprising: a first epitaxial layer of the singlecrystalline silicon carbide formed on a main surface of the singlecrystalline silicon carbide substrate; two mutually spaced apart base regions disposed on a predetermined region of a surface layer portion of the first epitaxial layer; two source regions disposed on a predetermined surface layer portion of the two base regions; at least one source electrode connected to each of the two source regions; a second epitaxial layer disposed over the two base regions and the first epitaxial layer between the two source regions; the gate insulating film disposed on a predetermined region of the two source regions and the second epitaxial layer; the field insulating film formed on the surrounding of the gate insulating film; an interlayer insulating film formed over the gate electrode and the field insulating film; a metal interconnection connected to the source electrode covering over the interlayer insulating film; and a drain electrode disposed on a rear surface of the singlecrystalline silicon carbide substrate and wherein the metal electrode that is other than the gate electrode corresponds to one of the source electrode and the drain electrode.

6. A silicon carbide semiconductor device as claimed in claim 3, wherein the silicon carbide semiconductor device is an IGBT of a gate electrode-gate insulating film-singlecrystalline silicon carbide structure comprising: a first epitaxial layer of the singlecrystalline silicon carbide formed on a main surface of the singlecrystalline silicon carbide substrate; two mutually spaced apart base regions formed on a predetermined region of a surface layer portion of the first epitaxial layer; two emitter regions disposed over a predetermined surface layer portion of the two base regions; two emitter regions each emitter region being formed on a predetermined region of a surface layer portion of a corresponding one of the two base regions; at least one emitter electrode connected to each of the emitter regions; a second epitaxial layer disposed on the two base regions and the first epitaxial layer between the two emitter regions; the gate insulating film disposed on a predetermined region of the two emitter regions and the second epitaxial layer; the field insulating film formed on the surrounding of the gate insulating film; the gate electrode disposed on the gate insulating film; an interlayer insulating film formed over the gate electrode and the field insulating film; a metal interconnection connected to the source electrode covering over the interlayer insulating film; and a collector electrode disposed on a rear surface of the singlecrystalline silicon carbide substrate opposite to the metal interconnection and wherein the metal electrode which is the other than the gate electrode corresponds to one of the emitter electrode and the collector electrode.

7. A silicon carbide semiconductor device as claimed in claim 1, wherein the gate electrode is made of at least one of a polycrystalline silicon and a silicide silicided by the polycrystalline silicon.

8. A silicon carbide semiconductor device as claimed in claim 3, wherein the field insulating film comprises a laminated layer of a lower insulating film formed in a thermal oxidization film of the singlecrystalline silicon carbide substrate and an upper insulating film thicker than the lower insulating film formed by another method than the thermal oxidization.

9. A silicon carbide semiconductor device as claimed in claim 4, wherein the metal interconnection is formed after the predetermined heat process.

10. A silicon carbide semiconductor device as claimed in claim 1, wherein the predetermined heat process is a rapid thermal annealing process to rapidly heat the gate insulating film to 900° C. or higher within approximately two minutes.

11. A silicon carbide semiconductor device as claimed in claim 10, wherein the rapid thermal annealing process is a contact annealing to connect the metal electrode to the singlecrystalline silicon carbide.

* * * * *